US011417764B2

(12) United States Patent
Chen et al.

(10) Patent No.: US 11,417,764 B2
(45) Date of Patent: Aug. 16, 2022

(54) INTERFACE PROFILE CONTROL IN EPITAXIAL STRUCTURES FOR SEMICONDUCTOR DEVICES

(71) Applicant: Taiwan Semiconductor Manufacturing Co., Ltd., Hsinchu (TW)

(72) Inventors: Winnie Victoria Wei-Ning Chen, Zhubei (TW); Pang-Yen Tsai, Jhu-bei (TW); Yasutoshi Okuno, Hsinchu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 39 days.

(21) Appl. No.: 16/941,035

(22) Filed: Jul. 28, 2020

(65) Prior Publication Data

US 2021/0234044 A1 Jul. 29, 2021

Related U.S. Application Data

(60) Provisional application No. 62/967,226, filed on Jan. 29, 2020.

(51) Int. Cl.
*H01L 29/78* (2006.01)
*H01L 21/02* (2006.01)
(Continued)

(52) U.S. Cl.
CPC .... *H01L 29/7842* (2013.01); *H01L 21/02304* (2013.01); *H01L 21/02507* (2013.01);
(Continued)

(58) Field of Classification Search
CPC ........... H01L 27/0886; H01L 21/02507; H01L 29/78696; H01L 2029/7858; H01L 29/42392; H01L 29/0673; H01L 29/0653
See application file for complete search history.

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

KR 10-2017-0102701 A 9/2017

*Primary Examiner* — Changhyun Yi
(74) *Attorney, Agent, or Firm* — Sterne, Kessler, Goldstein & Fox P.L.L.C.

(57) ABSTRACT

A method for reducing stress induced defects in heterogeneous epitaxial interfaces of a semiconductor device is disclosed. The method includes forming a fin structure with a fin base, a superlattice structure on the fin base, forming a polysilicon gate structure on the fin structure, forming a source/drain (S/D) opening within a portion of the fin structure uncovered by the polysilicon gate structure, modifying the first surfaces of the first layers to curve a profile of the first surfaces, depositing first, second, and third passivation layers on the first, second, and third surfaces, respectively, forming an epitaxial S/D region within the S/D opening, and replacing the polysilicon gate structure with a metal gate structure. The superlattice structure includes first and second layers with first and second lattice constants, respectively, and the first and second lattice constants are different from each other.

20 Claims, 45 Drawing Sheets

(51) Int. Cl.
*H01L 29/06* (2006.01)
*H01L 29/66* (2006.01)
*H01L 29/417* (2006.01)

(52) U.S. Cl.
CPC .... *H01L 29/0665* (2013.01); *H01L 29/41791* (2013.01); *H01L 29/66795* (2013.01); *H01L 29/785* (2013.01)

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 10,297,664 | B2 | 5/2019 | Xie |
| 2017/0256609 | A1 | 9/2017 | Bhuwalka et al. |
| 2020/0395482 | A1* | 12/2020 | Song .................. H01L 29/0673 |

* cited by examiner 100
102A
102B
112
112
127
132
135
128
108
108C
108A
110
108E
108CE
114
116
118
108CP
108C
108P
106

Z
Y
X

100*
102A*
102B*
102C*
312
312
312
123
124
123P
124P
108P
114
108D
108C
108A
106
108*
X
Y
Z

100*
102A*
102B*
102C*
312
312
312
114
108F
108C
108A
106
108*

INTERFACE PROFILE CONTROL IN EPITAXIAL STRUCTURES FOR SEMICONDUCTOR DEVICES

CROSS-REFERENCE TO RELATED APPLICATIONS

This application claims the benefit of U.S. Provisional Patent Application No. 62/967,226, titled "Etch Profile Control of Epitaxial Structures of Semiconductor Devices," filed Jan. 29, 2020, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
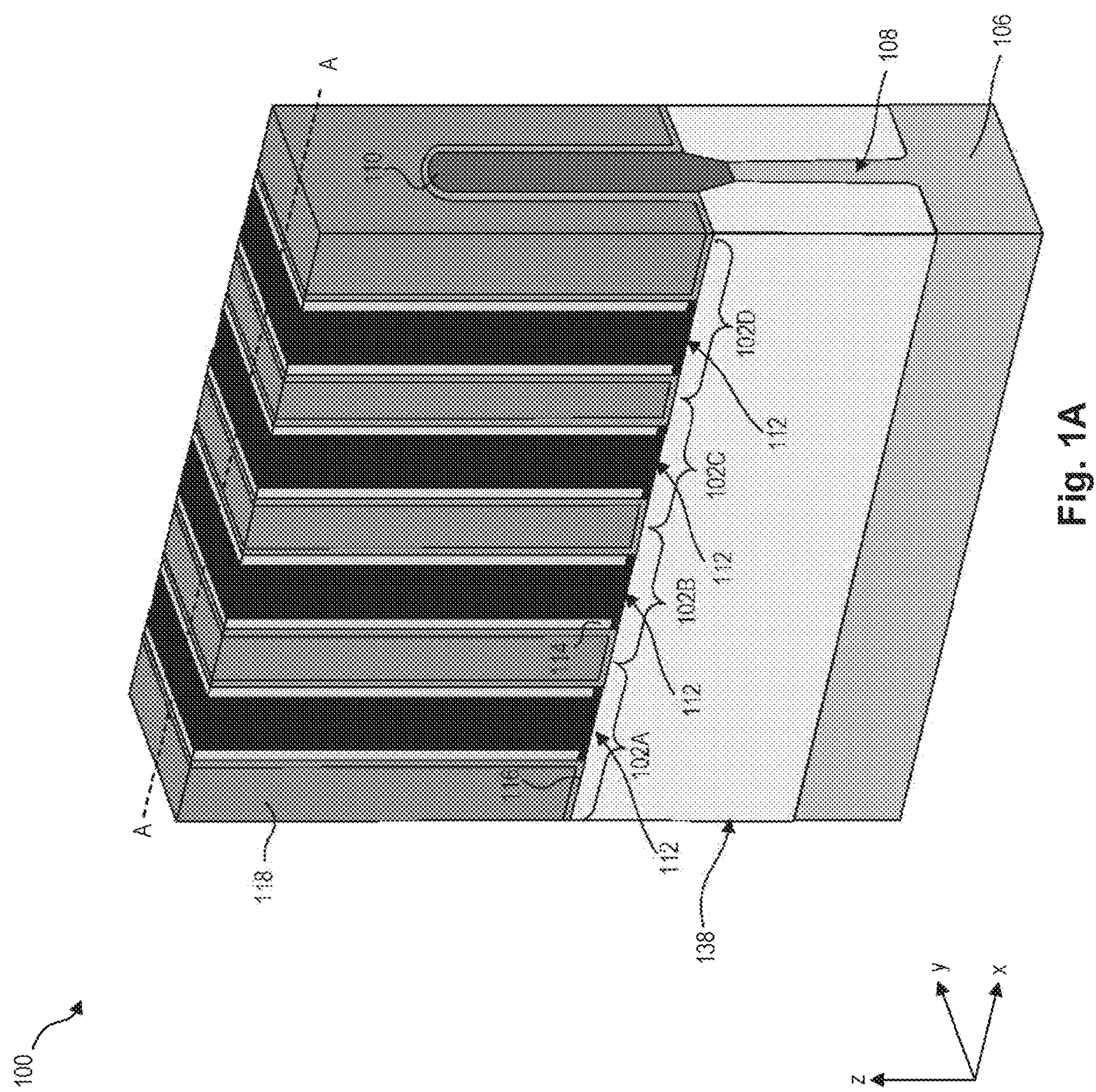
FIGS. 1A and 1G illustrate isometric views of semiconductor devices with different epitaxial interface profiles, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "nanostructured" defines a structure, layer, and/or region as having a horizontal dimension (e.g., along an X- and/or Y-axis) and/or a vertical dimension (e.g., along a Z-axis) less than, for example, 100 nm.

As used herein, the term "n-type work function metal (nWFM)" defines a metal or a metal-containing material with a work function value closer to a conduction band energy than a valence band energy of a material of a FET channel region. In some embodiments, the term "n-type work function metal (nWFM)" defines a metal or a metal-containing material with a work function value less than 4.5 eV.

As used herein, the term "p-type work function metal (pWFM)" defines a metal or a metal-containing material with a work function value closer to a valence band energy than a conduction band energy of a material of a FET channel region. In some embodiments, the term "p-type work function metal (pWFM)" defines a metal or a metal-containing material with a work function value equal to or greater than 4.5 eV.

As used herein, the term "superlattice structure" defines a structure having a stack of nanostructured layers of two different materials that are arranged in an alternating configuration.

As used herein the term "epitaxial interface" defines an interface between an epitaxial region and another epitaxial or non-epitaxial region.

As used herein the term "heterogeneous epitaxial interface" or "heterogeneous interface" defines an interface between an epitaxial region with a first material and another epitaxial or non-epitaxial region with a second material, where the first and second materials are different from each other in structure and/or composition.

As used herein the term "homogeneous epitaxial interface" or "homogeneous interface" defines an interface between an epitaxial region with a first material and another epitaxial or non-epitaxial region with a second material, where the first and second materials are similar to each other in structure and/or composition.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values of a given quantity as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures and methods for reducing stress induced defects in heterogeneous epitaxial interfaces in FETs (e.g., GAA FETs and/or finFETs) formed on a substrate. The heterogeneous epitaxial interfaces can be present between the channel regions and the epitaxial source/drain (S/D) regions of the FETs and/or between the epitaxial regions of different FETs formed adjacent to each other on the substrate. The stress can be induced due to lattice mismatch between the different materials of the channel regions and epitaxial source/drain (S/D) regions and/or due to lattice mismatch between the different materials of the epitaxial regions of the different FETs. The example structures and methods can also reduce impurity induced defects at the heterogeneous epitaxial interfaces. The impurities can be generated due to the migration of atoms from the exposed surfaces of the channel regions to the exposed surfaces of the substrate during the high temperature epitaxial growth processes.

In the example methods, prior to the formation of the epitaxial regions, the surfaces of the channel regions, the substrate, and/or any other surfaces that form heterogeneous epitaxial interfaces with the FET epitaxial regions are selectively modified. The modified surfaces can reduce interfacial stress and/or atomic migration between the materials of the epitaxial regions and the materials of the surfaces on which the epitaxial regions are grown. In some embodiments, these surfaces can be selectively modified (e.g., etched) to provide curved interface profiles between the epitaxial regions and the modified surfaces. The curved interface profiles can reduce interfacial stress by about 50% to about 80% compared to heterogeneous epitaxial interfaces formed without curved interface profiles. In some embodiments, these surfaces can be selectively modified (e.g., passivated) with barrier layers to prevent or reduce atomic migration between the epitaxial regions and the modified surfaces during the epitaxial growth processes. The barrier layers can reduce impurities in the epitaxial regions and/or at the heterogeneous epitaxial interfaces due to the atomic migration by about 50% to about 90% compared to epitaxial growth processes carried out without the barrier layers. In some embodiments, the impurity concentration in the epitaxial regions and/or at the heterogeneous epitaxial interfaces can be below about 2 atomic percent.

A semiconductor device 100 having FETs 102A-102D is described with reference to FIGS. 1A-1F, according to some embodiments. FIG. 1A illustrates an isometric view of semiconductor device 100, according to some embodiments. Semiconductor device 100 can have different cross-sectional views along line A-A of FIG. 1A as illustrated in FIGS. 1B-1F, according to various embodiments. The cross-sectional views of FETs 102C-102D are not illustrated in FIGS. 1B-1E and the cross-sectional view of FET 102D is not illustrated in FIG. 1F for the sake of simplicity. The discussion of FETs 102A-102B with reference to FIGS. 1B-1E can be applied to FETs 102C-102D unless mentioned otherwise. Though four FETs are discussed with reference to FIGS. 1A-1F, semiconductor device 100 can have any number of FETs. FETs 102A-102D can be n-type, p-type, or a combination thereof. In some embodiments, semiconductor device 100 can include isolation structures (not shown) to electrically isolate different conductivity type FETs 102A-102D from each other. The discussion of elements of FETs 102A-102D with the same annotations applies to each other, unless mentioned otherwise.

FETs 102A-102D can be formed on a substrate 106. Substrate 106 can be a semiconductor material, such as silicon, germanium (Ge), silicon germanium (SiGe), a silicon-on-insulator (SOI) structure, and a combination thereof. Further, substrate 106 can be doped with p-type dopants (e.g., boron, indium, aluminum, or gallium) or n-type dopants (e.g., phosphorus or arsenic).

FETs 102A-102D can include a fin structure 108 extending along an X-axis, gate structures 112 extending along a Y-axis, epitaxial fin regions 110, and gate spacers 114. Though a single fin structure and four gate structures are discussed with reference to FIGS. 1A-1F, semiconductor device 100 can have any number of fin structures and gate structures.

Figure 1B:
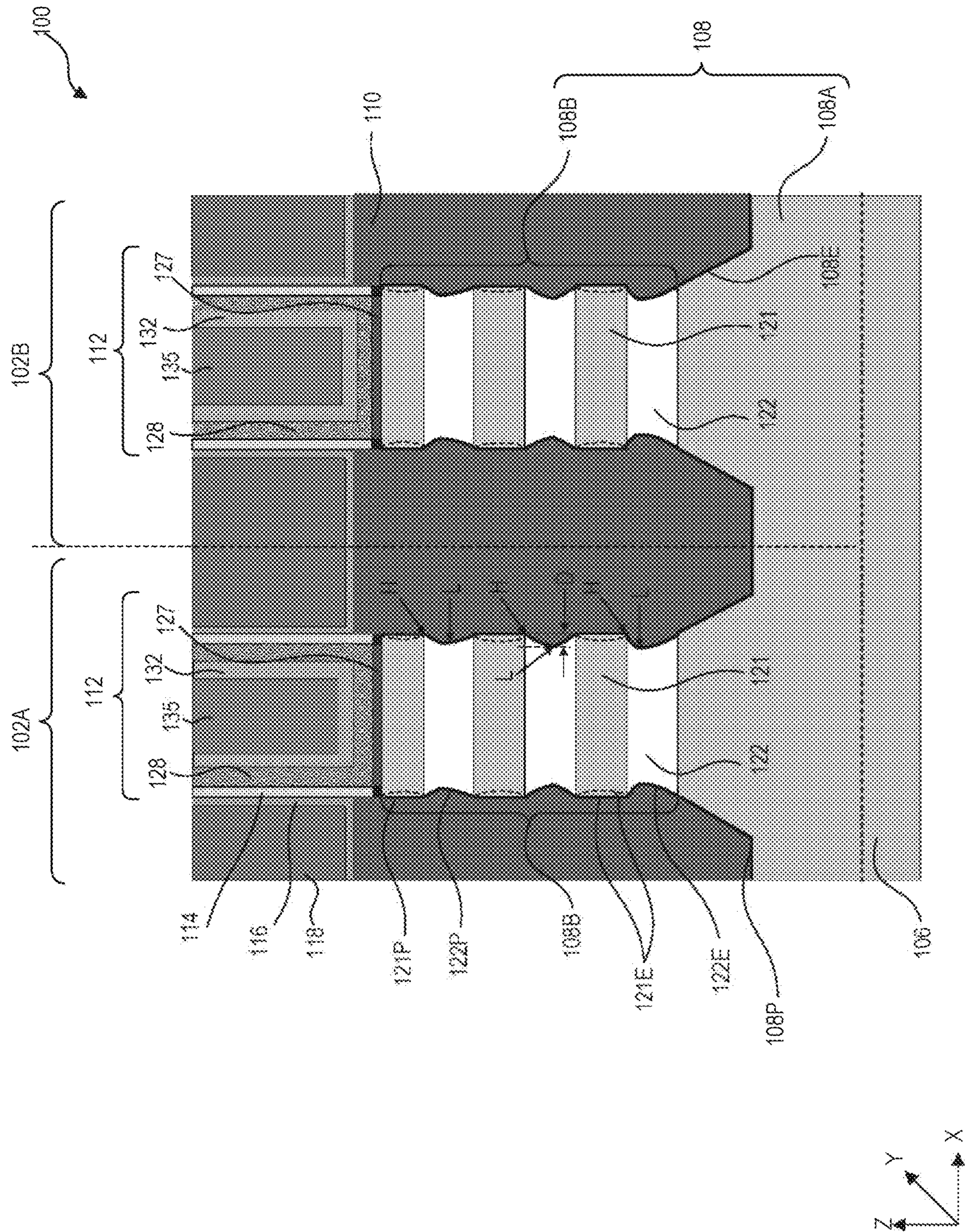
FIGS. 1B-1F and 1H-1J illustrate cross-sectional views of semiconductor devices with different epitaxial interface profiles, in accordance with some embodiments
Figure 1C:
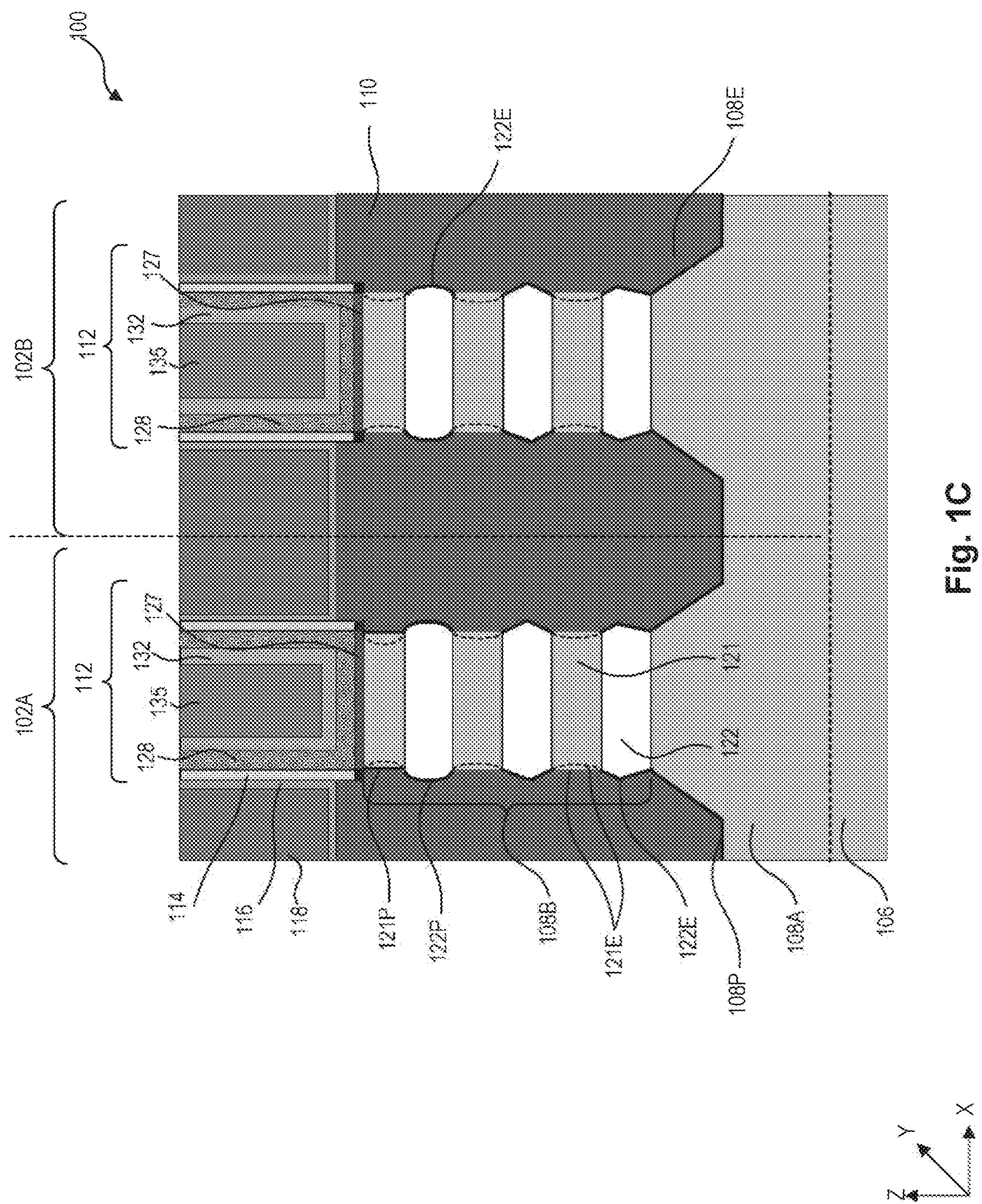

Referring to FIGS. 1B-1C, fin structure 108 can include a fin base 108A and superlattice structures 108B disposed on fin base 108A. Fin base 108A can include a material similar to substrate 106 and can be formed from patterning and etching of substrate 106. Superlattice structures 108B can be epitaxial structures grown on fin base 108A and can include nanostructured layers 121-122 stacked in an alternating configuration. Though each superlattice structure 108B is shown to have three pairs of nanostructured layers 121-122, each superlattice structure 108B can have one or more pairs of nanostructured layers 121-122. Each superlattice structure 108B can be nanostructured channel regions 108B of FETs 102A-102B.

Nanostructured layers 121-122 can include (i) semiconductor materials different from each other, (ii) semiconductor materials with etch selectivity different from each other, (iii) semiconductor materials with lattice constants different from each other, and/or (iv) semiconductor materials similar to or different from substrate 106. Nanostructured layers 121-122 can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof. In some embodiments, each of nanostructured layers 121-122 can have a vertical dimension (e.g., thickness or diameter) along a Z-axis ranging from about 1 nm to about 100 nm.

Epitaxial fin regions 110 can have semiconductor materials and can be source/drain (S/D) regions 110 of FETs 102A-102D. In some embodiments, n-type epitaxial fin regions 110 can include SiAs, SiC, or SiCP and p-type epitaxial fin regions 110 can include SiGe, SiGeB, GeB, SiGeSnB, or a III-V semiconductor compound. Epitaxial fin regions 110 can be epitaxially grown on fin base 108A and sidewalls of superlattice structures 108B. Epitaxial fin regions 110 can form heterogeneous or homogeneous epitaxial interfaces 108E, 121E, and 122E with fin base 108A, nanostructured layers 121, and nanostructured layers 122, respectively. In some embodiments, each of FETs 102A-102D can have both epitaxial interfaces 121E and 122E as heterogeneous interfaces or can have one of epitaxial interfaces 121E and 122E as heterogeneous interfaces and the other as homogeneous interfaces.

FETs 102A-102B can have heterogeneous interfaces 122E with curved interface profiles as shown in FIGS. 1B-1C to reduce the interfacial stress induced by the lattice mismatch between the materials of epitaxial fin regions 110 and nanostructured layers 122. The lattice mismatch can be due to epitaxial fin regions 110 having a material with a lattice constant that is different from the lattice constant of the material of nanostructured layers 122. The sidewalls of nanostructured layers 122 can be modified (e.g., etched) during the fabrication of semiconductor device 100 to form curved sidewalls and as a result form heterogeneous interfaces 122E with curved interface profiles as shown in FIGS. 1B-1C. The curved sidewalls provide a larger surface area compared to vertical sidewalls for epitaxial fin regions 110 to grow on nanostructured layers 122, thus reducing the interfacial stress at heterogeneous interfaces 122E. In some embodiments, a distance D along an X-axis between the highest point H and the lowest point L of the curved sidewall profiles range from about 2 nm to about 10 nm. Distance D can depend on the parameters of the modification process (e.g., etching process) and/or the vertical dimensions along a Z-axis of nanostructured layers 122. If distance D is less than about 2 nm, the surface area of the curved sidewalls may be insufficient to reduce the interfacial stress at heterogeneous interfaces 122E, which can negatively impact device performance. On the other hand, if distance D is greater than about 10 nm, the process time (e.g., the etching times) to form the curved sidewalls increases, consequently increasing device manufacturing cost. In some embodiments, a ratio of distance D to the vertical dimension of nanostructured layer 122 is proportion to the lattice mismatch between the materials of epitaxial fin regions 110 and nanostructured layers 122.

The formation of the curvature direction of the curved interface profiles of heterogeneous interfaces 122E is dependent on the lattice constant mismatch between nanostructured layers 122 and epitaxial fin regions 110. In some embodiments, the curved interface profiles can be formed to curve toward (shown in FIG. 1B) or away (shown in FIG. 1C) from nanostructured layers 122 when the lattice constant of the material of nanostructured layers 122 is larger or smaller, respectively, than that of epitaxial fin regions 110.

Figure 1D:
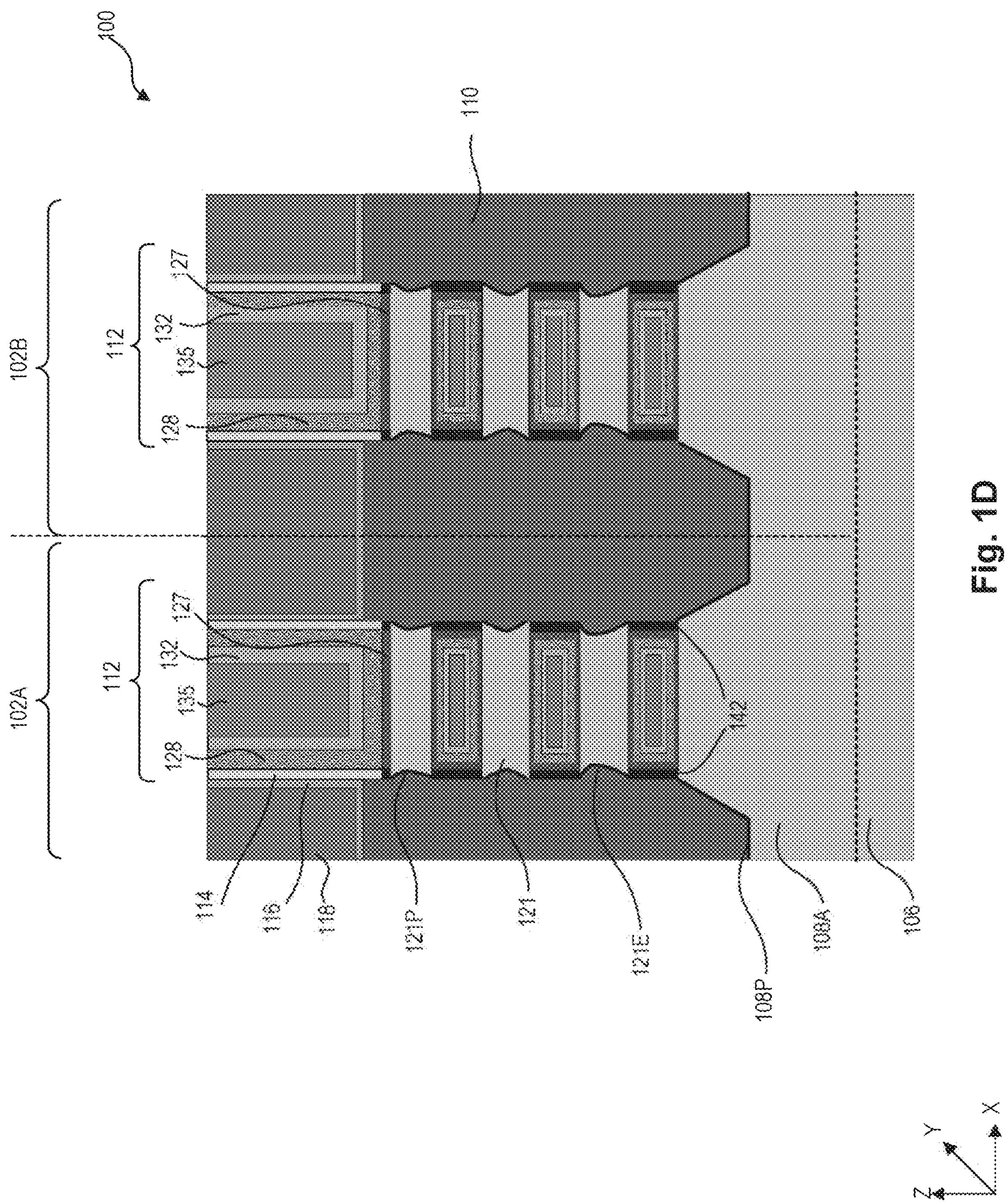

Similarly, heterogeneous interfaces 121E can have curved interface profiles as shown in FIGS. 1B-1C (dashed lines) and FIG. 1D (solid lines) when the material of nanostructured layers 121 have a lattice constant that is different from the lattice constant of the material of epitaxial fin regions 110. Similar to the curvature direction of heterogeneous interfaces 122E, the curvature direction of heterogeneous interfaces 121E depends on the lattice constant mismatch between nanostructured layer 121 and epitaxial fin regions 110.

Instead of heterogeneous interfaces 121E, FETs 102A-102B can have homogeneous interfaces 121E with substantially linear profiles as shown in FIGS. 1B-1C (solid lines). In some embodiments, homogeneous interfaces 121E can also have curved interface profiles similar to heterogeneous interfaces discussed above. Homogeneous interfaces 121E can be formed when nanostructured layers 121 and epitaxial fin regions 110 have different materials but the material of nanostructured layers 121 have a lattice constant that is equal to or substantially equal to the lattice constant of the material of epitaxial fin regions 110. Homogeneous interfaces 121E can also be formed when nanostructured layers 121 and epitaxial fin regions 110 have the same materials. Similarly, instead of heterogeneous interfaces 122E, FETs 102A-102B can have homogeneous interfaces 122E with substantially linear profiles (not shown). FETs 102A-102B can have heterogeneous interfaces 108E with tapered interface profiles as shown in 1B-1F or can have homogeneous interfaces 108E with substantially linear profiles (not shown).

Referring to FIGS. 1B-1C, FETs 102A-102B can have passivation layers 108P, 121P, and 122P at epitaxial interfaces 108E, 121E, and 122E, respectively. Passivation layers 108P, 121P, and 122P can be self-assembled monolayers (SAMs) formed at epitaxial interfaces 108E, 121E, and 122E, respectively. In some embodiments, passivation layers 108P, 121P, and 122P can include halides, oxides, nitrides, carbides, or a combination thereof of the materials of fin base 108A, nanostructured layers 121, and nanostructured layers 122. Passivation layers 108P, 121P, and 122P can be similar to or different from each other.

During the formation of epitaxial fin regions 110, passivation layers 108P, 121P, and 122P can prevent or reduce the migration of atoms between fin base 108A, nanostructured layers 121, and nanostructured layers 122, thus reducing impurity concentration to less than about 2 atomic percent (e.g., about 0.01 atomic percent to about 1.9 atomic percent) in epitaxial interfaces 108E, 121E, and 122E. Impurity concentrations greater than about 2 atomic percent in epitaxial interfaces 108E, 121E, and 122E can degrade the performance of semiconductor device 100. In some embodiments, passivation layers 108P, 121P, and 122P can be removed after the formation of epitaxial fin regions 110.

Referring to FIG. 1D, in some embodiments, FETs 102A-102B can be gate-all-around (GAA) FETs with nanostructured layers 122 replaced by gate structures 112 and inner spacer structures 142, which are described in further detail below.

Figure 1E:
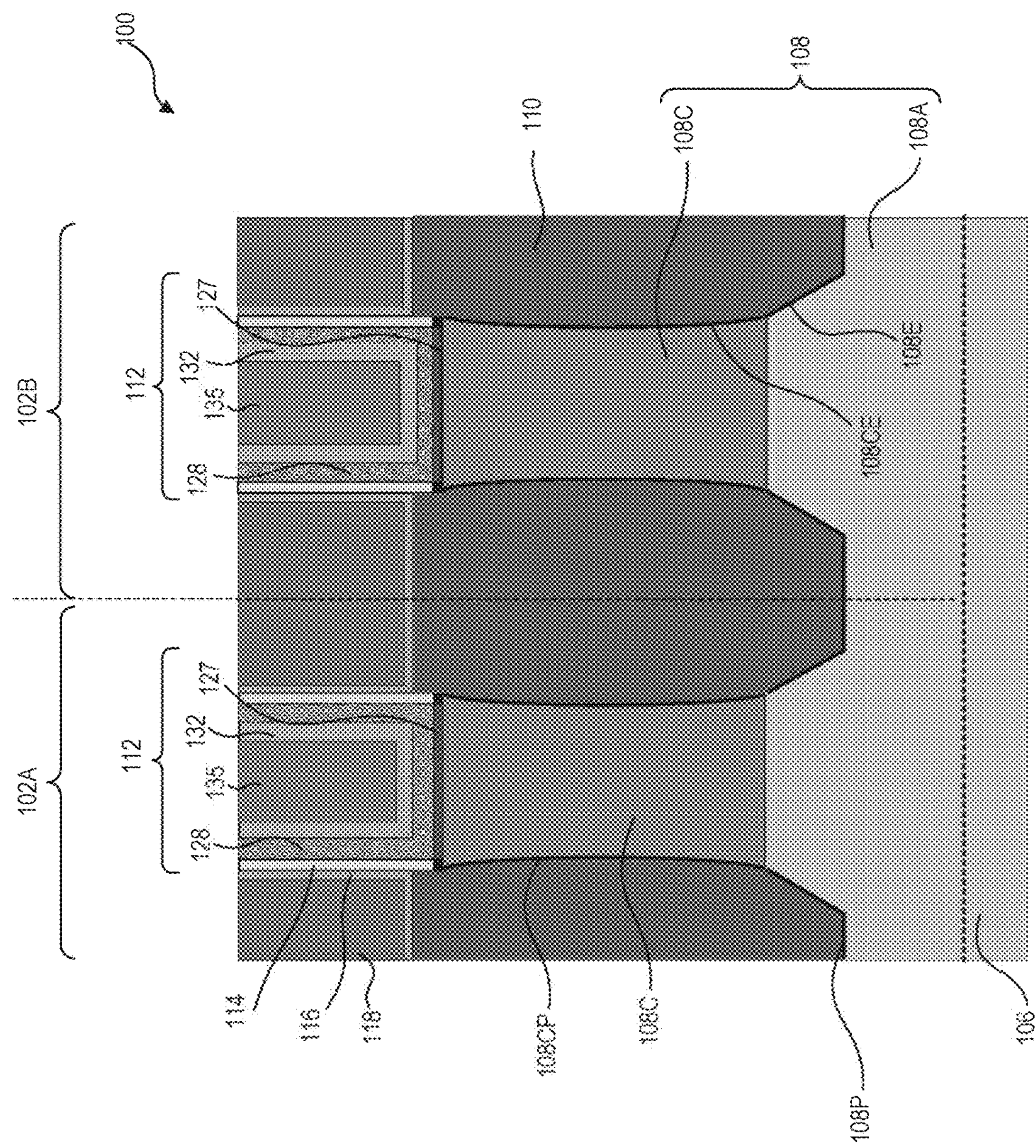

Referring to FIG. 1E, in some embodiments, fin structure 108 can have bulk structures 108C epitaxially grown on fin base 108A instead of superlattice structures 108B. Bulk structures 108C can form channel regions 108C of FETs 102A-102B and can include semiconductor materials similar to or different from substrate 106. In some embodiments, bulk structures 108C can include Si, SiAs, SiP, SiC, SiCP, SiGe, SiGeB, GeB, SiGeSnB, or a III-V semiconductor compound. In some embodiments, bulk structures 108C of FETs 102A-102B can include materials similar to or different from each other. Epitaxial fin regions 110 can be epitaxially grown on fin base 108A and sidewalls of bulk structures 108C. Epitaxial fin regions 110 can form heterogeneous interfaces 108E and 108CE with fin base 108A and bulk structures 108C, respectively.

FETs 102A-102B can have heterogeneous interfaces 108CE with curved interface profiles as shown in FIG. 1E to reduce the interfacial stress induced by the lattice mismatch between the materials of epitaxial fin regions 110 and bulk structures 108C. In some embodiments, the curved interface profiles can be formed to curve towards (shown in FIG. 1E) or away from (not shown) bulk structures 108C when the lattice constant of the material of bulk structures 108C is larger or smaller, respectively, than that of epitaxial fin regions 110.

FETs 102A-102B can have passivation layers 108CP at heterogeneous interfaces 108CE. Though two of passivation layers 108CP are shown in FIG. 1E, FETs 102A-102B can have passivation layers 108CP on any number of heterogeneous interfaces 108CE. Passivation layers 108CP can be self-assembled monolayers (SAMs) formed at heterogeneous interfaces 108CE and can include halides, oxides, nitrides, carbides, or a combination thereof of the materials of bulk structures 108C. Passivation layers 108CP and 108P can be similar to or different from each other. Passivation layers 108CP can prevent or reduce the migration of atoms from bulk structures 108C to fin base 108A, thus reducing impurity concentration to less than about 2 atomic percent (e.g., about 0.01 atomic percent to about 1.9 atomic percent) in heterogeneous interfaces 108E. Passivation layers 108P and 108CP can be present or removed after the formation of epitaxial fin regions 110.

Figure 1F:
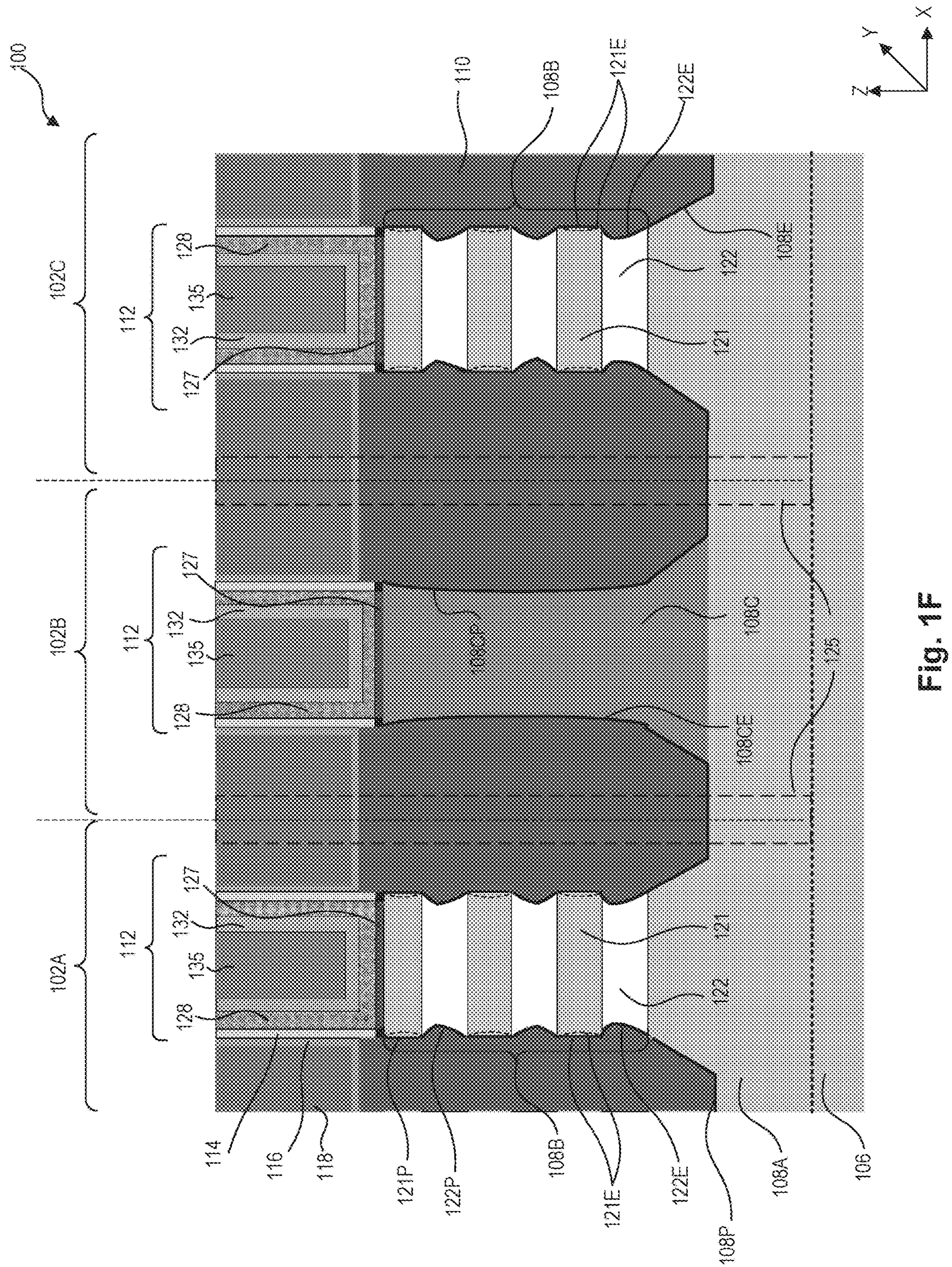

Referring to FIG. 1F, in some embodiments, fin structure 108 can have a combination of superlattice structures 108B and bulk structure 108C epitaxially grown on fin base 108A. Superlattice structures 108B can form nanostructured channel regions 108B of FETs 102A and 102C and bulk structure 108C can form channel region 108C of FET 102B. The discussion of elements in FIGS. 1B, 1E, and 1F with the same annotations applies to each other, unless mentioned otherwise. Similar to structures described with reference to FIG. 1D, nanostructured layers 122 in FIG. 1F can be replaced by gate structures 112 and inner spacer structures 142 to form GAA FETs 102A and 102C. In some embodiments, FETs 102A-102C can be electrically isolated from each other by dielectric isolation structures 125.

Gate structures 112 can be multi-layered structures and can be disposed on superlattice structures 108A (shown in FIGS. 1B-1C and 1F) and bulk structures 108C (shown in FIGS. 1E-1F) and/or can be wrapped around nanostructured channel regions 121 (shown in FIG. 1D). Gate structures 112 can include interfacial oxide (TO) layers 127, HK gate dielectric layers 128, work function metal (WFM) layers 132, and gate metal fill layers 135. IO layers 127 can include silicon oxide ($SiO_2$), silicon germanium oxide ($SiGeO_x$), or germanium oxide ($GeO_x$). HK gate dielectric layers 128 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). WFM layers 132 can include titanium aluminum (TiAl), titanium aluminum carbide (TiAlC), tantalum aluminum (TaAl), tantalum aluminum carbide (TaAlC), or a combination thereof. Gate metal fill layers 135 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof. Gate spacers 114 and inner spacers 142 can form sidewalls of gate structures 112. Each of gate spacers 114 and inner spacer 142 can include insulating material, such as silicon oxide, silicon nitride, silicon oxynitride, a low-k material, and a combination thereof.

Semiconductor device 100 can further include etch stop layer (ESL) 116, interlayer dielectric (ILD) layer 118, and shallow trench isolation (STI) regions 138. ESL 116 can include an insulating material, such as silicon oxide and silicon germanium oxide. ILD layer 118 can be disposed on ESL 116 and can include a dielectric material. STI regions 138 can provide electrical isolation between FETs 102A-102D and can include an insulating material. The cross-sectional shapes of semiconductor device 100 and its elements (e.g., fin structure 108, gate structures 112, epitaxial fin regions 110, inner spacers 142, gate spacers 114, and/or STI regions 138) are illustrative and are not intended to be limiting.

Figure 1G:
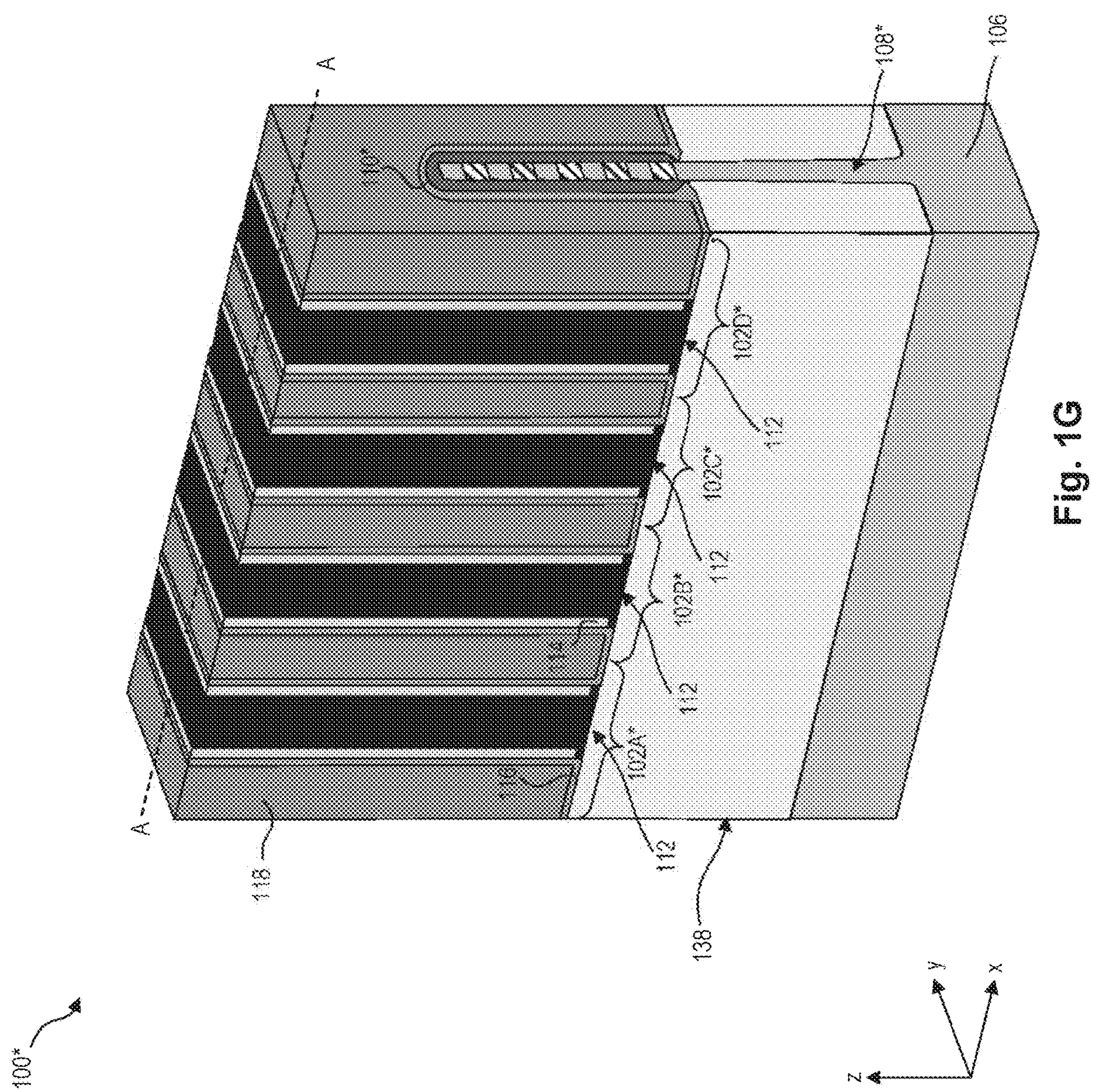
Figure 1H:
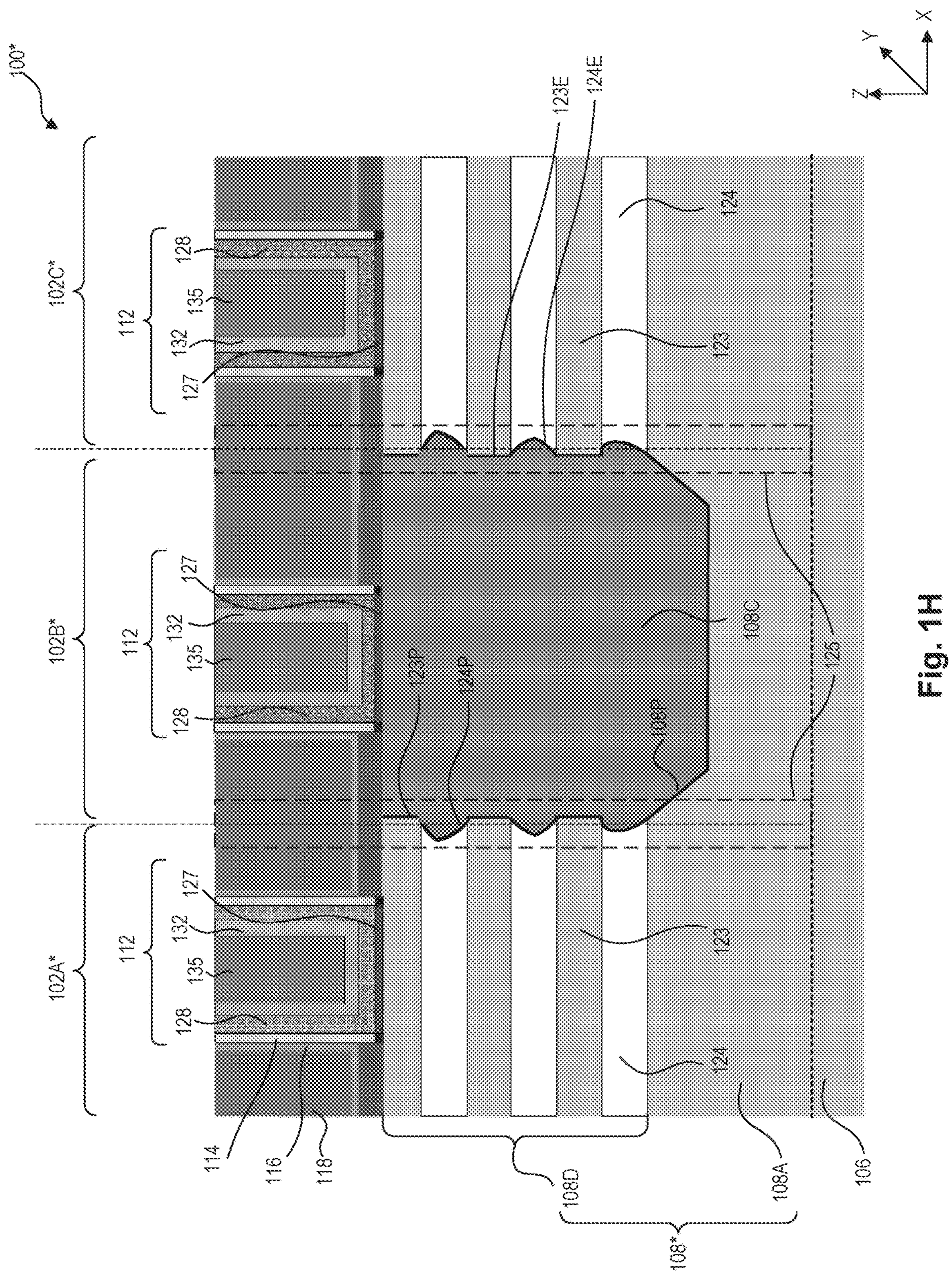
Figure 1I:
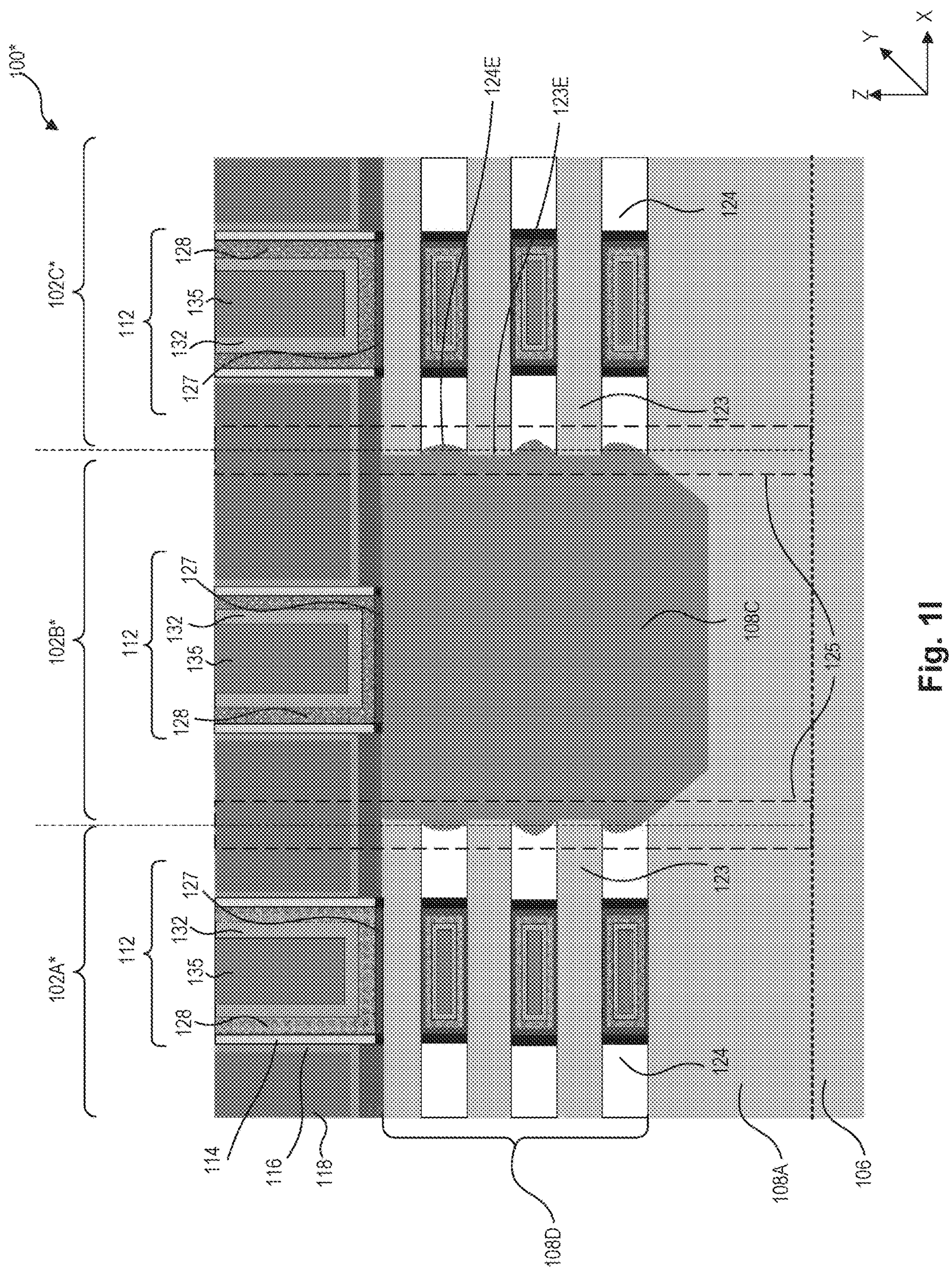
Figure 1J:
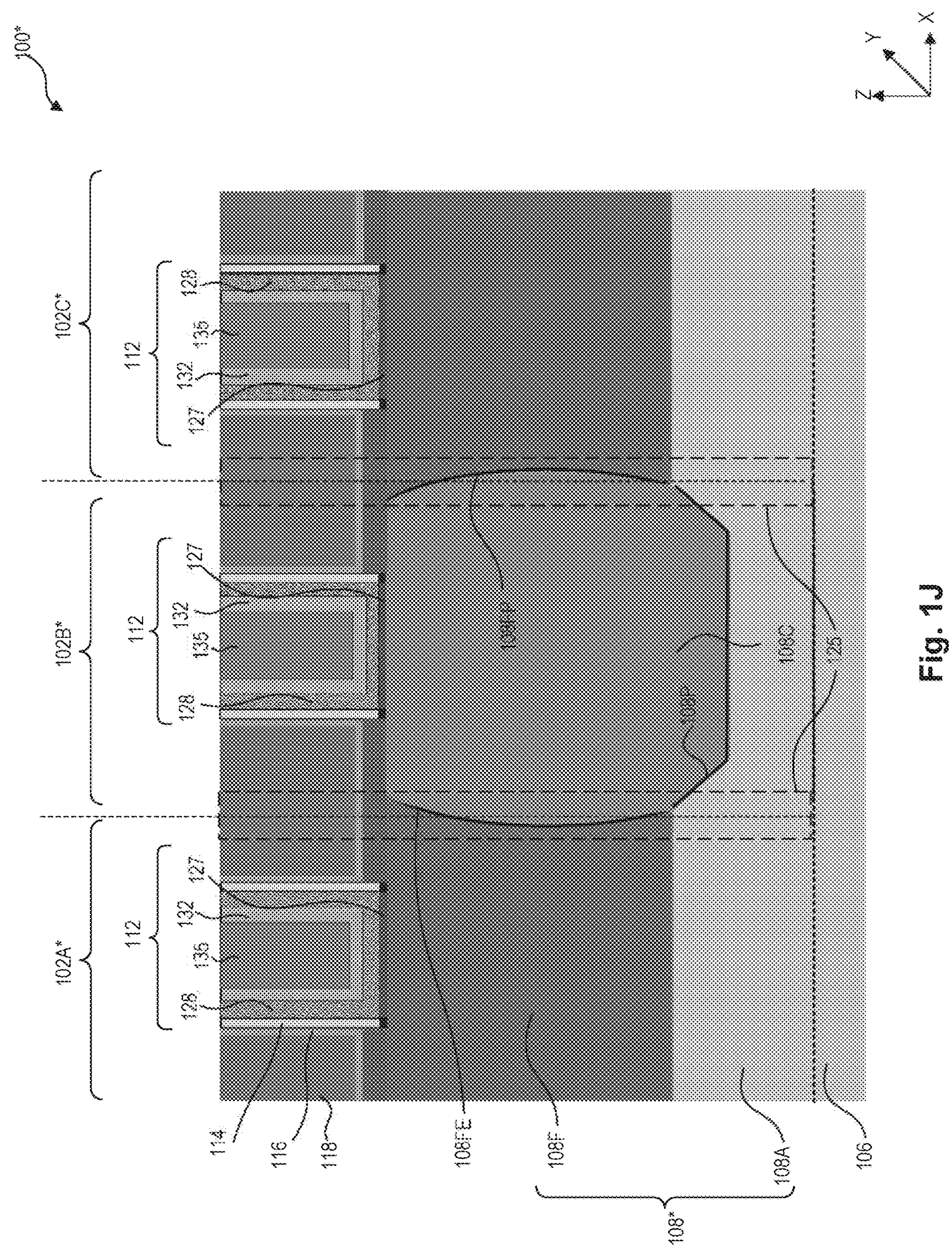

A semiconductor device 100* having FETs 102A*-102D* is described with reference to FIGS. 1G-1J, according to some embodiments. The discussion of elements in FIGS. 1A-1J with the same annotations applies to each other, unless mentioned otherwise. FIG. 1G illustrates an isometric view of semiconductor device 100*, according to some embodiments. Semiconductor device 100* can have different cross-sectional views along line A-A of FIG. 1G as illustrated in FIGS. 1H-1J, according to various embodiments. FETs 102A*-102D* can be n-type, p-type, or a combination thereof. The discussion of elements of FETs 102A*-102D* with the same annotations applies to each other, unless mentioned otherwise.

FETs 102A*-102D* can include a fin structure 108* extending along an X-axis, gate structures 112 extending along a Y-axis, epitaxial fin regions 110*, and gate spacers 114. In some embodiments, FETs 102A*-102C* can be electrically isolated from each other by dielectric isolation structures 125 as shown in FIGS. 1H-1J. Fin structure 108* can have superlattice structures 108D and bulk structure 108C epitaxially grown on fin base 108A. Portions of superlattice structures 108D under gate structures 112 can form nanostructured channel regions 108D of FETs 102A* and 102C* and portion of bulk structure 108C under gate structure 112 can form bulk channel region 108C of FET 102B*. Superlattice structures 108D can include nanostructured layers 123-124 stacked in an alternating configuration. The discussion of the materials and dimensions of nanostructured layers 121-122 applies to nanostructured layers 123-124 unless mentioned otherwise.

Referring to FIGS. 1H-1I, nanostructured layers 123-124 can form respective heterogeneous or homogeneous epitaxial interfaces 123E-124E with bulk structure 108C. In some embodiments, both epitaxial interfaces 123E-124E can be heterogeneous interfaces or one of epitaxial interfaces 123E-124E can be heterogeneous interfaces and the other can be homogeneous interfaces.

Heterogeneous interfaces 124E can be formed with curved interface profiles as shown in FIGS. 1H-1I to reduce the interfacial stress induced by the lattice mismatch between the materials of bulk structure 108C and nanostructured layers 124. The curved interface profiles allow FETs with different types of channel regions (such as nanostructured channel regions 123-124 and bulk channel regions 108C) to be formed on the same fin structure 108* without sacrificing the device performance of semiconductor device 100*. In some embodiments, the curved interface profiles can be formed to curve towards (shown in FIG. 1H) or away from (not shown) nanostructured layers 124 when the lattice constant of the material of nanostructured layers 124 is larger or smaller, respectively, than that of bulk structures 108C. Similarly, heterogeneous epitaxial interfaces 123E can have curved interface profiles (not shown).

Homogeneous interfaces 123E can be formed with substantially linear profiles as shown in FIGS. 1H-1I. In some embodiments, homogeneous interfaces 123E can also have curved interface profiles similar to heterogeneous interfaces discussed above. Homogeneous interfaces 123E can be formed when nanostructured layers 123 and bulk structure 108C have different materials but the material of nanostructured layers 123 have a lattice constant that is equal to or substantially equal to the lattice constant of the material of bulk structure 108C. Homogeneous interfaces 123E can also be formed when nanostructured layers 123 and bulk structure 108C have the same materials. Similarly, homogeneous epitaxial interfaces 124E can have non-curved profiles (not shown).

In some embodiments, one or more epitaxial interfaces 123E-124E can have passivation layers 123P-124P, respectively. Passivation layers 123P-124P can be self-assembled monolayers (SAMs) formed at epitaxial interfaces 123E-124E, respectively. In some embodiments, passivation layers 123P-124P can include halides, oxides, nitrides, carbides, or a combination thereof of the materials of nanostructured layers 123-124. Passivation layers 123P-124P can reduce impurity concentration to less than about 2 atomic percent (e.g., about 0.01 atomic percent to about 1.9 atomic percent) in heterogeneous interfaces 123E-124E. Passivation layers 123P-124P can be similar to or different from each other.

Epitaxial fin regions 110* can have semiconductor materials and can be source/drain (S/D) regions of FETs 102A*-102D*. The discussion of the materials of epitaxial fin regions 110 applies to epitaxial fin regions 110* unless mentioned otherwise. Unlike epitaxial fin regions 110, epitaxial fin regions 110* are epitaxially grown surrounding superlattice structures 108D and bulk structure 108C. Referring to FIG. 1I, in some embodiments, FETs 102A* and 102C* can be GAA FETs with nanostructured channel regions 124 replaced by gate structures 112 and inner spacer structures 142.

Referring to FIG. 1J, in some embodiments, fin structure 108* can have bulk structures 108F epitaxially grown on fin base 108A instead of superlattice structures 108D. Portions of bulk structures 108F under gate structures 112 can form bulk channel regions 108F of FETs 102A* and 102C* and can include semiconductor materials different from bulk structure 108C. Epitaxial fin regions 110* can be epitaxially grown surrounding superlattice structures 108F and bulk structure 108C.

Bulk structures 108F can form heterogeneous interfaces 108FE with curved interface profiles as shown in FIG. 1J to reduce the interfacial stress induced by the lattice mismatch between the materials of bulk structures 108F and bulk structure 108C. In some embodiments, the curved interface profiles can be formed to curve towards (as shown in FIG. 1J) or away (not shown) from bulk structures 108F when the lattice constant of the material of bulk structures 108F is larger or smaller, respectively, than that of bulk structures 108C. Passivation layers 108FP can be self-assembled monolayers (SAMs) and can include halides, oxides, nitrides, carbides, or a combination thereof of the materials of bulk structures 108F. Passivation layers 108FP and 108P can be similar to or different from each other. Passivation layers 108FP can reduce impurity concentration to less than about 2 atomic percent (e.g., about 0.01 atomic percent to about 1.9 atomic percent) in heterogeneous interfaces 108FE.

Figure 2:
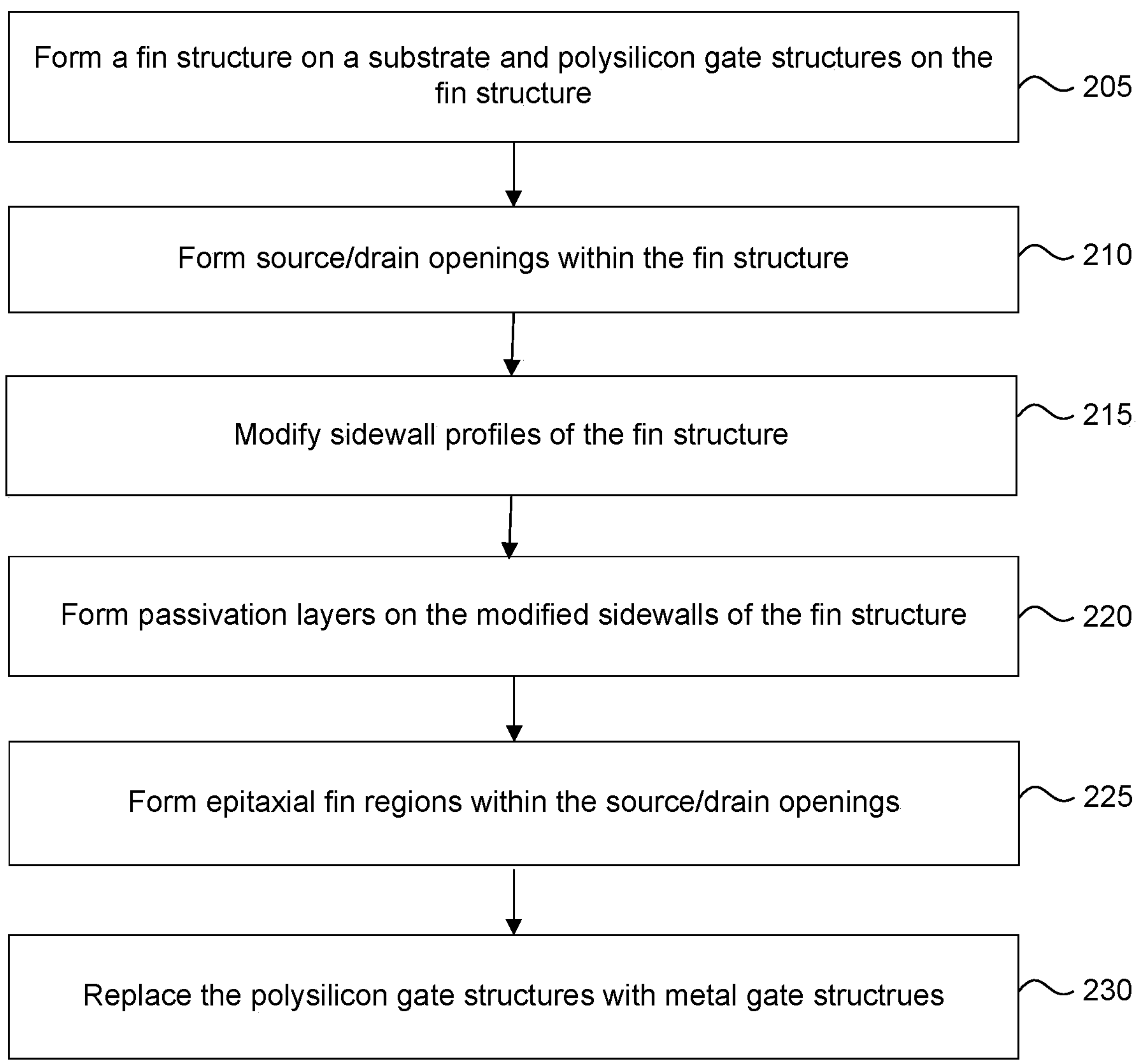
FIG. 2 is a flow diagram of a method for fabricating a semiconductor device with different epitaxial interface profiles, in accordance with some embodiments.

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-8B. FIGS. 3A-8A are cross-sectional views along lines A-A of FIG. 1A at various stages of fabricating semiconductor device 100 with the cross-sectional view of FIG. 1B, according to some embodiments. FIGS. 3B-8B are cross-sectional views along lines A-A of FIG. 1A at various stages of fabricating semiconductor device 100 with the cross-sectional view of FIG. 1E, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3A-8B with the same annotations as elements in FIGS. 1A-1F are described above.

Figure 3A:
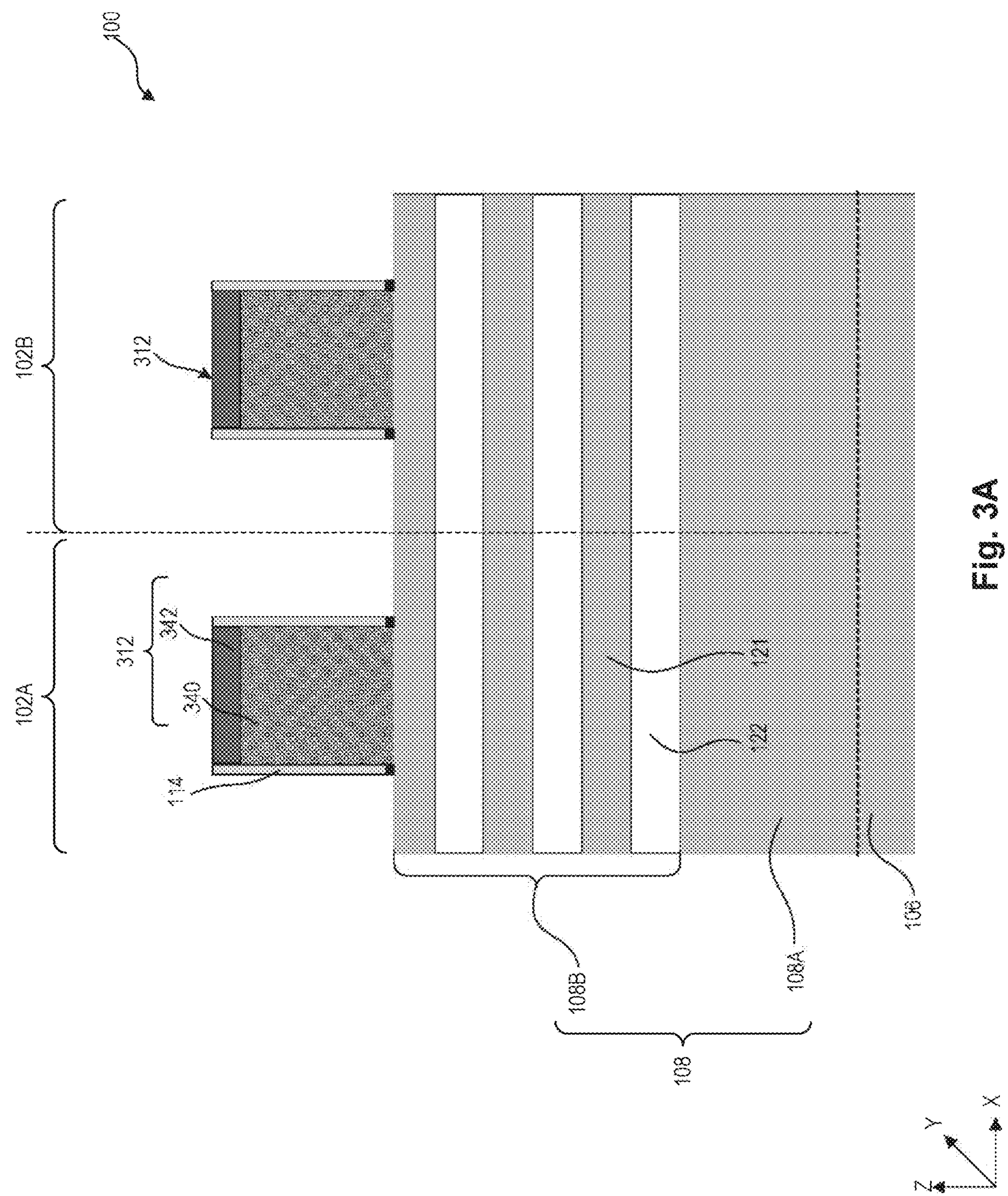
FIGS. 3A-8B illustrate cross-sectional views of a semiconductor device with different epitaxial interface profiles at various stages of its fabrication process, in accordance with some embodiments.
Figure 3B:
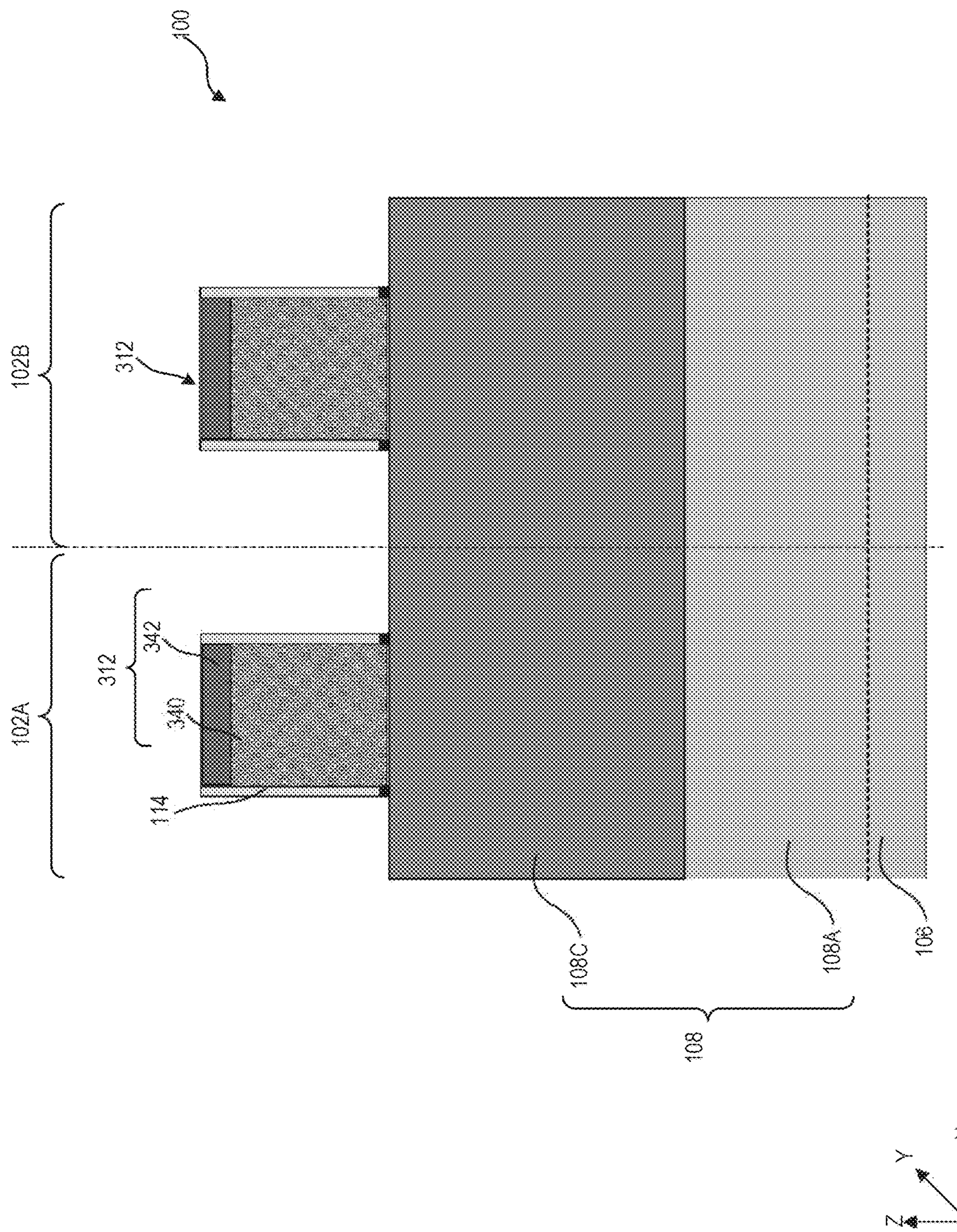

In operation 205, a fin structure is formed on a substrate and polysilicon gate structures are formed on the fin structure. For example, as shown in FIGS. 3A-3B, fin structure 108 can be formed on substrate 106 and polysilicon gate structures 312 with gate spacers 114 formed on sidewalls of polysilicon structures 312 can be formed on fin structure 108. Polysilicon gate structures 312 can include polysilicon layers 340 and hard mask layers 342. During subsequent processing, polysilicon gate structures 312 can be replaced in a gate replacement process to form gate structures 112.

The process for forming fin structure 108 can include sequential operations of (i) epitaxially growing a stacked layer (not shown) or a bulk layer (not shown) on substrate 106, and (ii) etching the stacked layer or the bulk layer through patterned hard mask layers (not shown) formed on the stacked layer or the bulk layer to form superlattice structure 108B on fin base 108A (shown in FIG. 3A) or bulk structure 108C on fin base 108A (shown in FIG. 3B). Superlattice structure 108B can include nanostructured layers 121-122 arranged in an alternating configuration. The etching of the stacked layer or the bulk layer can include a dry etch, a wet etch process, or a combination thereof. Following the formation of fin structure 108, polysilicon gate structures 312 can be formed on superlattice structure 108B (shown in FIG. 3A) or on bulk structure 108C (shown in FIG. 3B).

Figure 4A:
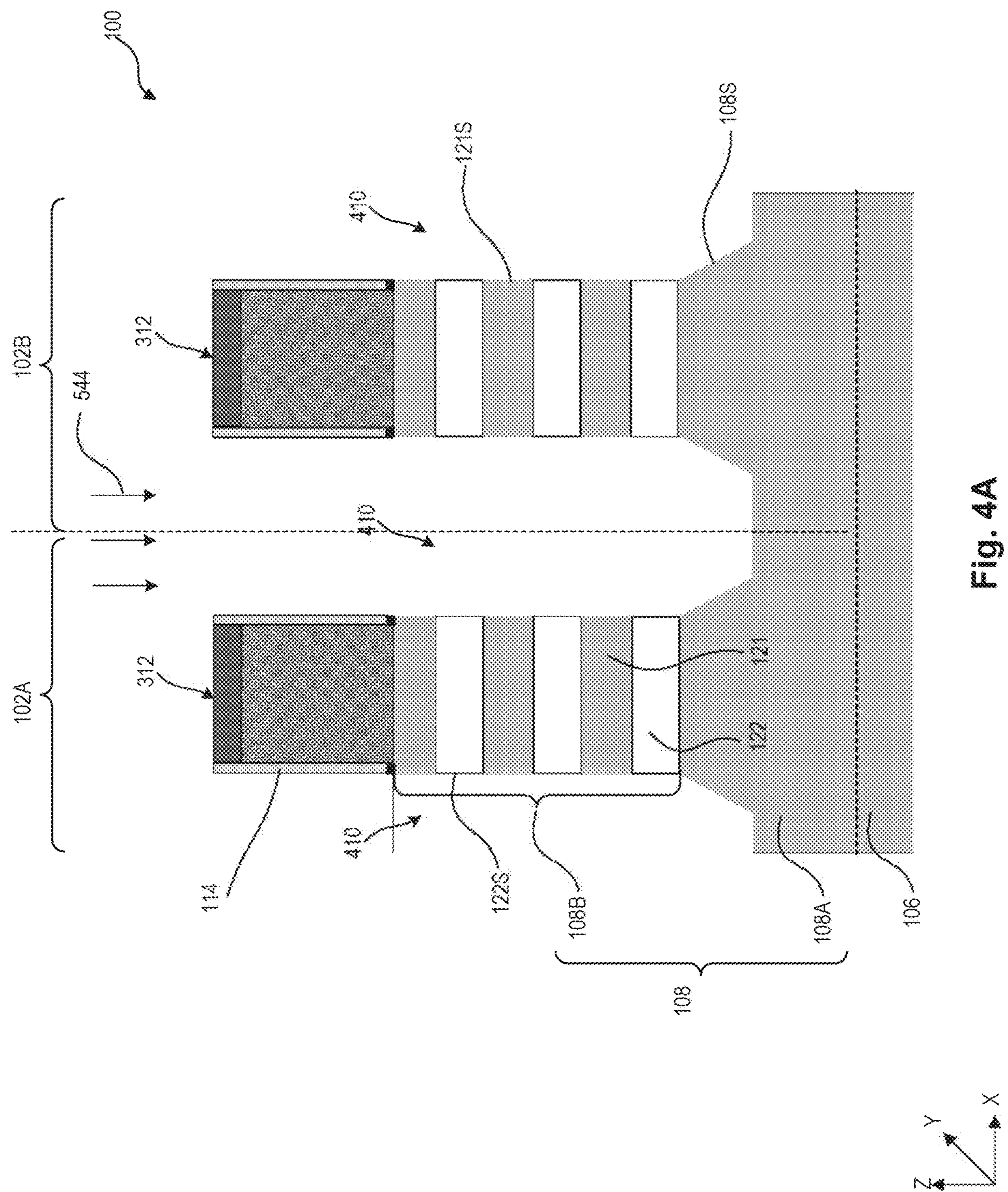
Figure 4B:
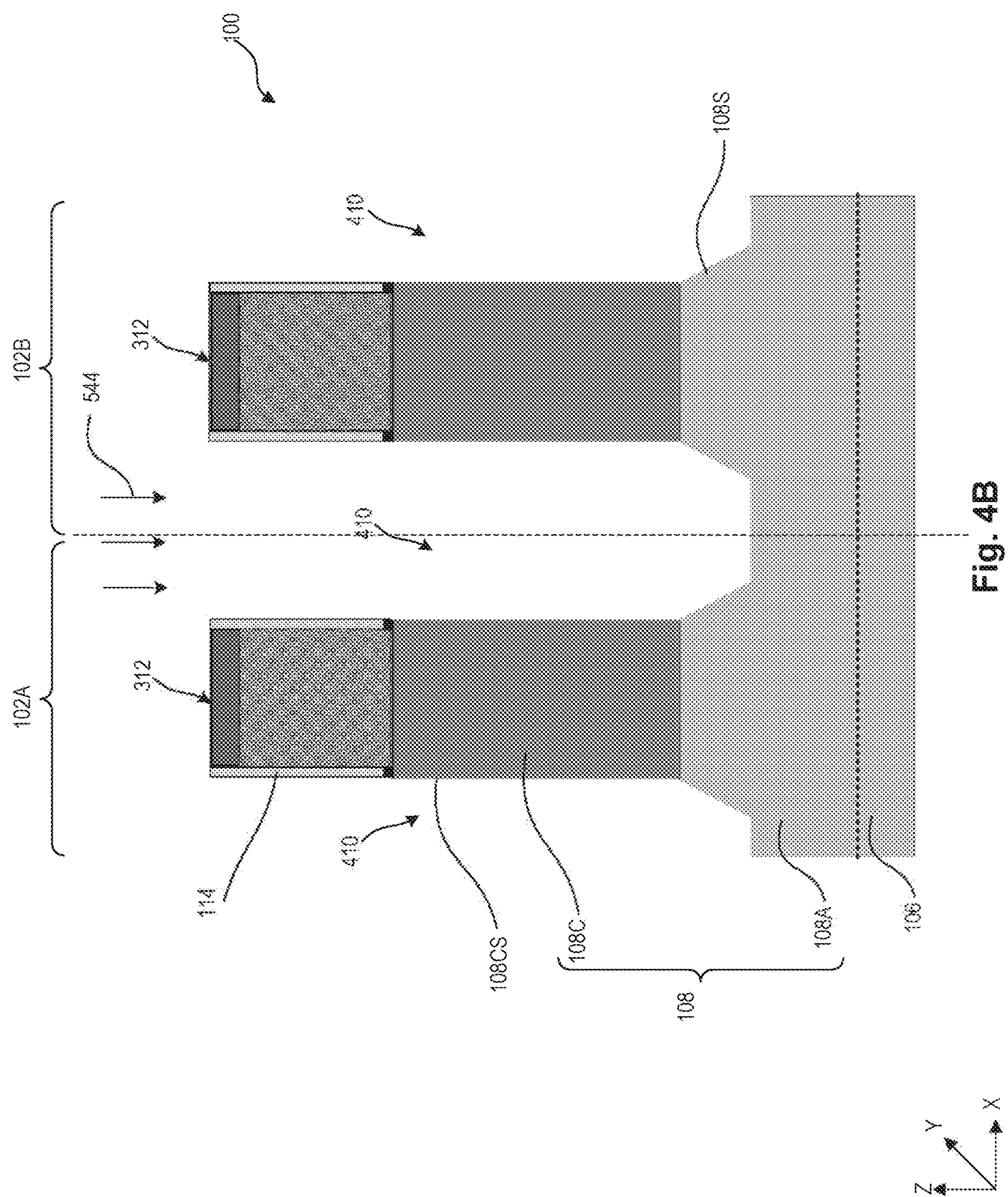

Referring to FIG. 2, in operation 210, source/drain (S/D) openings are formed within the fin structure. For example, as shown in FIGS. 4A-4B, S/D openings 410 can be formed within fin structure 108. First portions of S/D openings 410 can be formed within fin base 108A (shown in FIGS. 4A-4B) and second portions of S/D openings 410 can be formed within superlattice structure 108B (shown in FIG. 4A) or within bulk structure 108C (shown in FIG. 4B).

The process for forming S/D openings 410 can include etching portions of superlattice structure 108B (shown in FIG. 3A) or bulk structure 108C (shown in FIG. 3B) and portions of fin base 108A that are not underlying gate structures 312 to form the structure of FIG. 4A or 4B. The etching can include a dry anisotropic etching process that includes using etchants having a fluorine-containing gas (e.g., $CF_4$, $CF_3Br$, and/or $C_2F_6$), a chlorine-containing gas (e.g., $Cl_2$, $CHCl_3$, $CCl_4$, and/or HCl), a bromine-containing gas (e.g., HBr), or combinations thereof. The dry anisotropic etching process can be carried out at a radio frequency power ranging from about 50 W to about 300 W, at a pressure of about 50 mTorr to about 500 Torr, and at a temperature ranging from about 25° C. to about 60° C. The etchants and the etching process parameters are selected to achieve the substantially linear sidewall profiles of superlattice structures 108B (shown in FIG. 4A) or bulk structures 108C (shown in FIG. 4B) and the tapered sidewall profiles of fin base 108A shown in FIGS. 4A-4B. The one or more etchants are selected such that the etch selectivity of fin base 108A to superlattice structures 108B or the etch selectivity of fin base 108A to bulk structures 108C is less than about 2 (e.g., about 1.5, about 1, or about 0.5).

Figure 5A:
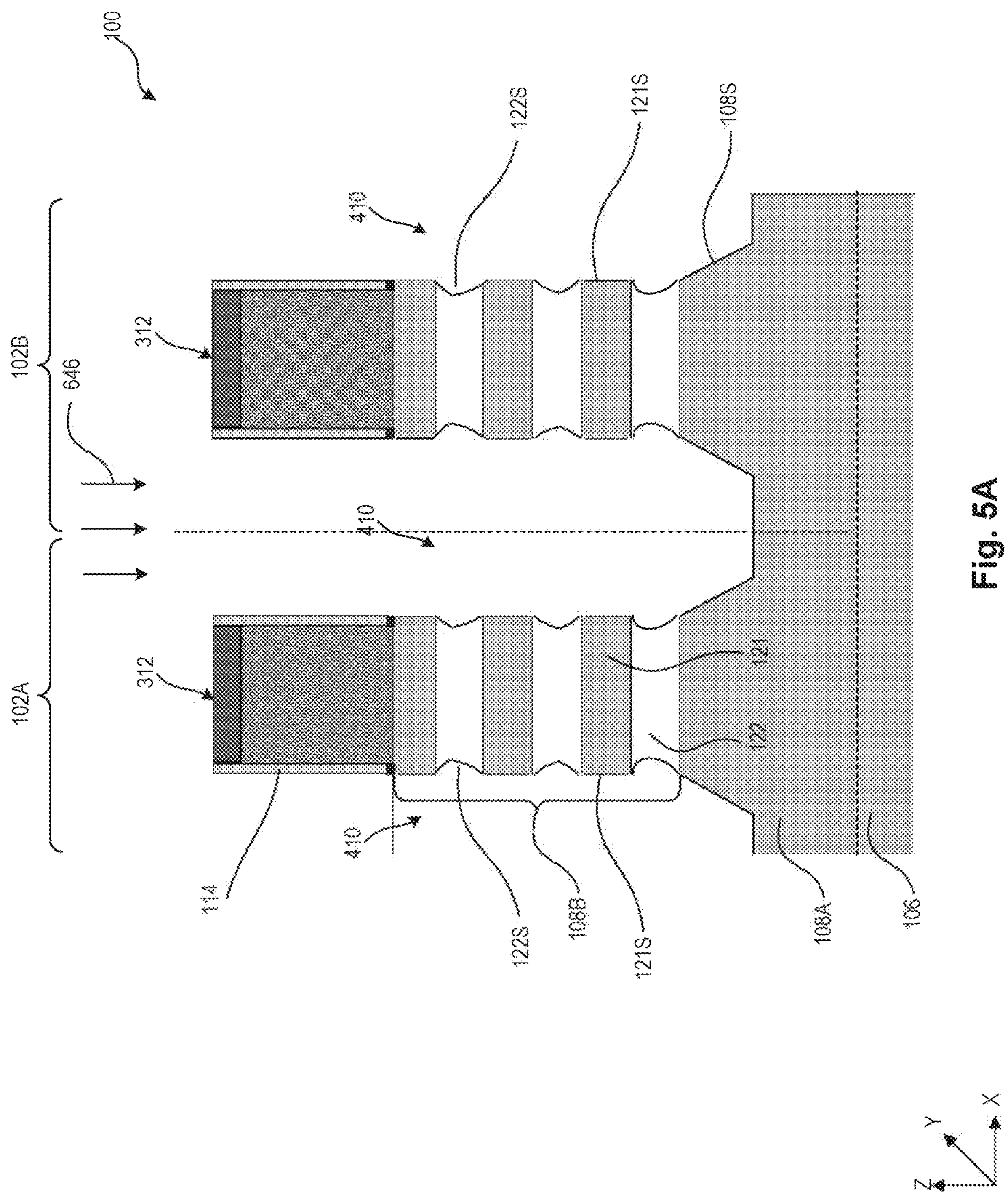
Figure 5B:
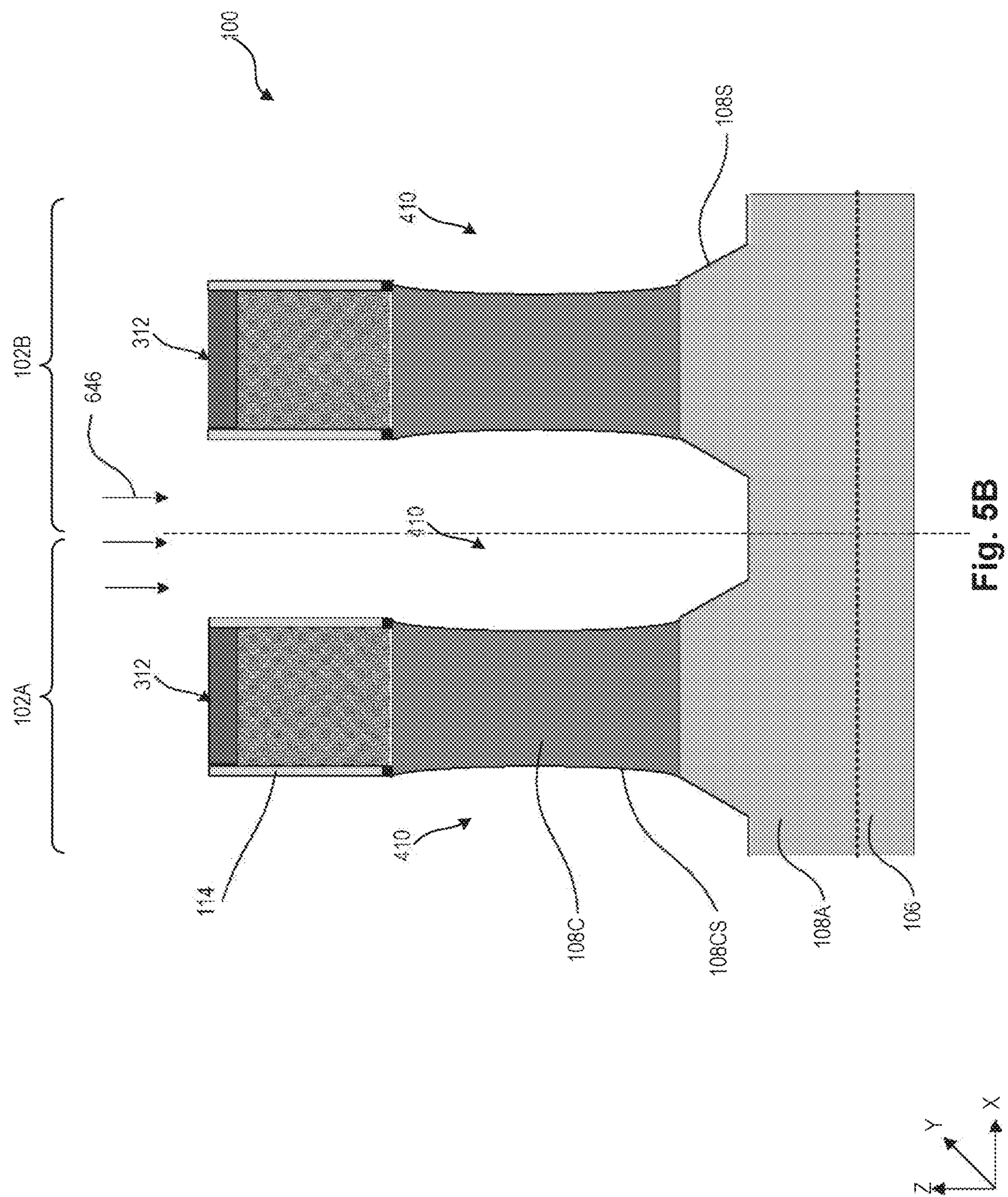

Referring to FIG. 2, in operation 215, sidewall profiles of the fin structure are modified. For example, as shown in FIGS. 5A-5B, sidewall profiles of fin structure 108 can be modified based on a structural property (e.g., lattice constant) and/or composition of the material of epitaxial fin regions 110 that are formed in S/D openings 410 in subsequent processes. In some embodiments, sidewalls 122S of nanostructured layers 122 or sidewalls 108CS of bulk structure 108C can be modified from the substantially linear profiles shown in FIGS. 4A-4B to the curved profiles shown in FIGS. 5A-5B. As discussed above with reference to FIGS. 1B-1E, sidewalls 122S or 108CS are modified to reduce interfacial stress when epitaxial fin regions 110 with materials different from nanostructured layers 122 or bulk structure 108C are subsequently formed in S/D openings 410.

The process for modifying sidewalls 122S or 108CS can include performing a dry etching process or a wet etching process on the structure of FIG. 4A or 4B. The dry etching process can include introducing etchants 544 having a halogen-containing gas (e.g., HF, $F_2$, $NF_3$, $CF_4$, HCl, $Cl_2$, HBr, and/or HI) on the structure of FIG. 4A or 4B. The dry etching process can be carried out at a radio frequency power ranging from about 1 W to about 300 W, at a pressure of about 5 Torr to about 20 Torr, and at a temperature ranging from about 100° C. to about 600° C. The wet etching process can include introducing etchants 544 having Tetramethylammonium hydroxide (TMAH), potassium hydroxide (KOH) solution, HCl, HF, HBr, HI, or combinations thereof on the structure of FIG. 4A or 4B at a temperature ranging from about 20° C. to about 100° C.

In some embodiments, the process for modifying sidewalls 122S or 108CS can include performing an oxidation process followed by a wet etching process on the structure of FIG. 4A or 4B. The oxidation process can include exposing the structure of FIG. 4A or 4B to an oxidizing ambient that includes ozone (O3), hydrogen peroxide ($H_2O_2$), nitric acid ($HNO_3$) and water. Following the oxidation process, oxide layers (not shown) can be formed on exposed surfaces (e.g., sidewalls 121S, 122S, and 108S or sidewalls 108CS and 108S) of fin structure 108 of FIGS. 4A-4B. The oxide layers on sidewalls 122S or 108CS can be etched during the subsequent wet etching process. The wet etching process can include introducing etchants 544 having HF, $NH_4F$, or a mixture of ammonia hydroxide, hydrogen peroxide, and water on the structure of FIG. 4A or 4B at a temperature ranging from about 20° C. to about 100° C.

In some embodiments, sidewalls 122S or 108CS can be modified to curve towards nanostructured layers 122 (shown in FIG. 5A) or bulk structure 108C (shown in FIG. 5B) when the lattice constant of nanostructured layer 122 or bulk structure 108C is larger than that of subsequently formed epitaxial fin regions 110. To achieve such curvature direction, the one or more etchants used in the modifying process are selected such that nanostructured layers 122 has a higher etch selectivity than nanostructured layers 121 and fin base 108A or bulk structure 108C has a higher etch selectivity than fin base 108A. The etch selectivity of nanostructured layers 122 to nanostructured layers 121 and fin base 108A or the etch selectivity of bulk structures 108C to fin base 108A is greater than 10 (e.g., about 11, about 15, or about 20).

In some embodiments, sidewalls 122S can be modified to curve away from nanostructured layers 122 as shown in FIG. 1C when the lattice constant of nanostructured layer 122 is smaller than that of subsequently formed epitaxial fin regions 110. To achieve such curvature direction, the one or more etchants used in the modifying process are selected such that nanostructured layers 121 has a higher etch selectivity than nanostructured layers 122. The etch selectivity of nanostructured layers 121 to nanostructured layers 122 is greater than about 2 to about 10.

In some embodiments, sidewalls 121S can be etched to have curved profiles (not shown in FIG. 5A) similar to sidewalls 122S when epitaxial fin regions 110 with materials different from nanostructured layers 121 are subsequently formed in S/D openings 410. The etching process can be performed prior to, after, or substantially simultaneously with the etching of sidewalls 122S. The one or more etchants used in etching sidewalls 121S can have different etch selectivities for nanostructured layers 121-122 if sidewalls 121 are etched prior to or after sidewalls 122S and can have similar etch selectivities for nanostructured layers 121-122 if sidewalls 121S-122S are substantially simultaneously etched.

Figure 6A:
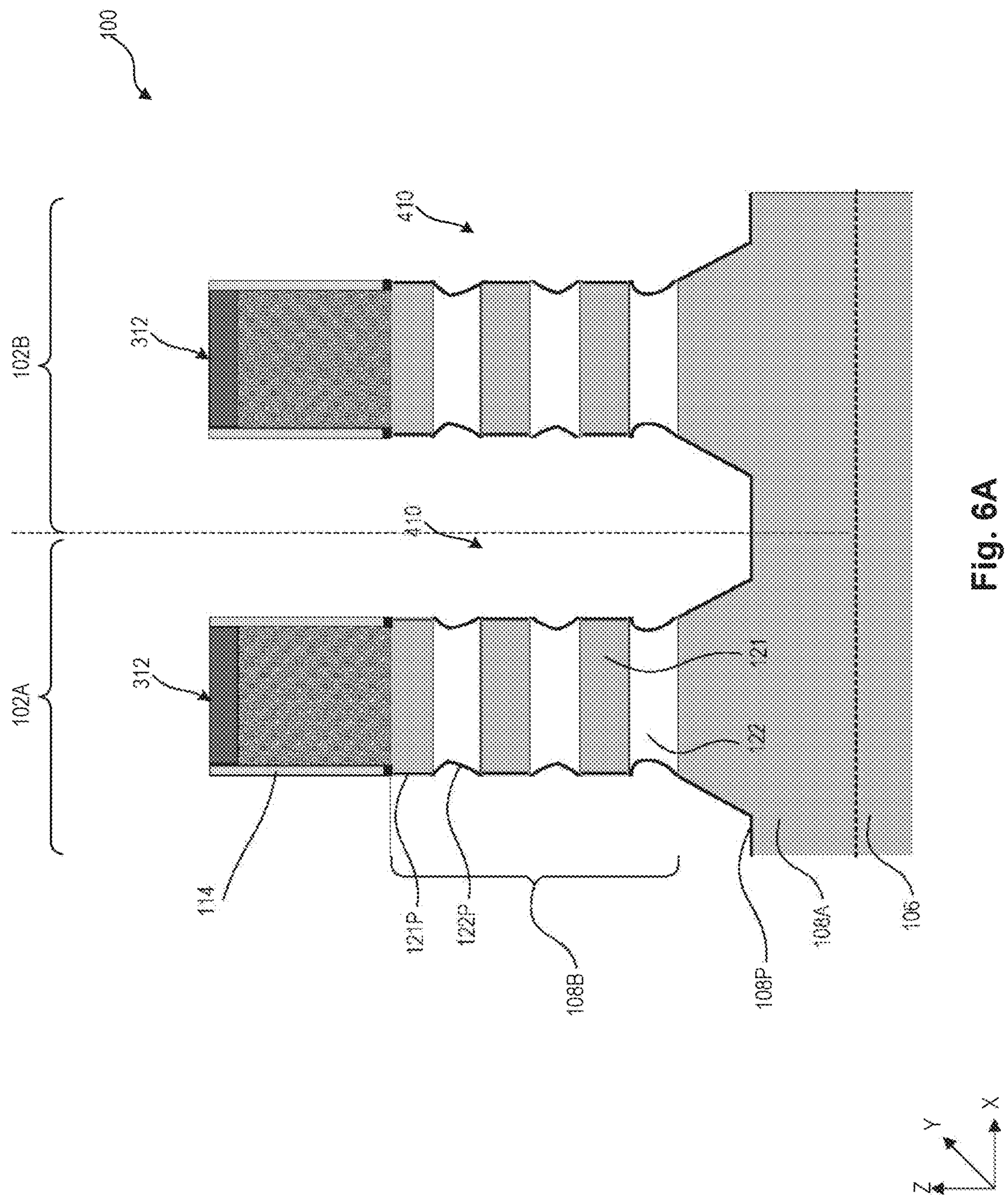
Figure 6B:
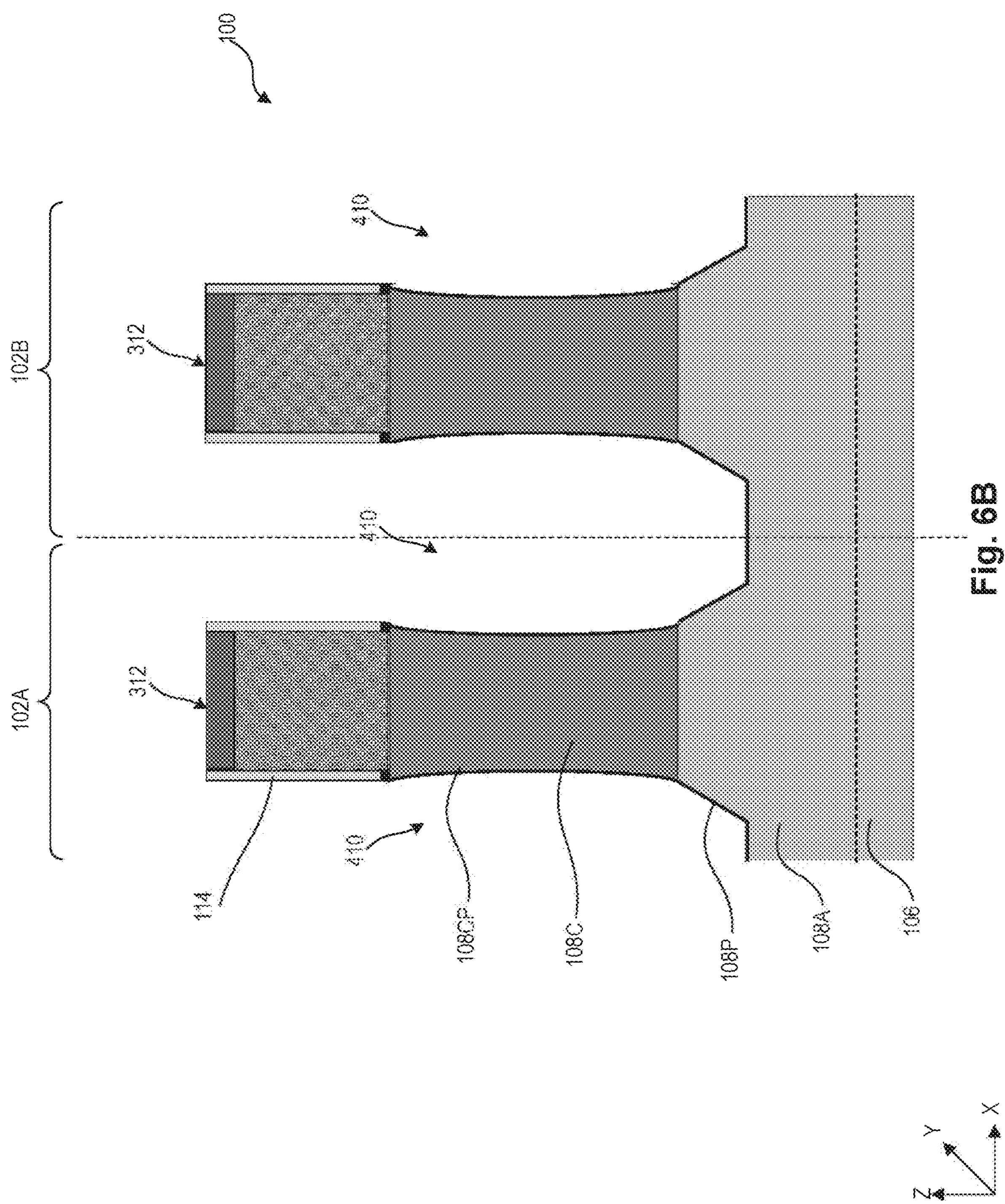

Referring to FIG. 2, in operation 220, passivation layers are formed on the modified sidewalls of the fin structure. For example, as shown in FIG. 6A, passivation layers 108P, 121P, and 122P can be deposited on respective sidewalls 108S, 121S, and 122S or as shown in FIG. 6B, passivation layers 108P and 108CP can be formed on respective sidewalls 108S and 108CS. In some embodiments, passivation layers 121P and 108P can be deposited on the oxide layers (not shown) if the oxidation process is performed in operation 215 or passivation layers 121P and 108P can include the oxide layers.

In some embodiments, the process for depositing passivation layers 108P, 121P, and 122P or for forming passivation layers 108P and 108CP can include reacting by-products 646 of the modifying process with the structure of FIG. 5A or 5B. In some embodiments, the process for depositing passivation layers 108P, 121P, and 122P or for depositing passivation layers 108P and 108CP can include introducing one or more passivation gases 646 on the structure of FIG. 5A or 5B. Passivation gases 646 can include carbon-containing passivation gases (e.g., fluoroform ($CHF_3$), octafluorocyclobutane ($C_4F_8$), or carbon tetrafluoride ($CF_4$)) or nitrogen-containing passivation gases (e.g., ammonia ($NH_3$), nitrous oxide ($N_2O$), or nitrogen ($N_2$)). The deposition rates and thickness of passivation layers 108P, 121P, and 122P can be similar to or different from each other. Similarly, the deposition rates and thickness of passivation layers 108P and 108CP can be similar to or different from each other. Passivation layers 108P, 121P, and 122P can prevent atoms from migrating out of sidewalls 108S, 121S, and 122S and contaminating each other. Similarly, passivation layers 108P and 108CP can prevent atoms from migrating out of sidewalls 108S and 108CS and contaminating each other. The atomic migration out of the sidewalls can occur during the ramping of epitaxial deposition temperature for the subsequent formation of epitaxial fin regions 110.

Figure 7A:
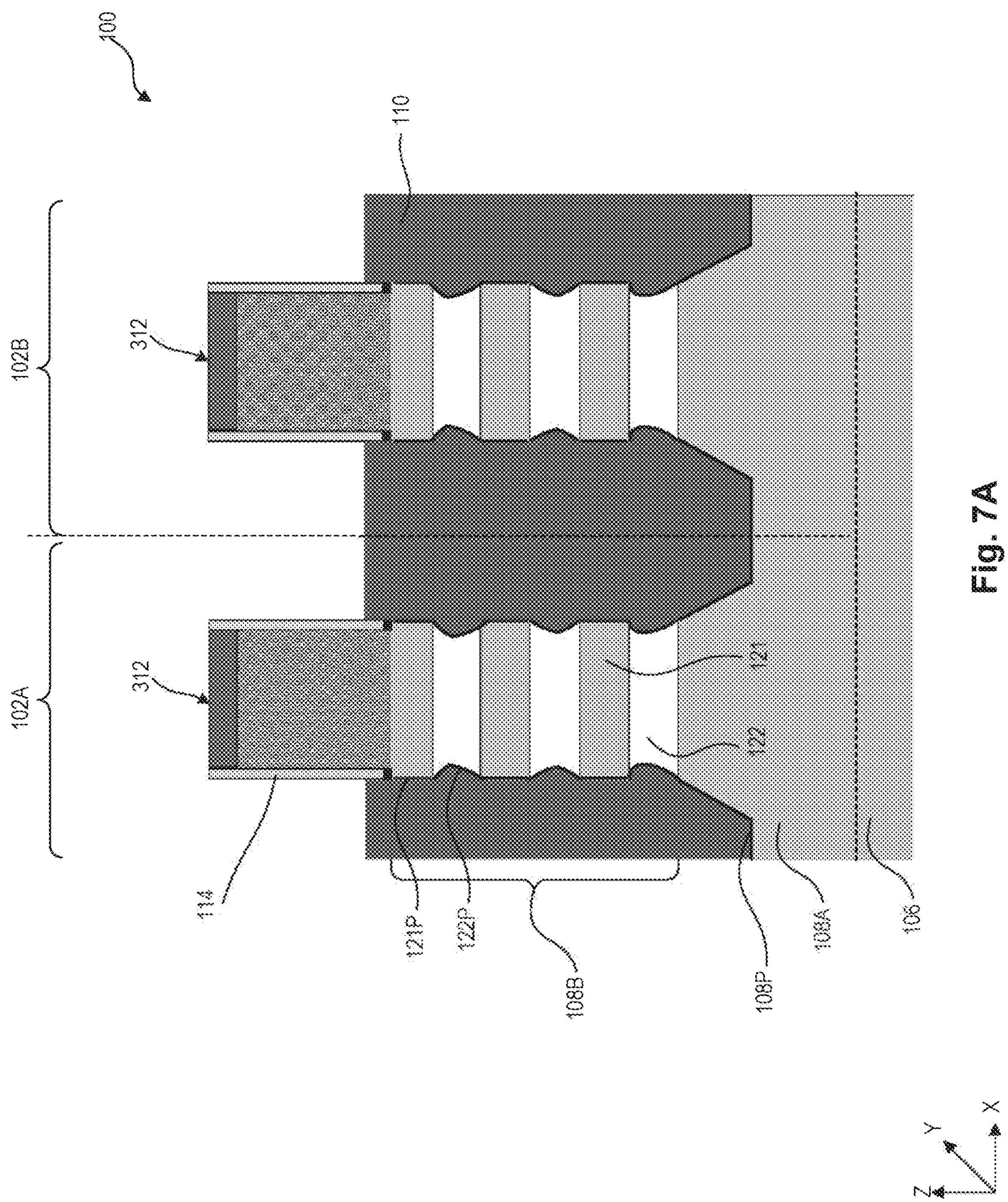
Figure 7B:
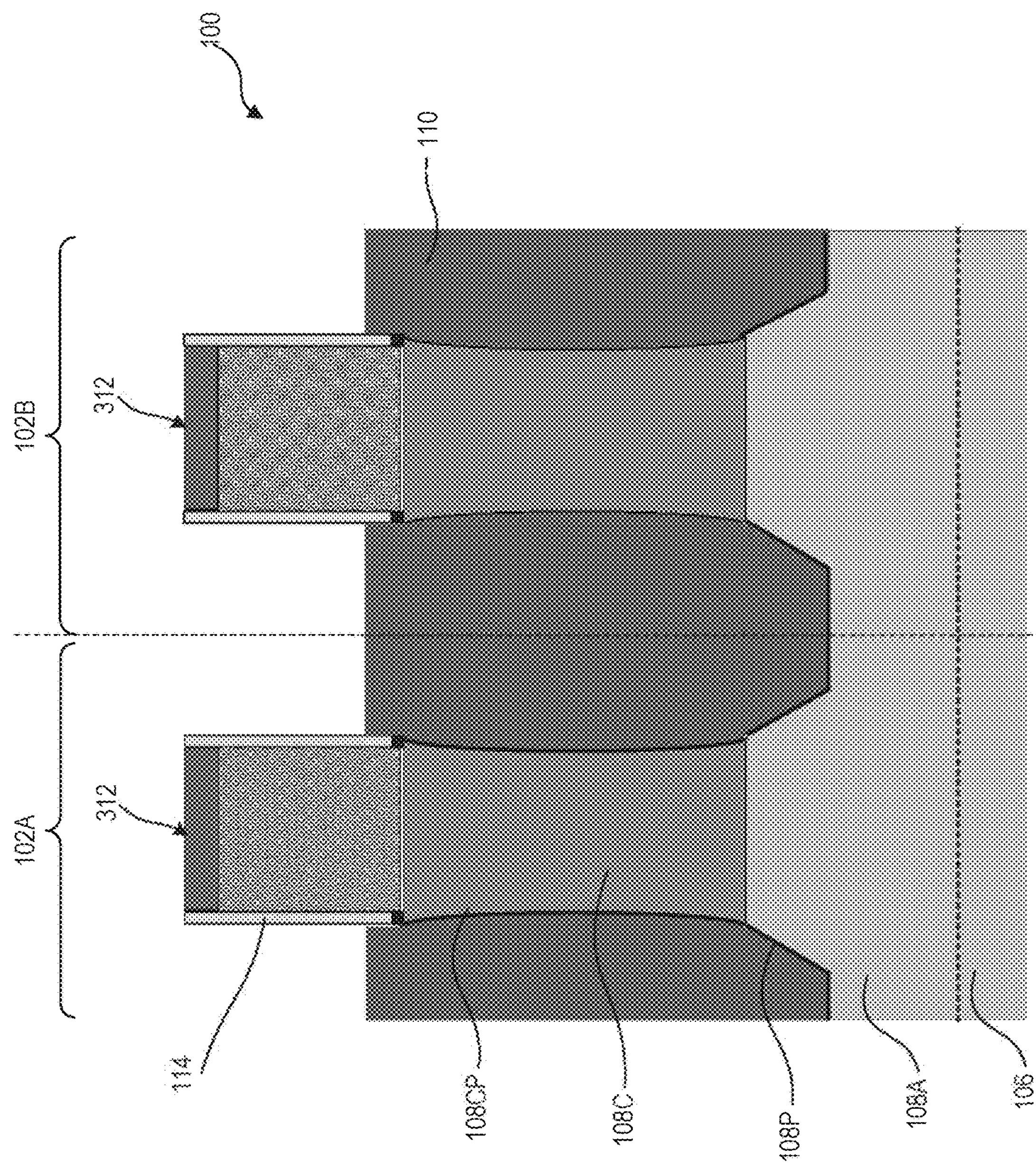

Referring to FIG. 2, in operation 225, epitaxial fin regions are formed within the S/D openings. For example, as shown in FIGS. 7A-7B, epitaxial fin regions 110 can be grown within S/D openings 410. In some embodiments, epitaxial fin regions 110 can be grown by a chemical vapor deposition (CVD) process, a molecular beam epitaxy (MBE) process, or any suitable epitaxial process. In some embodiments, epitaxial fin regions 110 can be grown by an epitaxial deposition/partial etch process, which repeats the epitaxial deposition/partial etch process at least once.

Figure 8A:
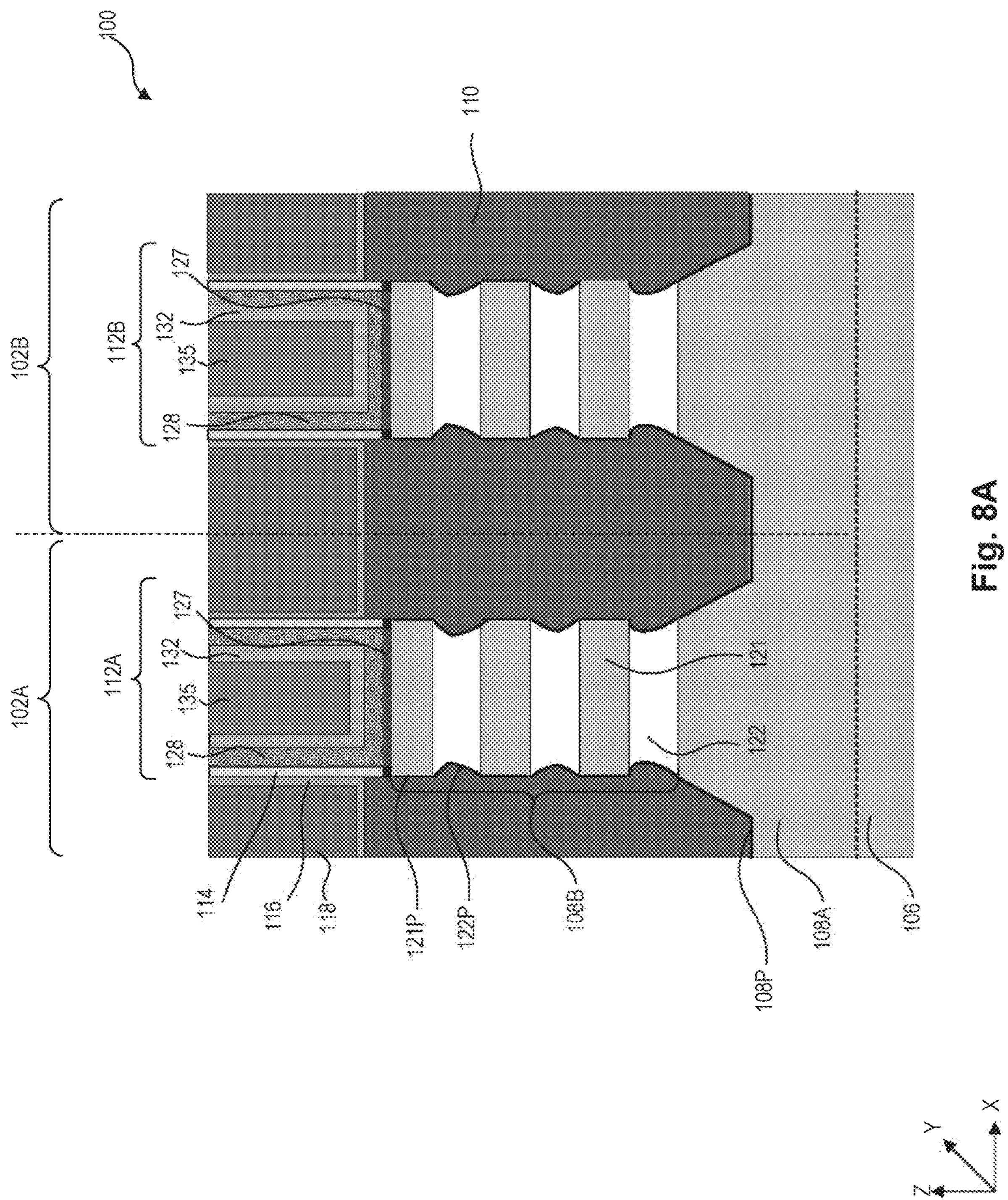
Figure 8B:
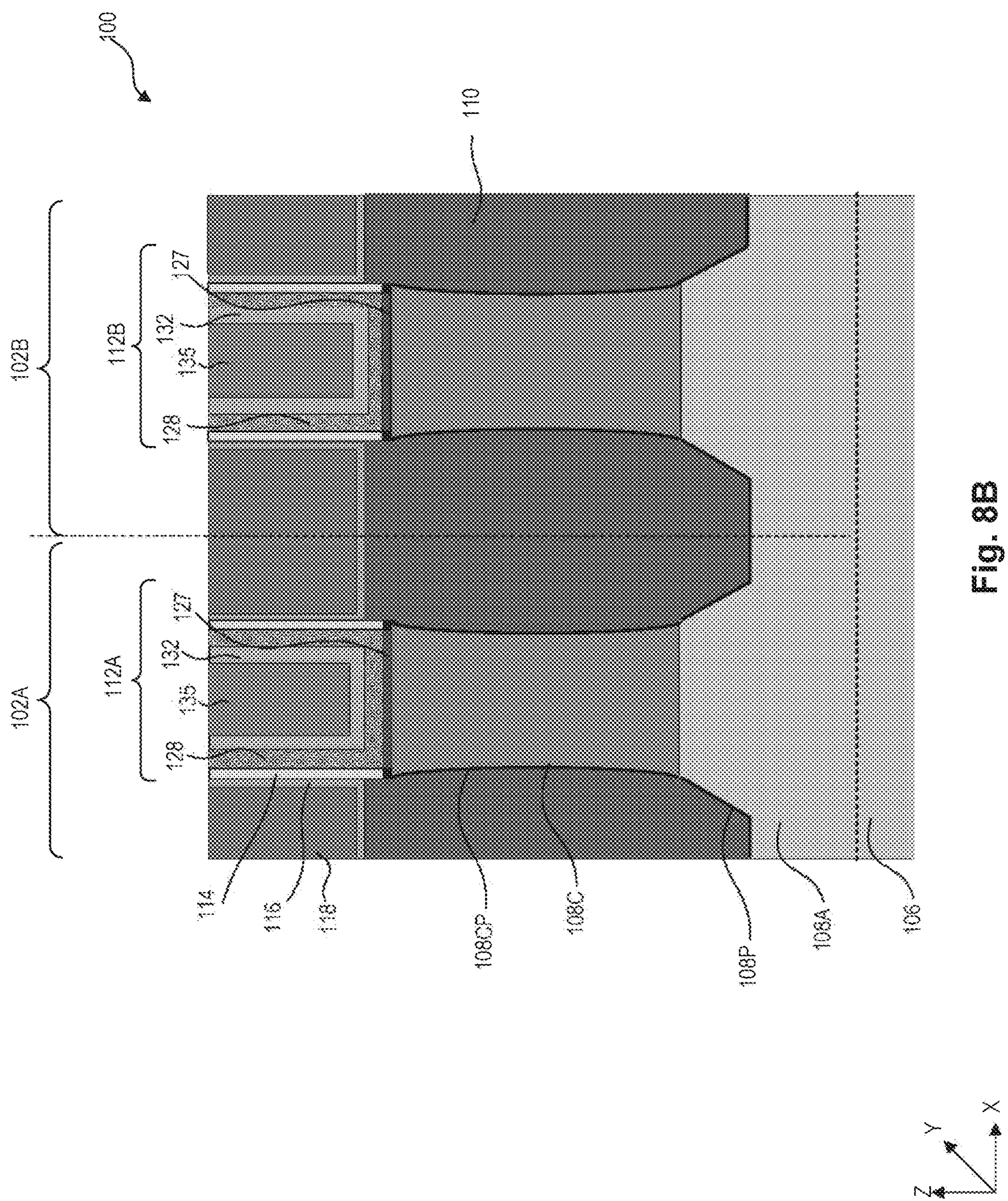

During the growth of epitaxial fin regions 110, passivation layers 108P, 121P, and 122P or passivation layers 108P and 108CP can thin down as shown in FIGS. 7A-7B. The thickness of passivation layers 108P, 121P, and 122P or passivation layers 108P and 108CP remaining on the structure of FIG. 7A or 7B after the formation of epitaxial fin regions 110 can be less than the thickness of passivation layers 108P, 121P, and 122P or passivation layers 108P and 108CP on the structure of FIG. 6A or 6B prior to the formation of epitaxial fin regions 110. Following the formation of epitaxial fin regions 110, ESL 116 and ILD 118 can be formed as shown in FIGS. 8A-8B.

Referring to FIG. 2, in operation 230, the polysilicon gate structures are replaced by metal gate structures. For example, as shown in FIGS. 8A-8B, polysilicon gate structures 312 can be replaced by metal gate structures 112. The process for replacing polysilicon gate structures 312 with metal gate structures 112 can include sequential operations of (i) etching polysilicon gate structures 312 to form gate openings (not shown), (ii) depositing IO layers 127 within the gate openings, (iii) deposing a material layer for HK gate dielectric layers 128 on IO layers 127, (iii) depositing a material layer for WFM layers 132 on the material layer for HK gate dielectric layers 128, (iv) depositing a material layer for gate metal fill layers 135 on the material layer for WFM layers 132, and (v) chemical mechanical polishing the material layers for HK gate dielectric layers 128, WFM layers 132, and gate metal fill layers 135 to form the structure of FIG. 8A or 8B. In some embodiments, the process for replacing polysilicon gate structures 312 with metal gate structures 112 can include etching nanostructures layers 122 between the operations of etching polysilicon gate structures 312 to form gate openings and depositing IO layers 127 within the gate openings to form GAA structures as described with reference to FIG. 1D.

Figure 9:
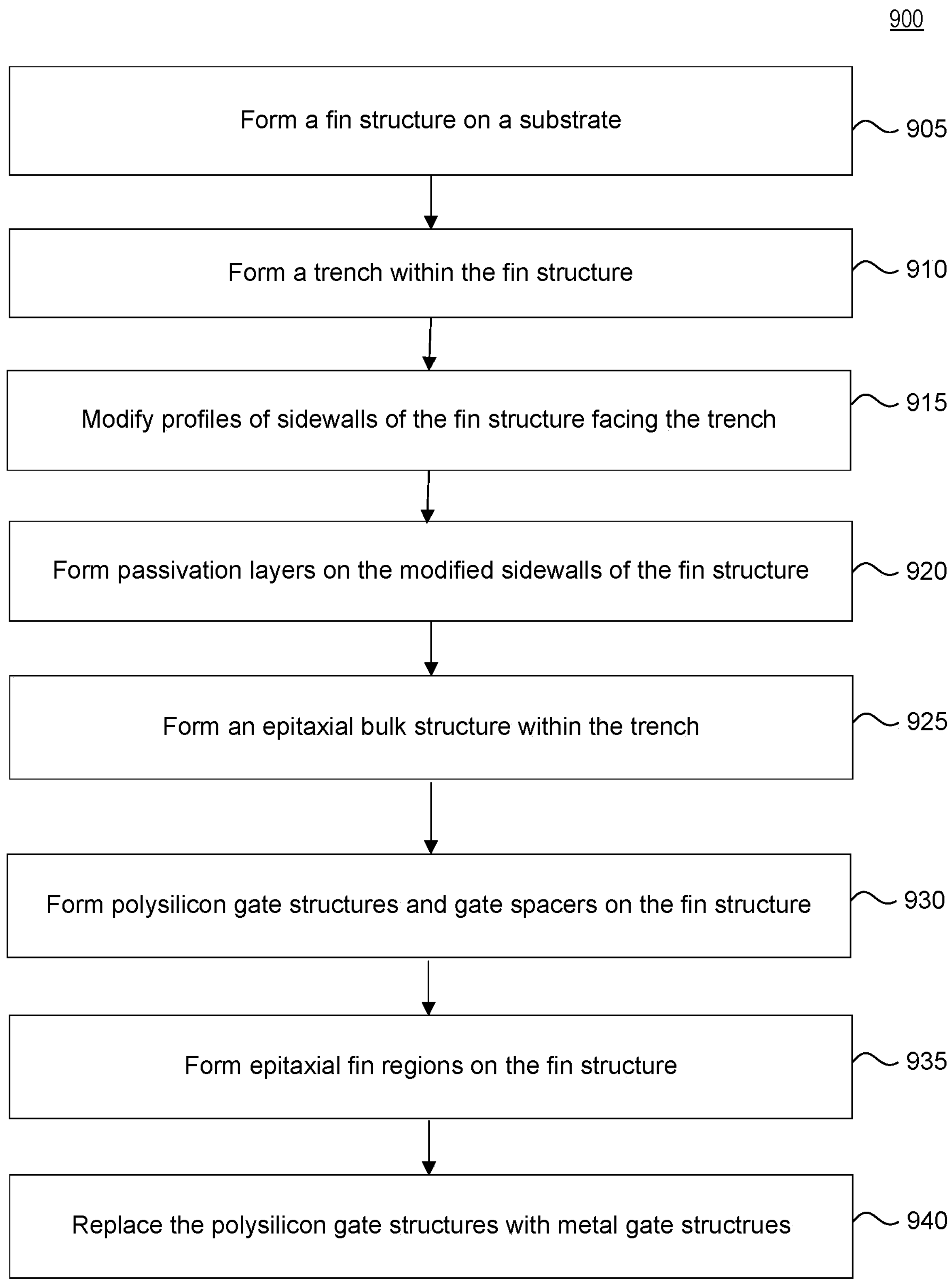
FIG. 9 is a flow diagram of a method for fabricating a semiconductor device with different epitaxial interface profiles, in accordance with some embodiments.

FIG. 9 is a flow diagram of an example method 900 for fabricating semiconductor device 100*, according to some embodiments. For illustrative purposes, the operations illustrated in FIG. 9 will be described with reference to the example fabrication process for fabricating semiconductor device 100* as illustrated in FIGS. 10A-17B. FIGS. 10A-17A are cross-sectional views along lines A-A of FIG. 1G at various stages of fabricating semiconductor device 100* with the cross-sectional view of FIG. 1H, according to some embodiments. FIGS. 10B-17B are cross-sectional views along lines A-A of FIG. 1G at various stages of fabricating semiconductor device 100* with the cross-sectional view of FIG. 1J, according to some embodiments. Operations can be performed in a different order or not performed depending on specific applications. It should be noted that method 900 may not produce a complete semiconductor device 100*. Accordingly, it is understood that additional processes can be provided before, during, and after method 900, and that some other processes may only be briefly described herein. Elements in FIGS. 10A-17B with the same annotations as elements in FIGS. 1A-1J are described above.

Figure 10A:
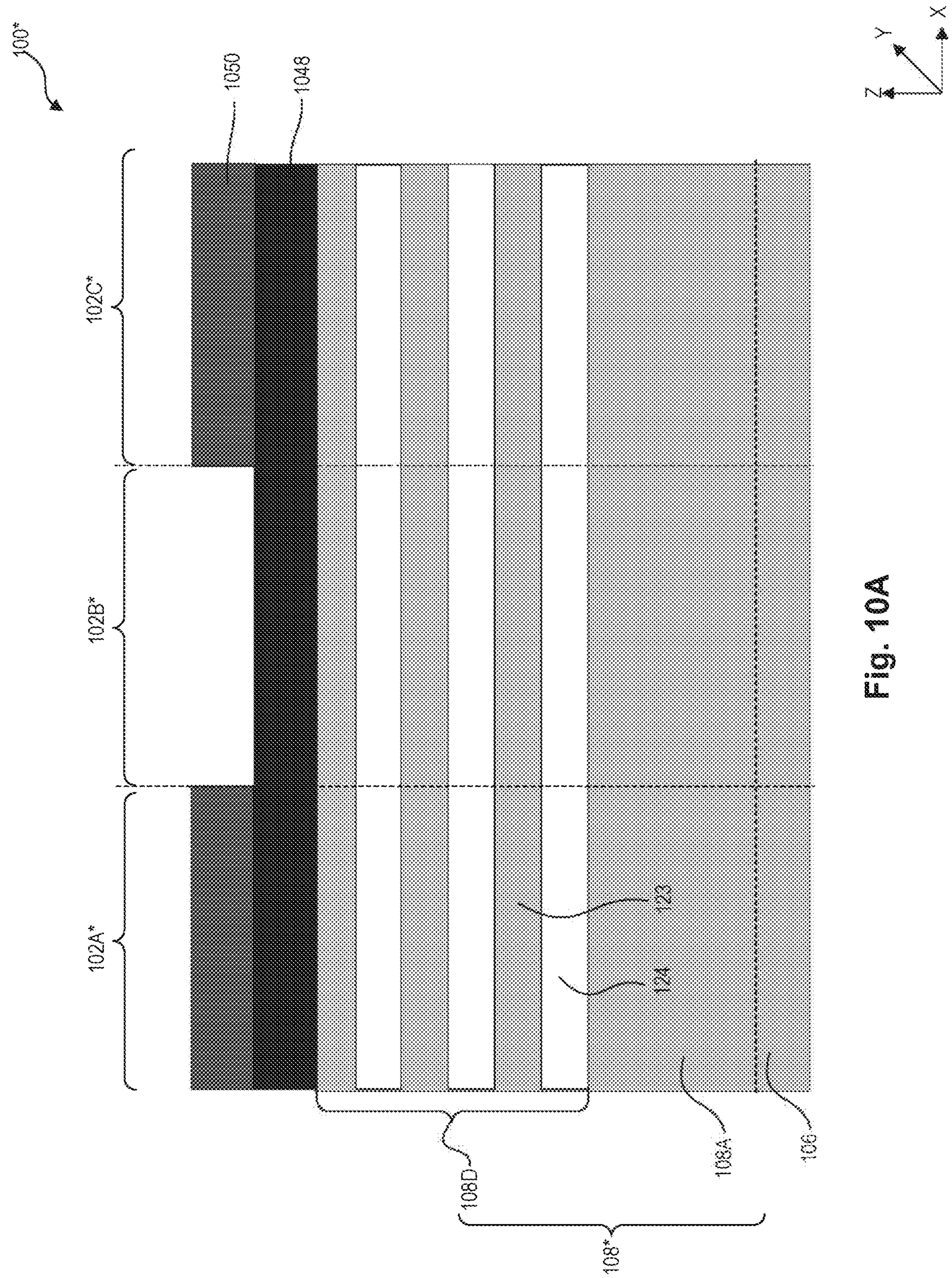
FIGS. 10A-17B illustrate cross-sectional views of a semiconductor device with different epitaxial interface profiles at various stages of its fabrication process, in accordance with some embodiments.
Figure 10B:
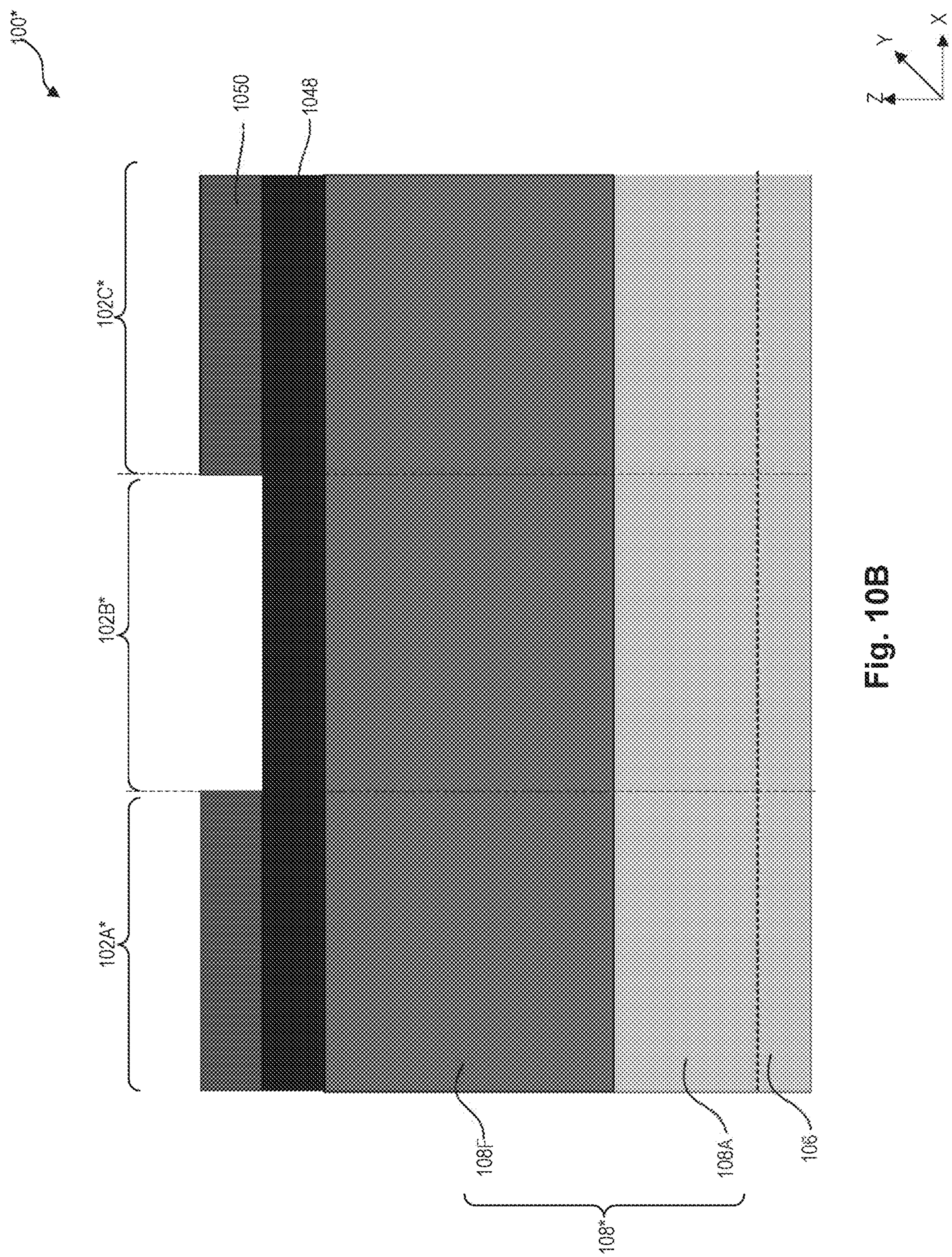

In operation 905, a fin structure is formed on a substrate. For example, as shown in FIGS. 10A-10B, fin structure 108* can be formed on substrate 106. The process for forming fin structure 108* can include sequential operations of (i) epitaxially growing a stacked layer (not shown) or a bulk layer (not shown) on substrate 106, and (ii) etching the stacked layer or the bulk layer through patterned hard mask layers (not shown) formed on the stacked layer or the bulk layer to form superlattice structure 108D on fin base 108A (shown in FIG. 10A) or bulk structure 108F on fin base 108A (shown in FIG. 10B). Superlattice structure 108B can include nanostructured layers 123-124 arranged in an alternating configuration. The etching of the stacked layer or the bulk layer can include a dry etch, a wet etch process, or a combination thereof.

Figure 11A:
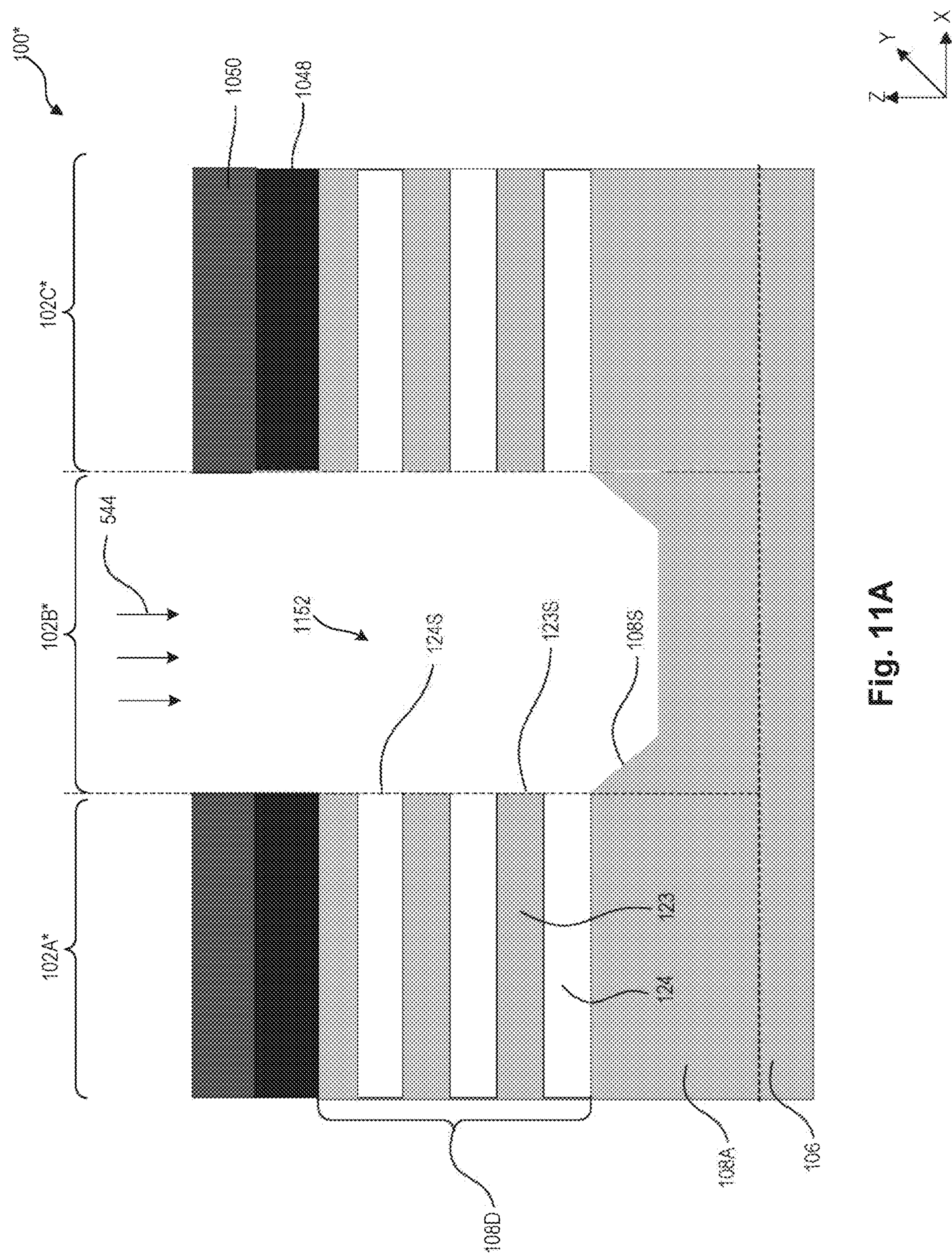
Figure 11B:
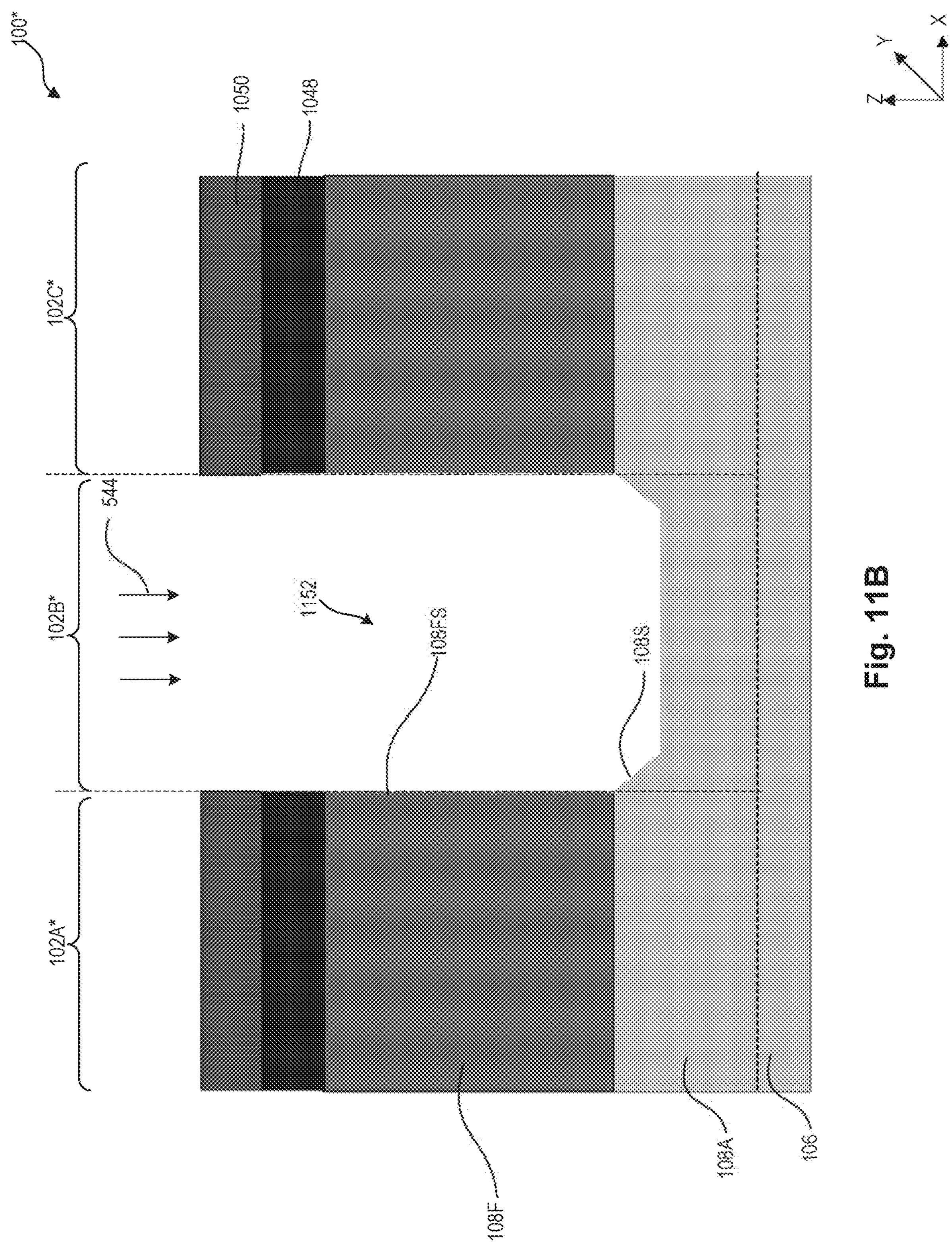

Referring to FIG. 9, in operation 910, a trench is formed within the fin structure. For example, as shown in FIGS. 11A-11B, a trench 1152 can be formed with fin structure 108*. First portion of trench 1152 can be formed within fin base 108A (shown in FIGS. 11A-11B) and second portion of trench 1152 can be formed within superlattice structure 108D (shown in FIG. 11A) or within bulk structure 108F (shown in FIG. 11B). The process for forming trench 1152 can be include sequential operations of (i) deposit a hard mask layer 1048 shown in FIGS. 10A-10B, (ii) patterning a photoresist layer 1050 on hard mask layer 1048 shown in FIGS. 10A-10B, (iii) etching portions of hard mask layer 1048, portions of superlattice structure 108D (shown in FIG. 11A) or bulk structure 108F (shown in FIG. 11B), and portions of fin base 108A that are not underlying patterned photoresist layer 1050. The etching process can be similar to that used in the process for forming S/D openings 410, as described with reference to FIGS. 4A-4B. The one or more etchants for the etching process are selected such that the etch selectivity of fin base 108A to superlattice structures 108D or the etch selectivity of fin base 108A to bulk structures 108F is less than about 2 (e.g., about 1.5, about 1, or about 0.5).

Figure 12A:
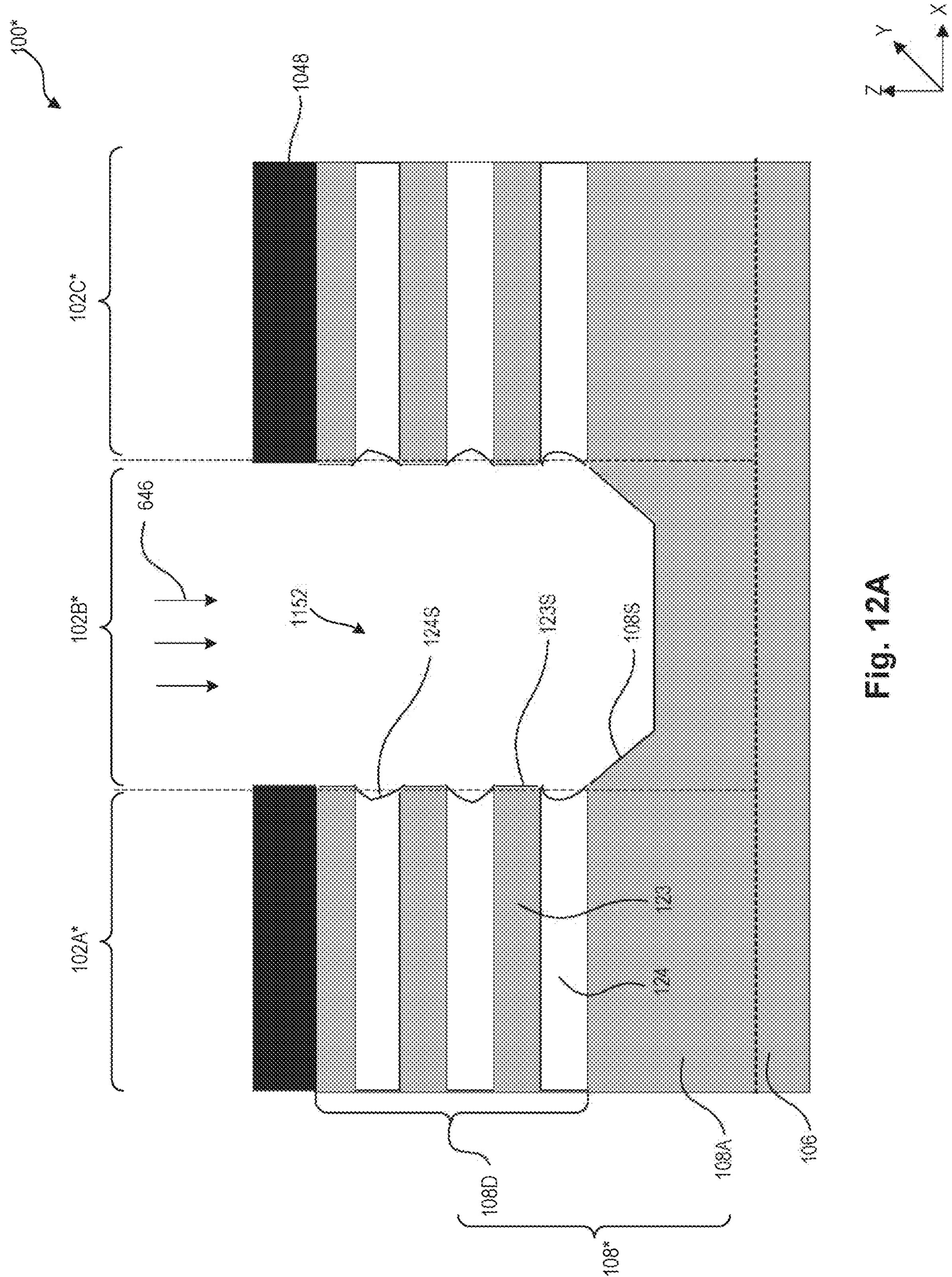
Figure 12B:
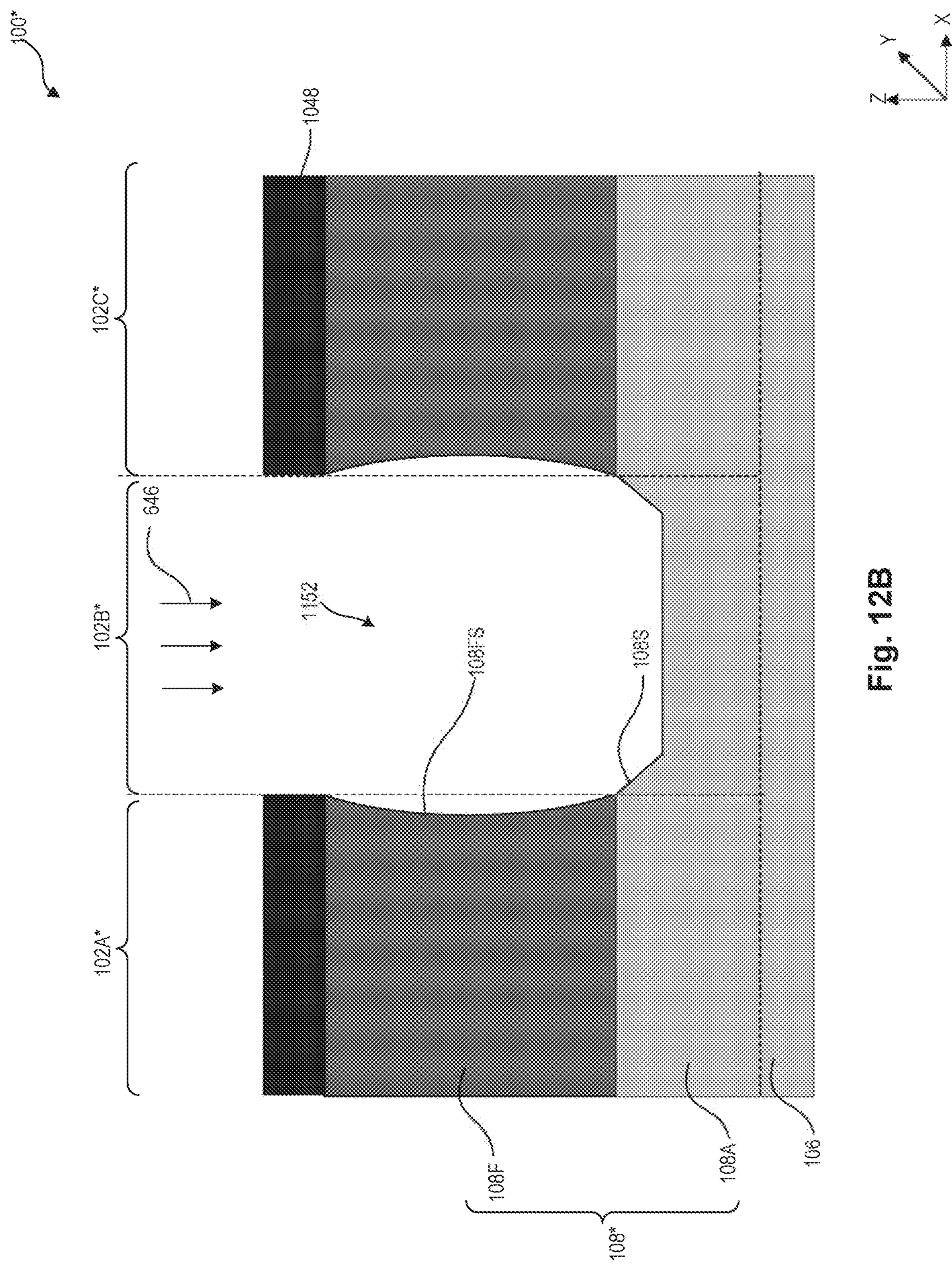

Referring to FIG. 9, in operation 915, profiles of sidewall the fin structure that are facing the trench are modified. For example, as shown in FIGS. 12A-12B, sidewall profiles of fin structure 108* that are facing trench 1152 can be modified based on a structural property (e.g., lattice constant)

and/or composition of the material of epitaxial bulk structure 108C that is formed in trench 1152 in subsequent processes. In some embodiments, sidewalls 124S of nanostructured layers 124 or sidewalls 108FS of bulk structure 108F can be modified from the substantially linear profiles shown in FIGS. 11A-11B to the curved profiles shown in FIGS. 12A-12B.

The process for modifying sidewalls 124S or 108FS can include performing a dry etching process, a wet etching process, or an oxidation process followed by a wet etching process on the structure of FIG. 11A or 11B. The etching and oxidation processes can be similar to that used in the process for modifying sidewalls 122S or 108CS, as described with reference to FIGS. 4A-5B. The dry or wet etching processes can include introducing etchants 544 on the structure of FIG. 11A or 11B. The discussion of etch selectivity of nanostructured layers 121-122 or bulk structure 108C with respect to fin base 108A of FIGS. 5A-5B applies to nanostructured layers 123-124 or bulk structure 108F, respectively. The oxidation process can include exposing the structure of FIG. 11A or 11B to the oxidizing ambient of the oxidation process. Following the oxidation process, oxide layers (not shown) can be formed on exposed surfaces (e.g., sidewalls 123S, 124S, and 108S or sidewalls 108CS and 108S) of fin structure 108* of FIGS. 11A-11B. The oxide layers on sidewalls 124S or 108FS can be etched during the subsequent wet etching process.

In some embodiments, sidewalls 124S can be modified to curve away (not shown) from nanostructured layers 124 when the lattice constant of nanostructured layer 124 is smaller than that of subsequently formed epitaxial bulk structure 108C. To achieve such curvature direction, the one or more etchants used in the modifying process are selected such that nanostructured layers 123 has a higher etch selectivity than nanostructured layers 124. The etch selectivity of nanostructured layers 121 to nanostructured layers 122 is greater than about 2 to about 10.

In some embodiments, sidewalls 123S can be etched to have curved profiles (not shown) similar to sidewalls 124S when epitaxial bulk structure 108C with materials different from nanostructured layers 123 are subsequently formed in trench 1152. The etching process can be performed prior to, after, or substantially simultaneously with the etching of sidewalls 124S. The one or more etchants used in etching sidewalls 123S can have different etch selectivities for nanostructured layers 123-124 if sidewalls 123 are etched prior to or after sidewalls 124S and can have similar etch selectivities for nanostructured layers 123-124 if sidewalls 123S-124S are substantially simultaneously etched.

Figure 13A:
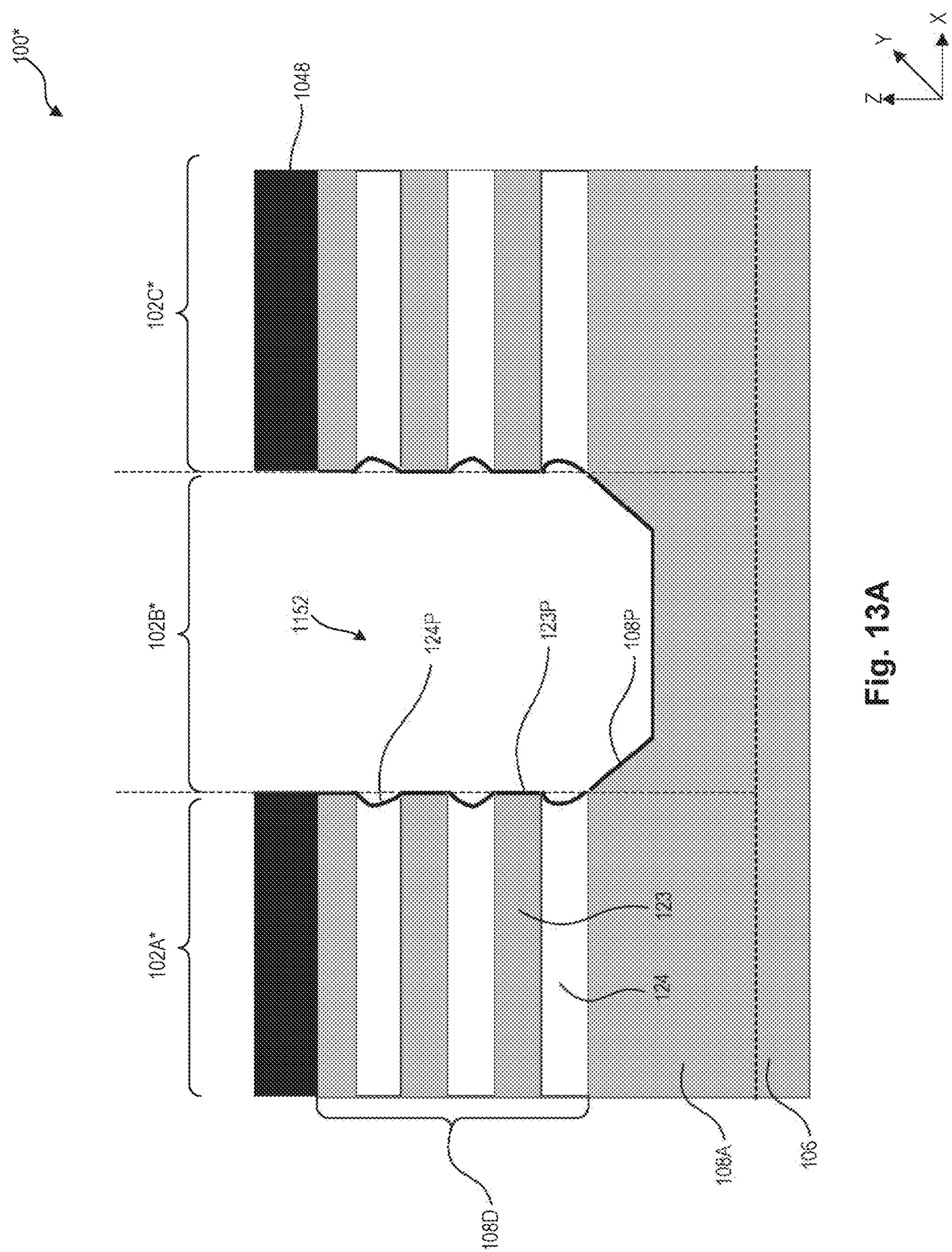
Figure 13B:
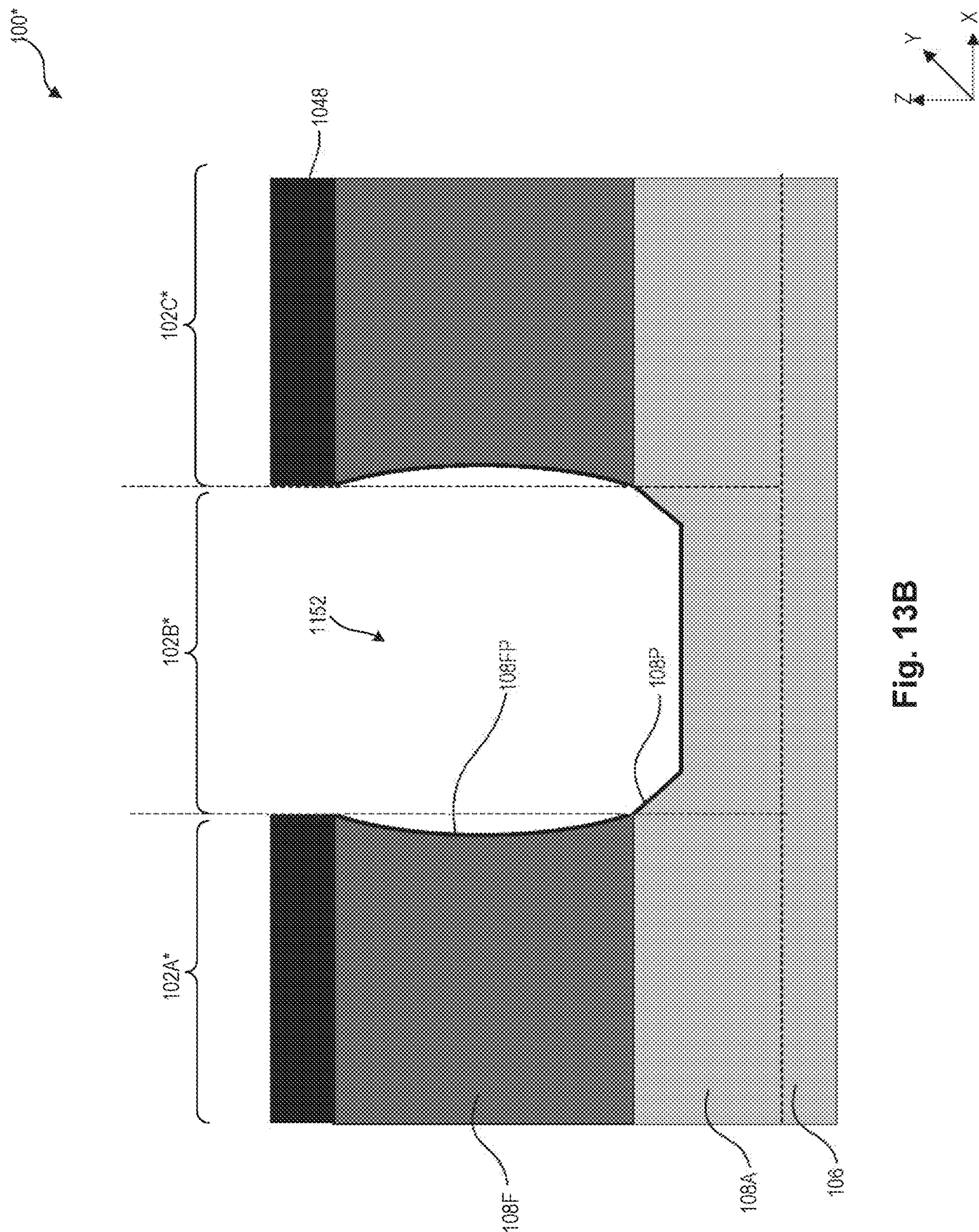

Referring to FIG. 9, in operation 920, passivation layers are formed on the modified sidewalls of the fin structure. For example, as shown in FIG. 13A, passivation layers 108P, 123P, and 124P can be deposited on respective sidewalls 108S, 123S, and 124S or as shown in FIG. 13B, passivation layers 108P and 108FP can be formed on respective sidewalls 108S and 108FS. In some embodiments, passivation layers 123P and 108P can be deposited on the oxide layers (not shown) if the oxidation process is performed in operation 915 or passivation layers 123P and 108P can include the oxide layers.

In some embodiments, the process for depositing passivation layers 108P, 123P, and 124P or for forming passivation layers 108P and 108FP can include reacting by-products 646 of the modifying process with the structure of FIG. 12A or 12B. In some embodiments, the process for depositing passivation layers 108P, 123P, and 124P or for depositing passivation layers 108P and 108FP can include introducing one or more passivation gases 646 on the structure of FIG. 12A or 12B. The deposition rates and thickness of passivation layers 108P, 123P, and 124P can be similar to or different from each other. Similarly, the deposition rates and thickness of passivation layers 108P and 108FP can be similar to or different from each other.

Figure 14A:
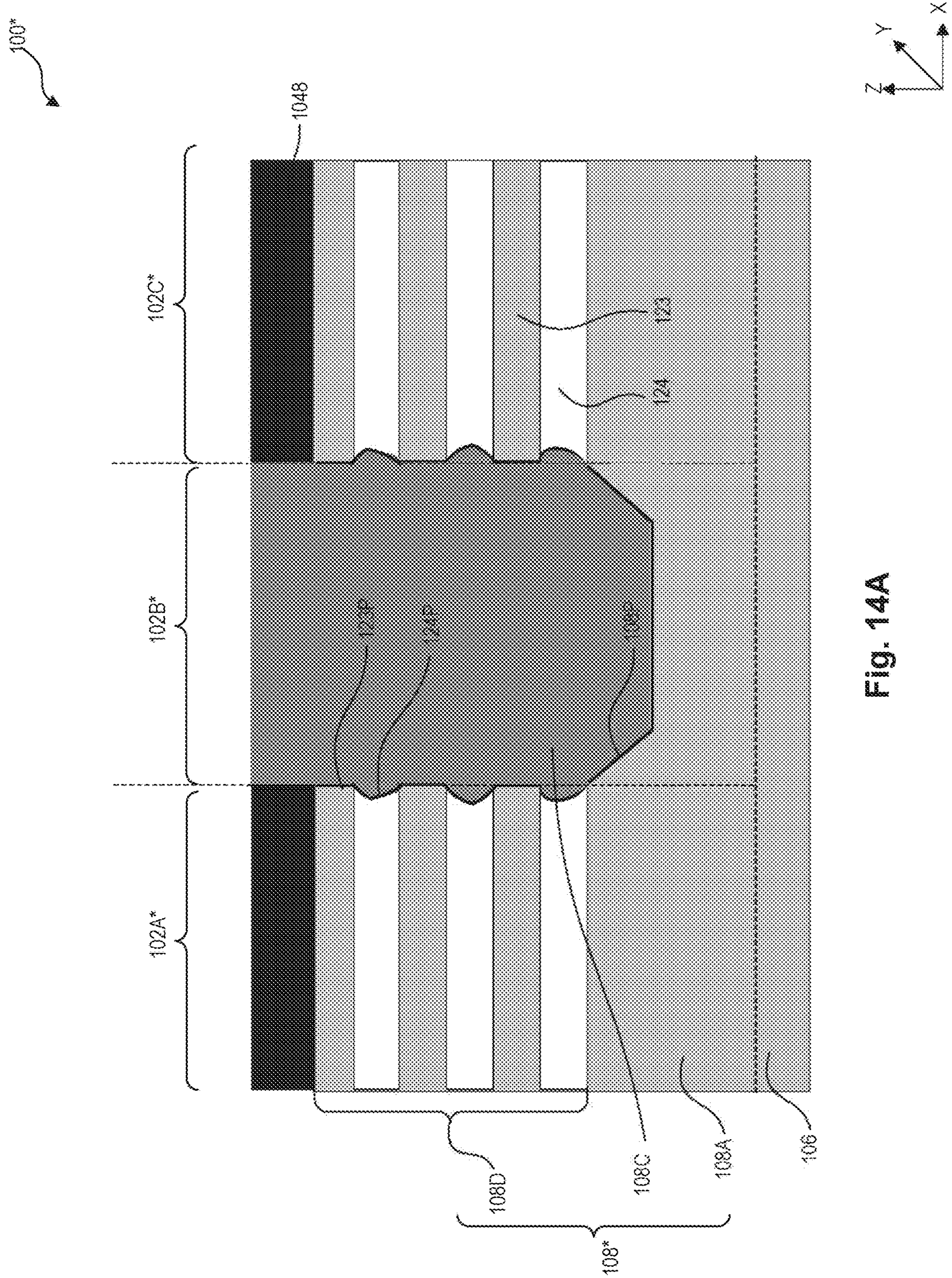
Figure 14B:
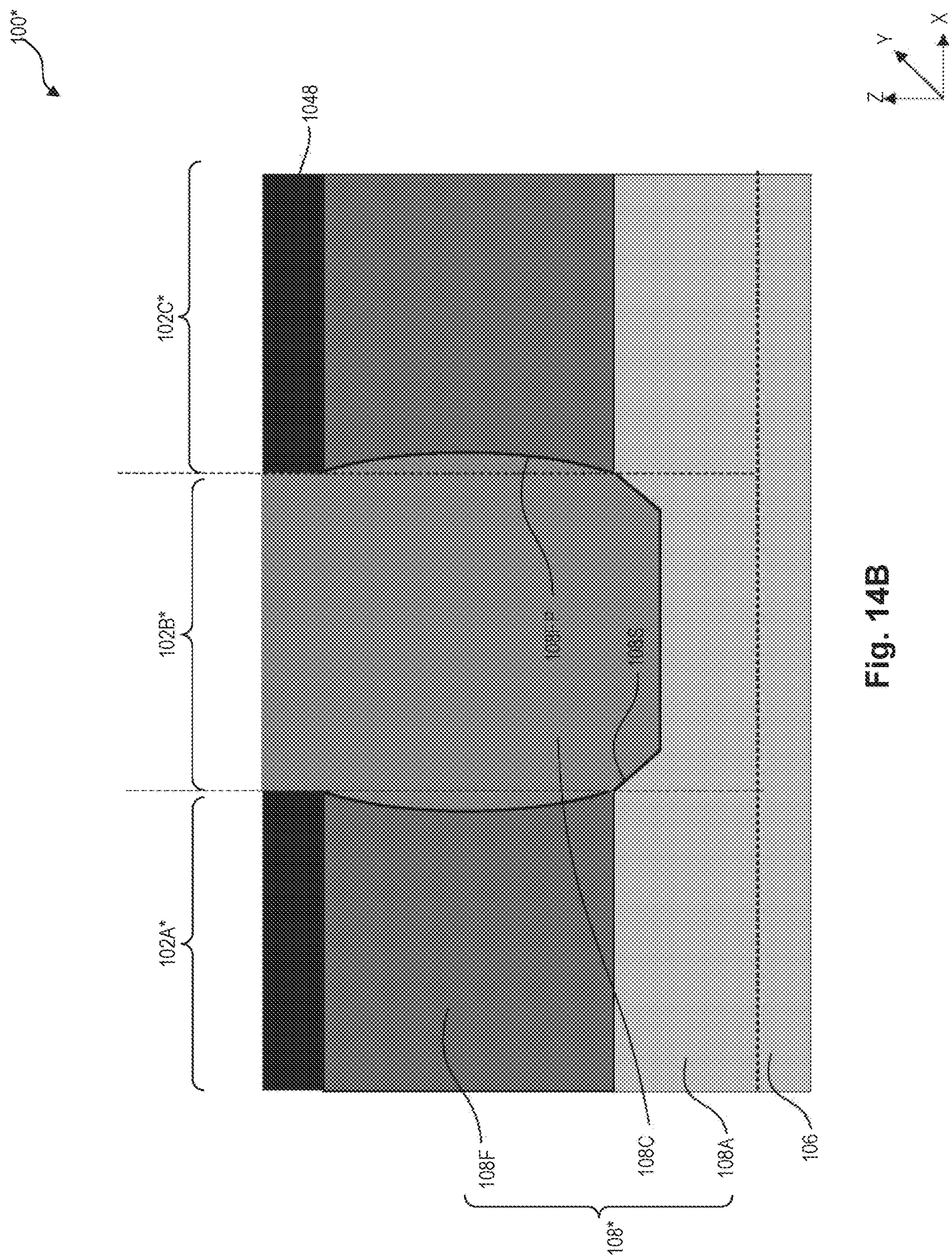
Figure 15A:
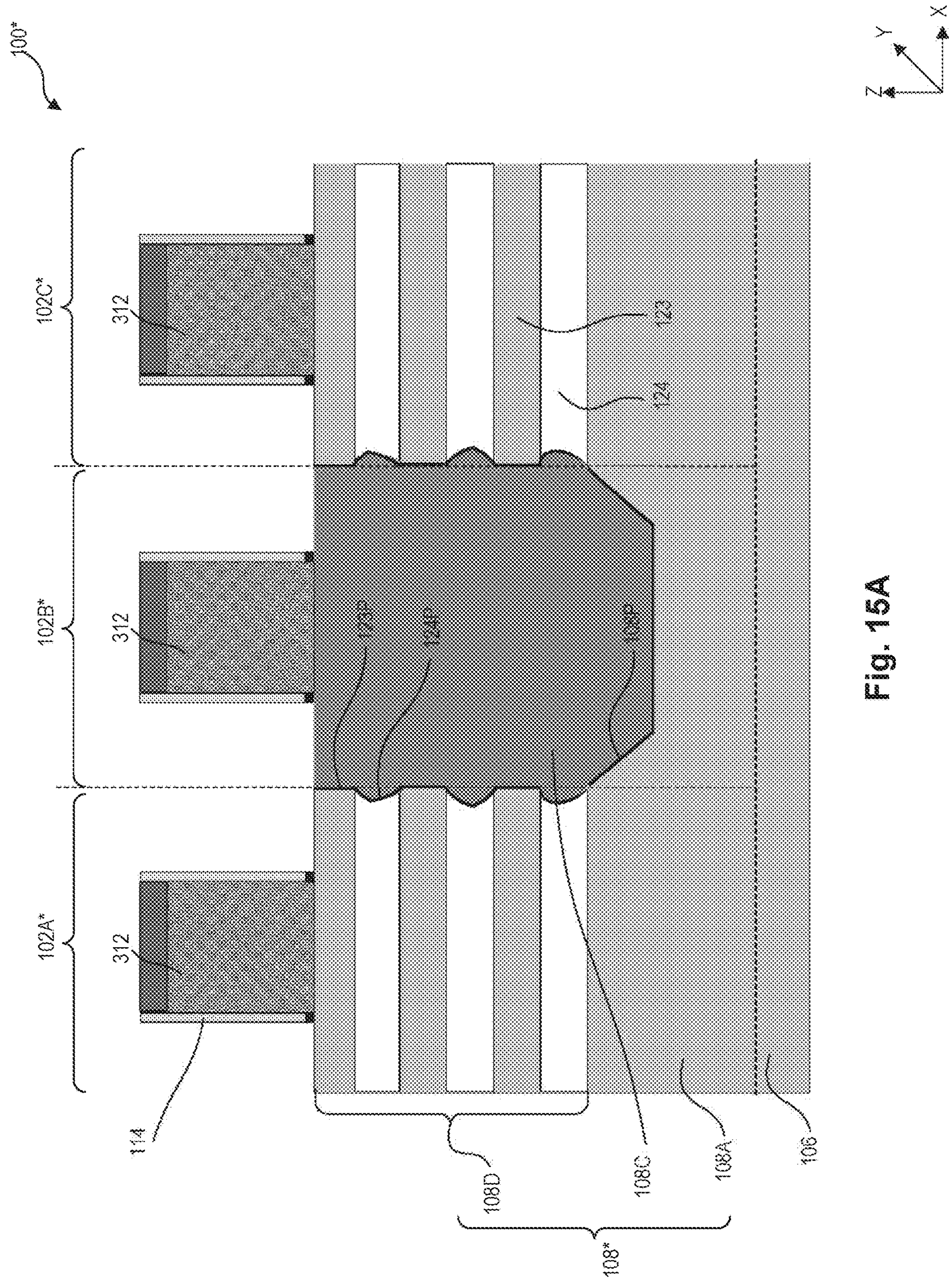
Figure 15B:
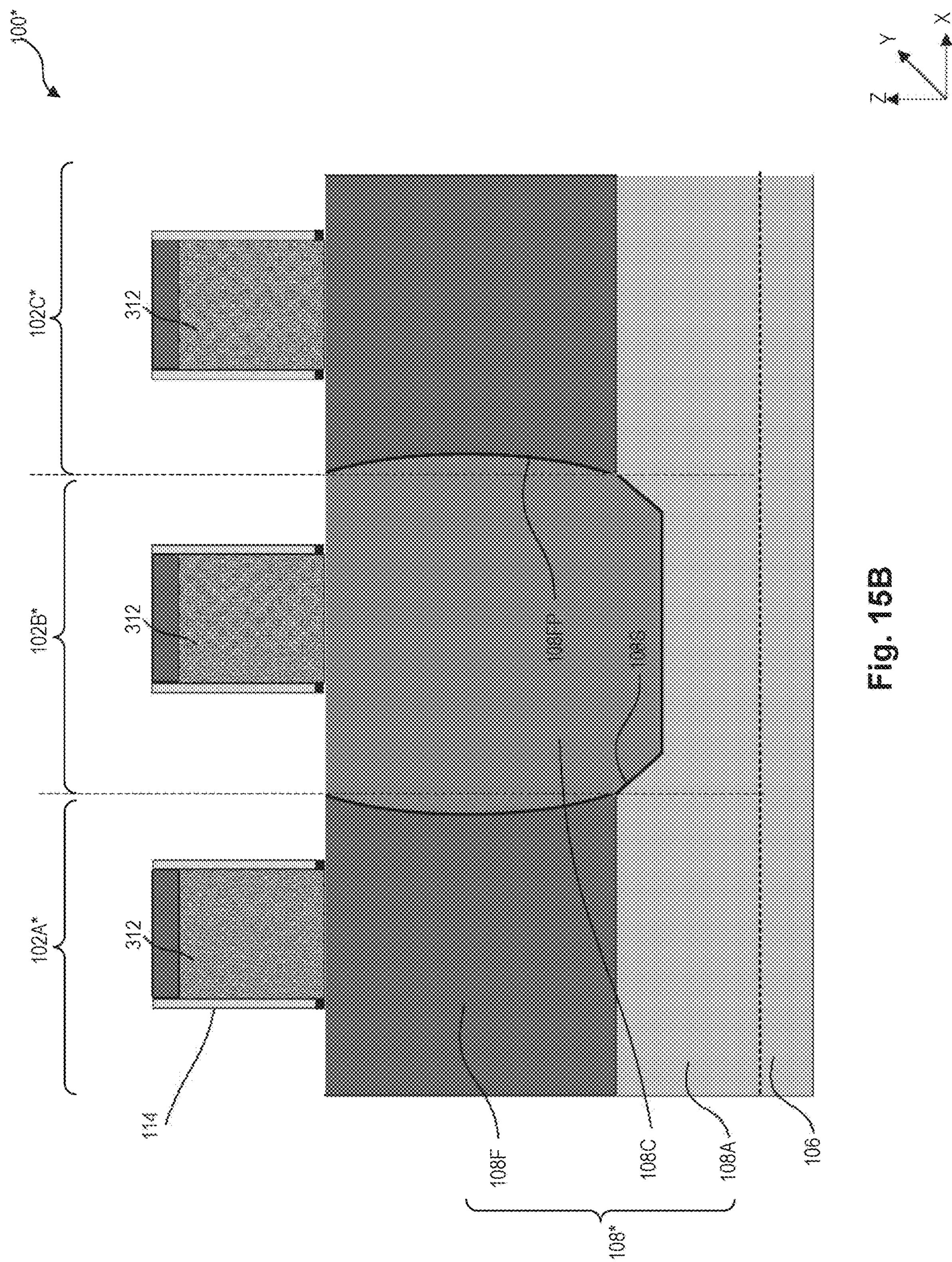

Referring to FIG. 9, in operation 925, an epitaxial bulk structure is formed within the trench. For example, as shown in FIGS. 14A-14B, epitaxial bulk structure 108C can be grown within trench 1152 using any suitable epitaxial process. Fin structure 108* thus includes superlattice structures 108D and epitaxial bulk structure 108C disposed on fin base 108A as shown in FIG. 14A or epitaxial bulk structures 108C and 108F disposed on fin base 108A as shown in FIG. 14B. Following the formation of epitaxial bulk structure 108C, a chemical mechanical polishing can be performed on the structure of FIG. 14A or 14B to remove hard mask layer 1048 and coplanarize top surfaces of epitaxial bulk structure 108C and fin structure 108* as shown in FIGS. 15A-15B. In some embodiments, hard mask layer 1048 can be removed by etching after the formation of passivation layers in operation 920 and prior to the formation of epitaxial bulk structure 108C.

During the growth of epitaxial bulk structure 108C, passivation layers 108P, 123P, and 124P or passivation layers 108P and 108FP can thin down as shown in FIGS. 14A-14B. The thickness of passivation layers 108P, 123P, and 124P or passivation layers 108P and 108FP remaining on the structure of FIG. 14A or 14B after the formation of epitaxial bulk structure 108C can be less than the thickness of passivation layers 108P, 123P, and 124P or passivation layers 108P and 108FP on the structure of FIG. 13A or 13B prior to the formation of epitaxial bulk structure 108C.

Referring to FIG. 9, in operation 930, polysilicon gate structures and gate spacers are formed on the fin structure. For example, as shown in FIGS. 15A-15B, polysilicon gate structures 312 with polysilicon layers 340 and hard mask layers 342 and gate spacers 114 on sidewalls of polysilicon gate structures 312 can be formed on fin structure 108*.

Figure 16A:
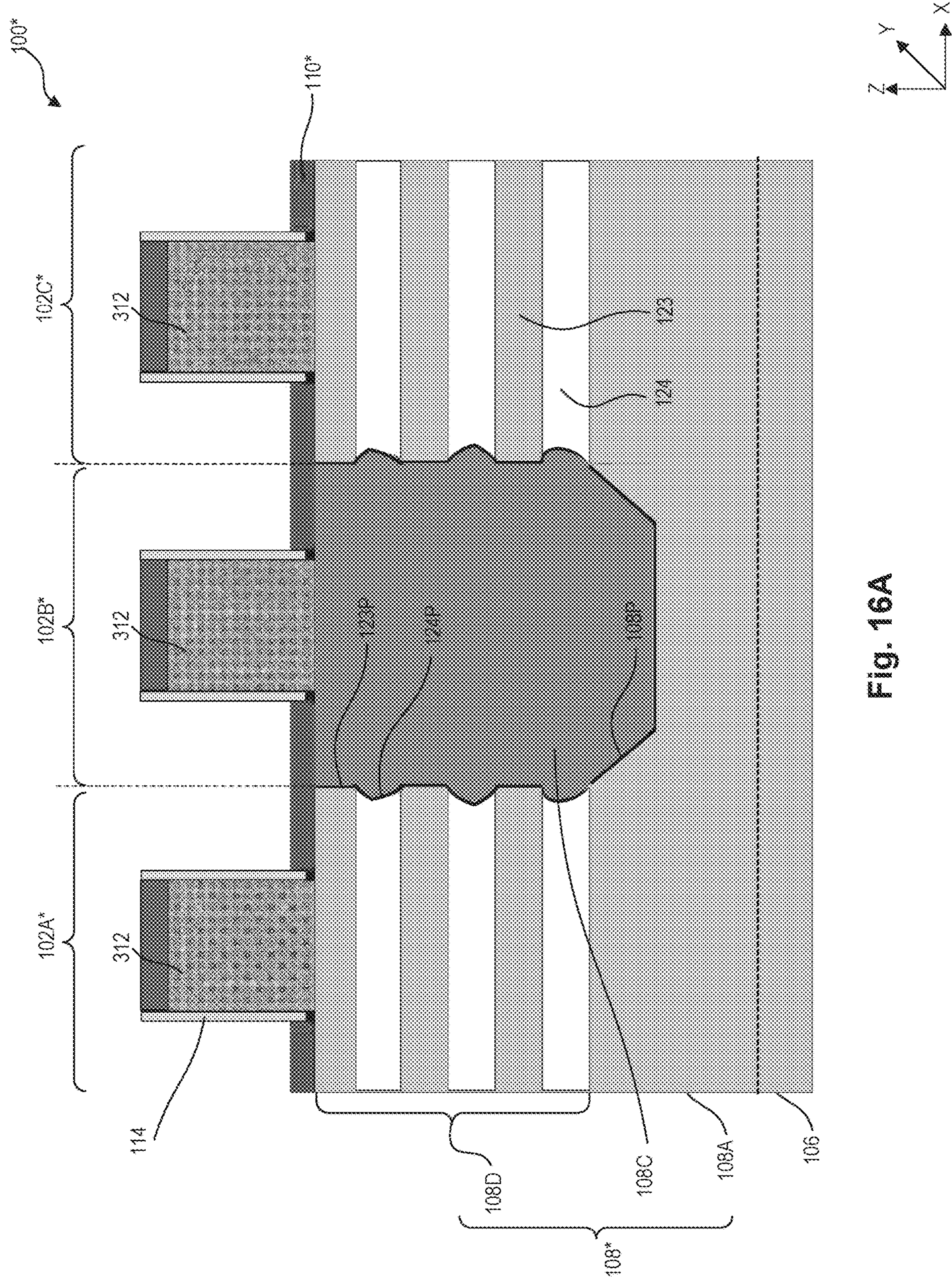
Figure 16B:
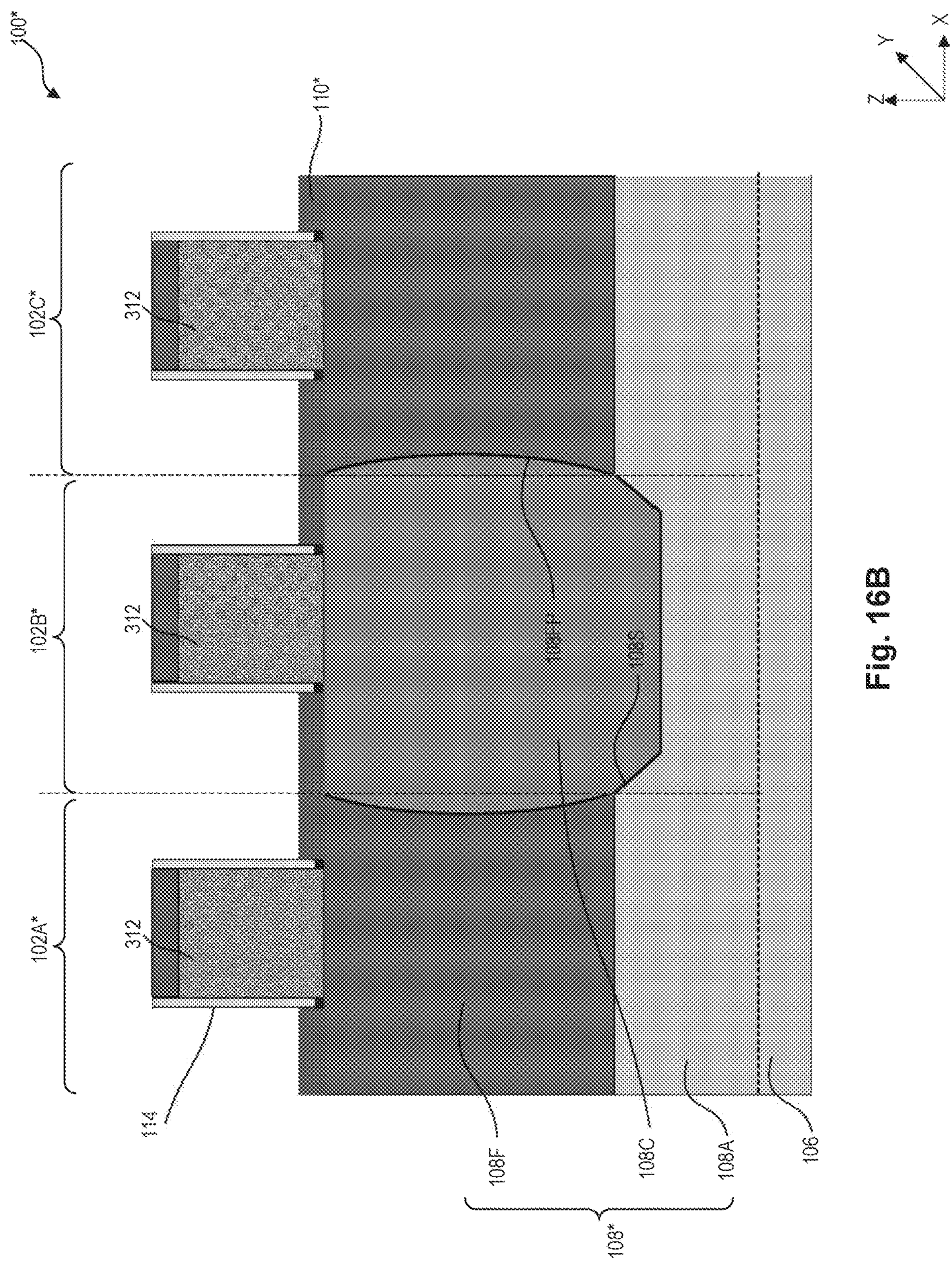
Figure 17A:
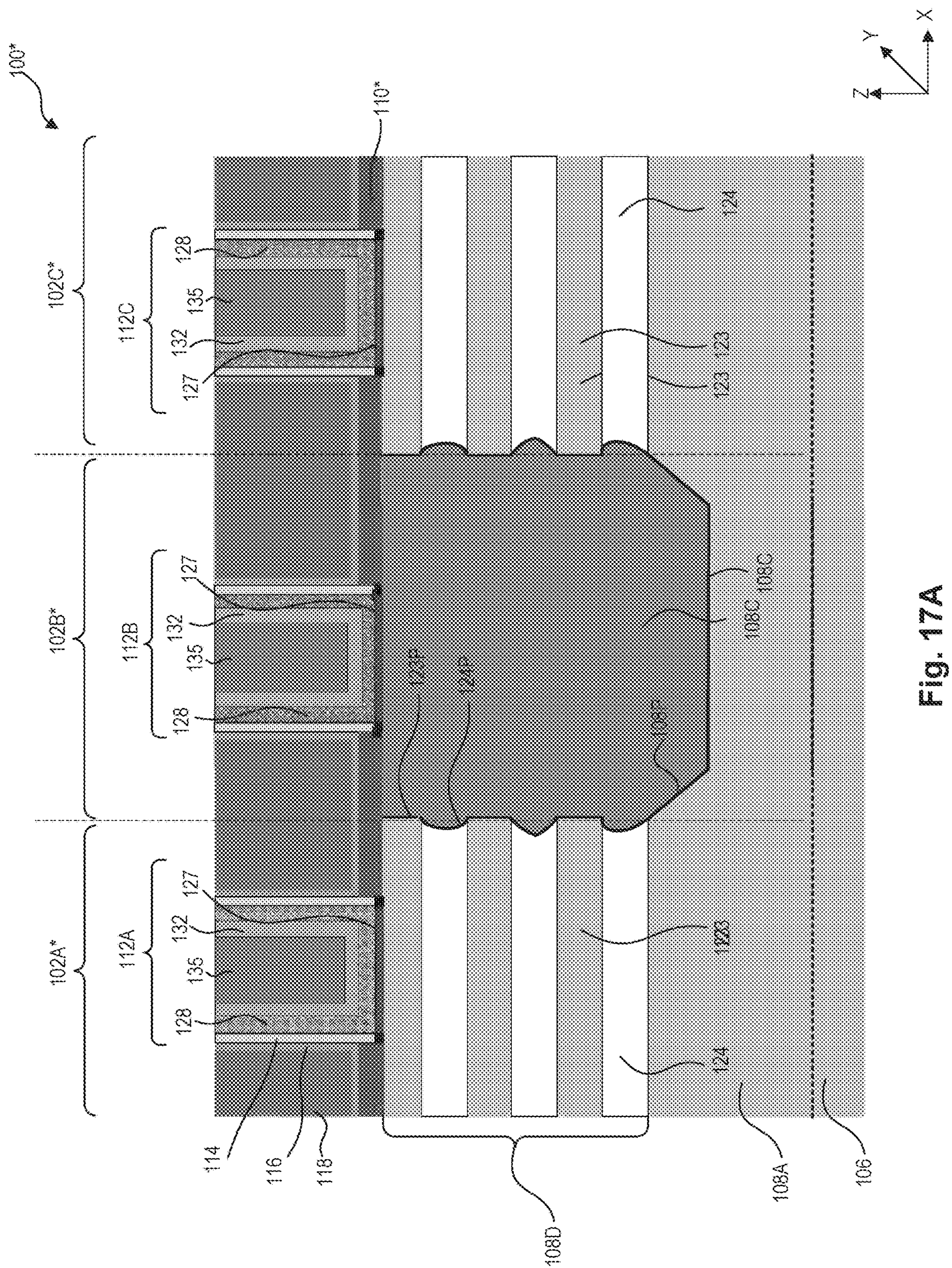
Figure 17B:
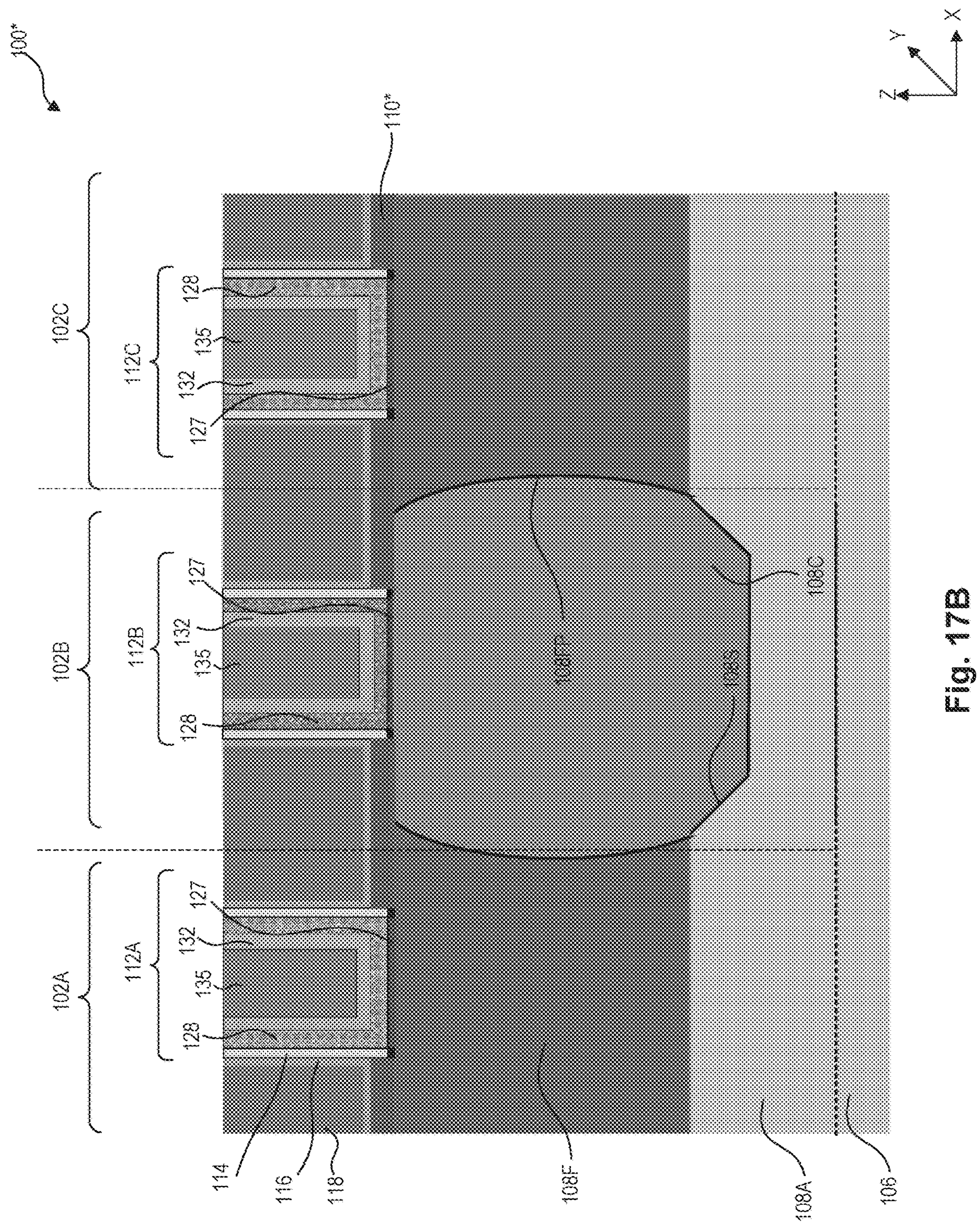

Referring to FIG. 9, in operation 935, epitaxial fin regions are formed on the fin structure. For example, as shown in FIGS. 16A-16B, epitaxial fin regions 110* can be formed on portions of fin structure 108* that are not covered by polysilicon gate structures 312 and gate spacers 114. Following the formation of epitaxial fin regions 110*, ESL 116 and ILD 118 can be formed as shown in FIGS. 17A-17B.

Referring to FIG. 9, in operation 940, the polysilicon gate structures are replaced by metal gate structures. For example, as shown in FIGS. 17A-17B, polysilicon gate structures 312 can be replaced by metal gate structures 112 as described with reference to FIGS. 8A-8B.

In some embodiments, operation 930 of method 900 can be followed by operations 210-225 of method 200 to form semiconductor device 100 with the cross-sectional view of FIG. 1F, according to some embodiments. For example, as shown in FIGS. 18A-18E, operations 210-225 described with reference to both FIGS. 4A-8B can be performed on the structure of FIG. 15A to form the structure of FIG. 1F.

Figure 18A:
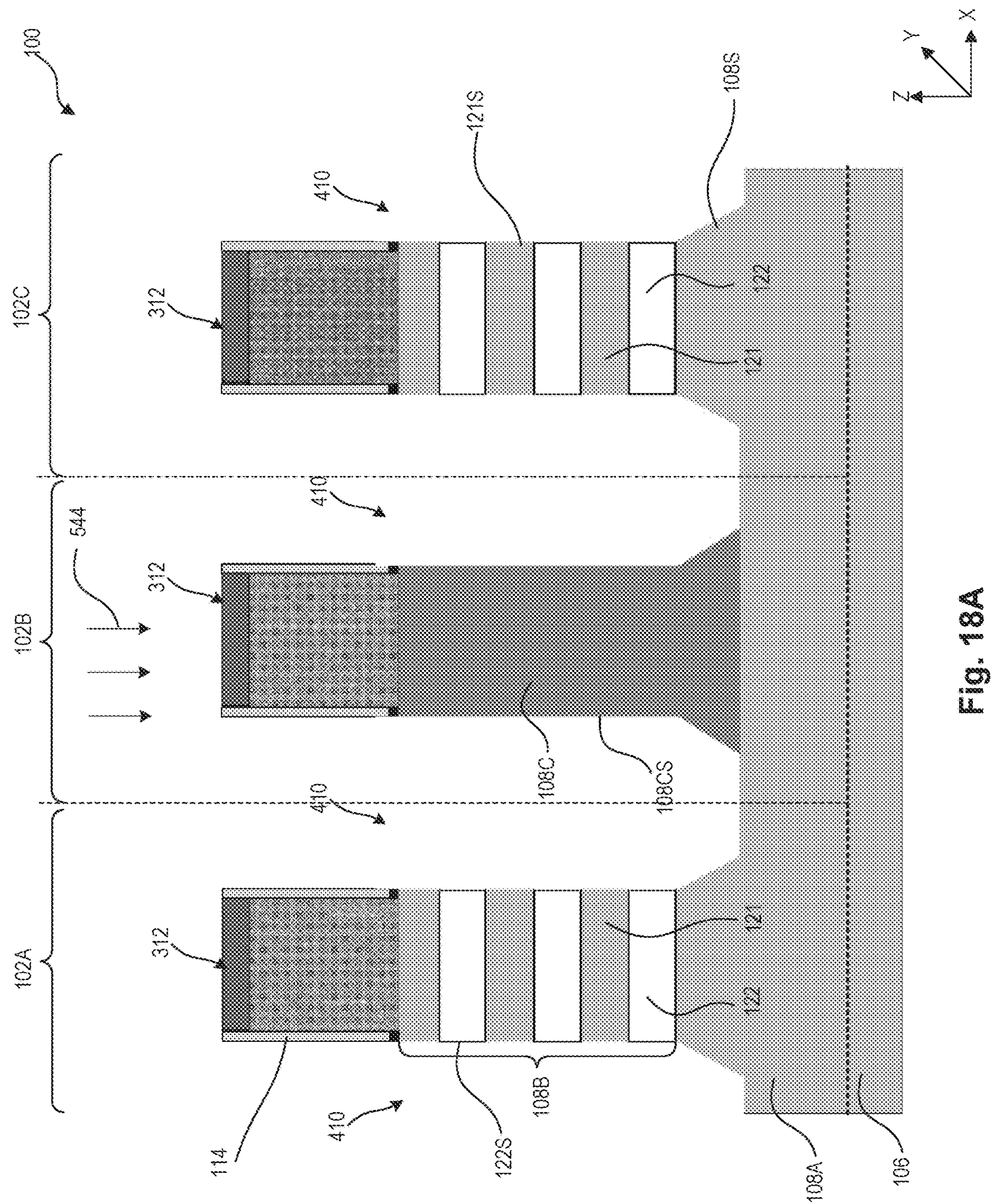
FIGS. 18A-18E illustrate cross-sectional views of a semiconductor device with different types of FETs at various stages of its fabrication process, in accordance with some embodiments.
Figure 18B:
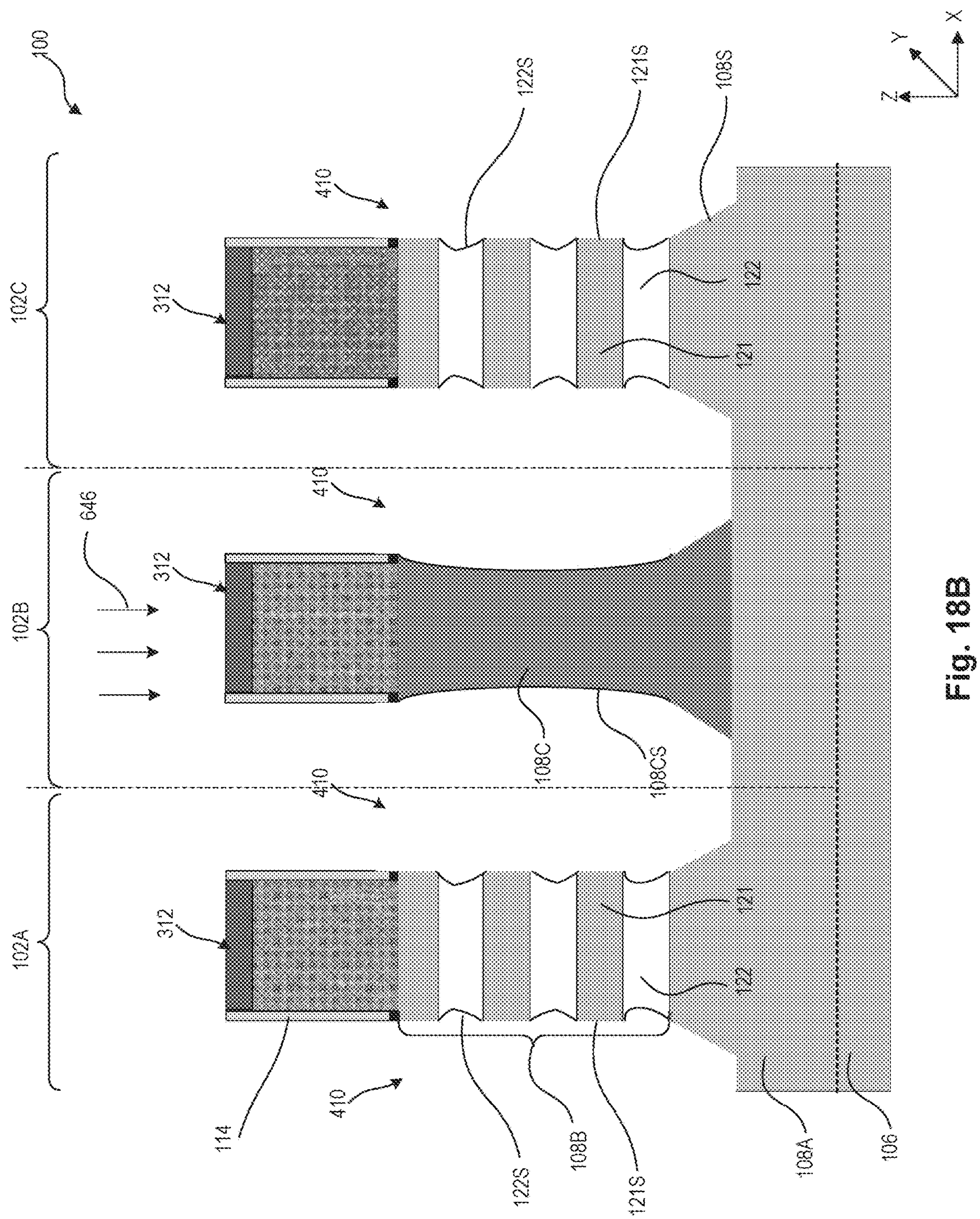
Figure 18C:
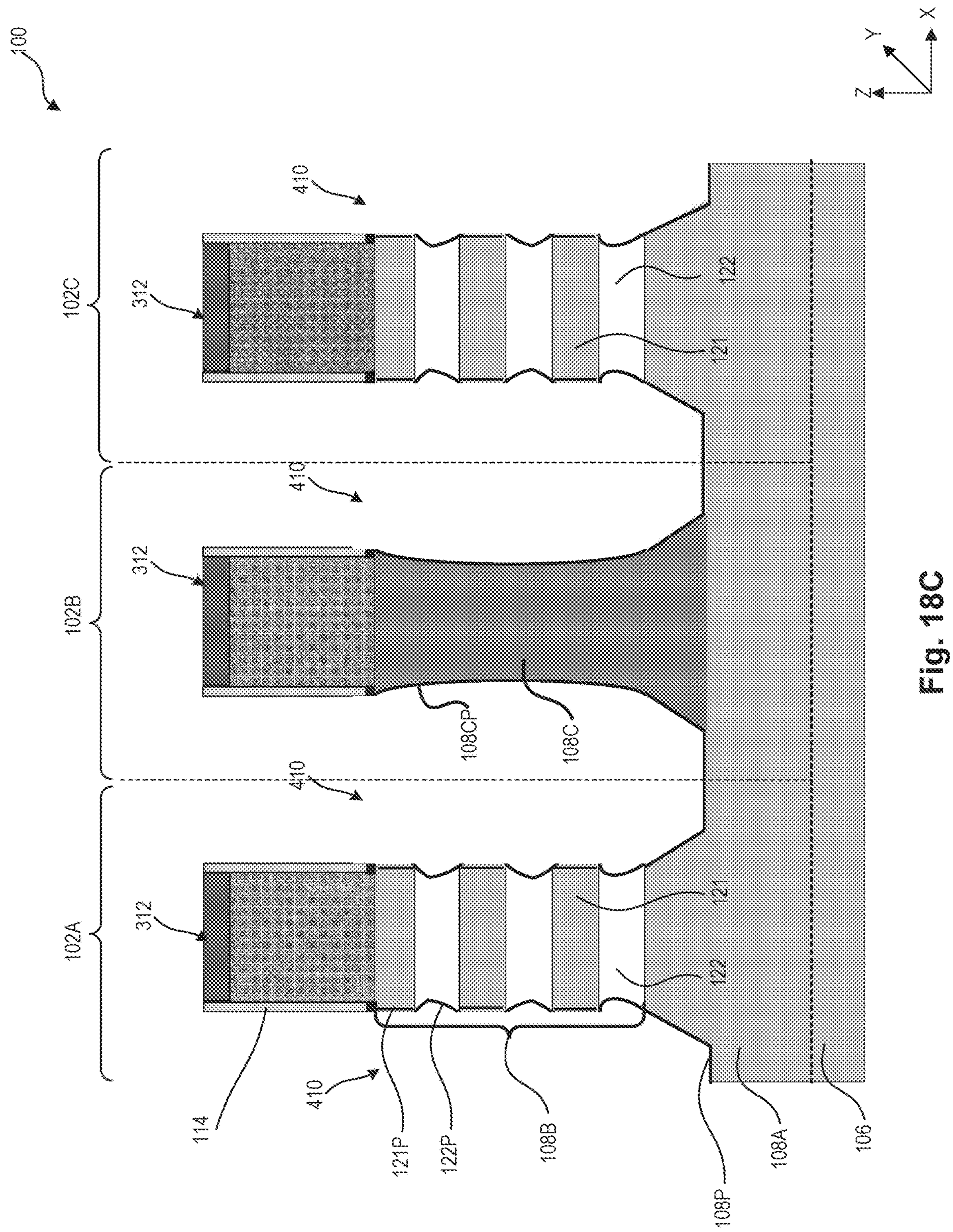
Figure 18D:
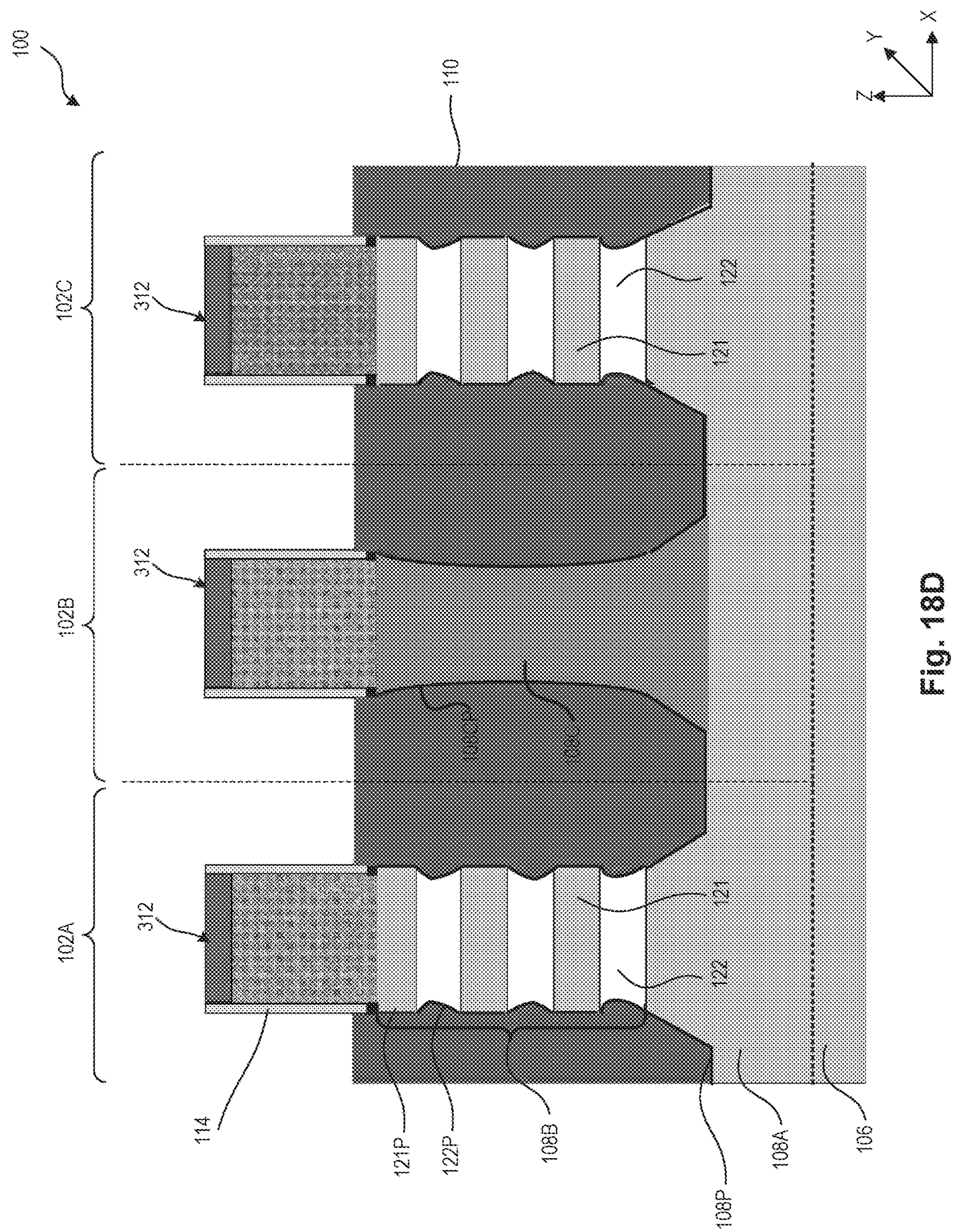
Figure 18E:
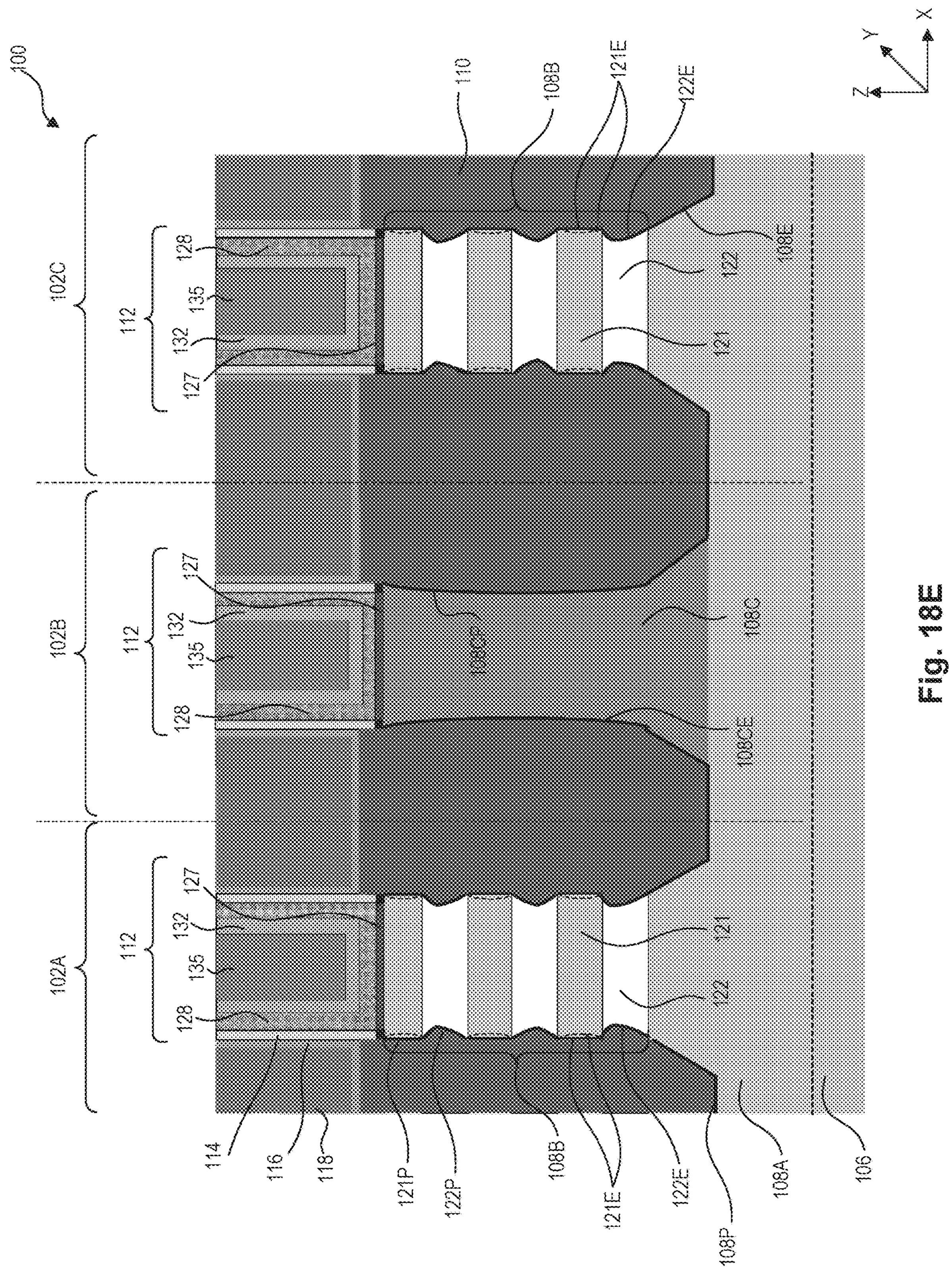

Referring to FIG. 18A, an operation similar to operation 210 described with reference to FIGS. 4A-4B can be performed on the structure of FIG. 15A to form S/D openings 410. Referring to FIG. 18B, an operation similar to operation 215 described with reference to FIGS. 5A-5B can be performed on the structure of FIG. 18A to modify the substantially linear profiles of sidewalls 122S and 108Cs shown in FIG. 18A to the curved profiles shown in FIG. 18B. The etchants 544 used to etch sidewalls 122S and 108Cs can have a similar etch selectivity for nanostructured layers 122 and bulk structure 108C and can have a higher etch selectivity for nanostructured layers 122 and bulk structure 108C than fin base 108A. Referring to FIG. 18C, an operation similar to operation 220 described with reference to FIGS. 6A-6B can be performed on the structure of FIG. 18B to form passivation layers 108P, 108CP, 121P and 122P on respective sidewalls 108S, 108CS, 121S and 122S. Referring to FIG. 18D, an operation similar to operation 225 described with reference to FIGS. 7A-7B can be performed on the structure of FIG. 18C to form epitaxial fin regions 110. Referring to FIG. 18E, an operation similar to operation 230 described with reference to FIGS. 8A-8B can be performed on the structure of FIG. 18D to replace polysilicon gate structures 312 with metal gate structures 112.

The present disclosure provides example structures and methods for reducing stress induced defects in heterogeneous epitaxial interfaces (e.g., interfaces 122E or 108CE) in FETs (e.g., FETs 102A-102D) formed on a substrate. The heterogeneous epitaxial interfaces can be present between the channel regions (e.g., nanostructured channel regions 122) and the epitaxial source/drain (S/D) regions (e.g., epitaxial fin regions 110) of the FETs and/or between the epitaxial regions (e.g., epitaxial superlattice structures 108D and bulk structure 108C) of different FETs formed adjacent to each other on the substrate. The example structures and methods can also reduce impurity induced defects at the heterogeneous epitaxial interfaces.

In the example methods, the surfaces of the channel regions, the substrate, and/or any other surfaces that form heterogeneous epitaxial interfaces with the FET epitaxial regions are selectively modified prior to the formation of the epitaxial regions. The modified surfaces can reduce interfacial stress and/or atomic migration between the materials of the epitaxial regions and the materials of the surfaces on which the epitaxial regions are grown. In some embodiments, these surfaces can be selectively modified (e.g., etched) to provide curved interface profiles between the epitaxial regions and the modified surfaces. The curved interface profiles can reduce interfacial stress by about 50% to about 80% compared to heterogeneous epitaxial interfaces formed without curved interface profiles. In some embodiments, these surfaces can be selectively modified (e.g., passivated) with barrier layers to prevent or reduce atomic migration between the epitaxial regions and the modified surfaces during the epitaxial growth processes. The barrier layers can reduce impurities in the epitaxial regions and/or at the heterogeneous epitaxial interfaces due to the atomic migration by about 50% to about 90% compared to epitaxial growth processes carried out without the barrier layers.

In some embodiments, a semiconductor device includes a substrate and a fin structure with a fin base disposed on the substrate and a superlattice structure disposed on the fin base. The superlattice structure includes first and second layers with first and second lattice constants, respectively. The first and second lattice constants are different from each other. The semiconductor device further includes an epitaxial source/drain (S/D) region disposed on the fin base and adjacent to the superlattice structure and a gate structure disposed on the superlattice structure. The epitaxial S/D region includes a third layer with a third lattice constant that is different from the first lattice constant. A first interface between the first layer and the epitaxial S/D region has a curved profile and a second interface between the fin base and the epitaxial S/D region has a tapered profile.

In some embodiments, a semiconductor device includes a substrate and a fin structure with a fin base disposed on the substrate, first and second superlattice structures disposed on the fin base, and an epitaxial bulk structure disposed between the first and second superlattice structures on the fin base. Each of the first and second superlattice structures includes first and second layers with first and second lattice constants, respectively. The first and second lattice constants are different from each other. The epitaxial bulk structure includes a third layer with a third lattice constant that is different from the first lattice constant. First interfaces between the epitaxial bulk structure and the first layers of the first and second superlattice structures have curved profiles. The semiconductor device further includes gate structures surrounding the first and second superlattice structures and the epitaxial bulk structure, and epitaxial source/drain (S/D) regions surrounding portions of the first and second superlattice structures and the epitaxial bulk structure that are not surrounded by the gate structures.

In some embodiments, a method includes forming a fin structure with a fin base on a substrate and a superlattice structure on the fin base. The superlattice structure includes first and second layers with first and second lattice constants, respectively, and the first and second lattice constants are different from each other. The method further includes forming a polysilicon gate structure on the fin structure, and forming a source/drain (S/D) opening within a portion of the fin structure uncovered by the polysilicon gate structure. First, second, and third surfaces of the first layers, second layers, and fin base are exposed within the S/D opening. The method further includes modifying the first surfaces of the first layers to curve a profile of the first surfaces, depositing first, second, and third passivation layers on the first, second, and third surfaces, respectively, forming an epitaxial S/D region within the S/D opening, and replacing the polysilicon gate structure with a metal gate structure. The first, second, and third passivation layers are different from each other.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

a fin structure comprising a fin base disposed on the substrate and a superlattice structure disposed on the fin base, wherein the superlattice structure comprises first and second layers with first and second lattice constants, respectively, and wherein the first and second lattice constants are different from each other;

an epitaxial source/drain (S/D) region disposed on the fin base and adjacent to the superlattice structure, wherein the epitaxial S/D region comprises a third layer with a third lattice constant that is different from the first lattice constant, wherein a first interface between the first layer and the epitaxial S/D region has a curved profile, and wherein a second interface between the fin base and the epitaxial S/D region has a tapered profile;

a gate structure disposed on the superlattice structure; and a first passivation layer disposed at the first interface between the first layer and the epitaxial S/D region, wherein the first passivation layer comprises an oxide, nitride, halide, or carbide of a material the first layer.

2. The semiconductor device of claim 1, wherein the first lattice constant is greater than the third lattice constant and the curved profile has a curvature towards the first layer.

3. The semiconductor device of claim 1, wherein the third lattice constant is greater than the first lattice constant and the curved profile has a curvature towards the epitaxial S/D region.

4. The semiconductor device of claim 1, wherein the second layer and the epitaxial S/D region have a same material, and wherein a third interface between the second layer and the epitaxial S/D region has a substantially linear profile.

5. The semiconductor device of claim 1, wherein the second and third lattice constants are different from each other, and wherein a third interface between the second layer and the epitaxial S/D region has a curved profile.

6. The semiconductor device of claim 1, further comprising a second passivation layer disposed at the second interface between the fin base and the epitaxial S/D region, and a third passivation layer disposed at a third interface between the second layer and the epitaxial S/D region, wherein the first, second, and third passivation layers are different from each other.

7. A semiconductor device, comprising:

a substrate;

a fin structure comprising:

a fin base disposed on the substrate, first and second superlattice structures disposed on the fin base, wherein each of the first and second superlattice structures comprises first and second layers with first and second lattice constants, respectively, and wherein the first and second lattice constants are different from each other, and an epitaxial bulk structure disposed between the first and second superlattice structures on the fin base, wherein the epitaxial bulk structure comprises a third layer with a third lattice constant that is different from the first lattice constant, wherein first interfaces between the epitaxial bulk structure and the first layers of the first and second superlattice structures have curved profiles;

first and second gate structures surrounding the first and second superlattice structures;

a third gate structure disposed on the epitaxial bulk structure; and epitaxial source/drain (S/D) regions surrounding portions of the first and second superlattice structures and the epitaxial bulk structure that are not surrounded by the gate structures.

8. The semiconductor device of claim 7, wherein the first lattice constant is greater than the third lattice constant and the curved profiles have curvatures towards the first layers of the first and second superlattice structures.

9. The semiconductor device of claim 7, wherein the third lattice constant is greater than the first lattice constant and the curved profiles have curvature towards the epitaxial bulk structure.

10. The semiconductor device of claim 7, wherein the second layers of the first and second superlattice structures and the epitaxial bulk structure have a same material, and wherein second interfaces between the epitaxial bulk structure and the second layers have substantially linear profiles.

11. The semiconductor device of claim 10, further comprising passivation layers disposed at the first interfaces, wherein the passivation layers comprise an oxide, nitride, halide, or carbide of a material of the first layers of the first and second superlattice structures.

12. The semiconductor device of claim 7, wherein the second and third lattice constants are different from each other, and wherein second interfaces between the epitaxial bulk structure and the second layers of the first and second superlattice structures have curved profiles.

13. The semiconductor device of claim 7, wherein a third interface between the fin base and the epitaxial bulk structure has a tapered profile.

14. The semiconductor device of claim 7, wherein at least one of the epitaxial S/D regions is disposed on sidewalls of the first and second layers.

15. A method, comprising:

forming a fin structure with a fin base on a substrate and a superlattice structure on the fin base, wherein the superlattice structure comprises first and second layers with first and second lattice constants, respectively, and wherein the first and second lattice constants are different from each other;

forming a polysilicon gate structure on the fin structure;

forming a source/drain (S/D) opening within a portion of the fin structure uncovered by the polysilicon gate structure, wherein first, second, and third surfaces of the first layers, second layers, and the fin base, respectively, are exposed within the S/D opening;

modifying the first surfaces of the first layers to curve a profile of the first surfaces of the first layers;

depositing first, second, and third passivation layers on the first, second, and third surfaces, of the first layers, second layers, and fin base, respectively, wherein the first, second, and third passivation layers are different from each other;

forming an epitaxial S/D region within the S/D opening; and replacing the polysilicon gate structure with a metal gate structure.

16. The method of claim 15, wherein the modifying the first surfaces of the first layers comprises etching the first surfaces of the first layers with an etchant that has a higher etch selectivity for the first layers than the second layers and the fin base.

17. The method of claim 15, wherein the modifying the first surfaces of the first layers comprises etching the first surfaces of the first layers with an etchant that has a higher etch selectivity for the second layers than the first layers.

18. The method of claim 15, wherein the modifying the first surfaces of the first layers comprises oxidizing the first, second, and third surfaces and etching the first surfaces of the first layers with an etchant that has a higher etch selectivity for the first layers than the second layers and the fin base.

19. The method of claim 15, wherein the depositing the first passivation layers comprises depositing an oxide, nitride, halide, or carbide of a material of the first layers.

20. The method of claim 15, further comprising modifying the second surfaces of the second layers to curve a profile of the second surfaces of the second layers.

* * * * *